United States Patent
Hamada et al.

(10) Patent No.: US 11,094,474 B2
(45) Date of Patent: Aug. 17, 2021

(54) PHOTOELECTRIC CONVERSION ELEMENT, DYE-SENSITIZED SOLAR CELL, METAL COMPLEX DYE, DYE COMPOSITION, AND OXIDE SEMICONDUCTOR ELECTRODE

(71) Applicant: FUJIFILM Corporation, Tokyo (JP)

(72) Inventors: Kazuhiro Hamada, Ashigarakami-gun (JP); Kouitsu Sasaki, Ashigarakami-gun (JP); Kousuke Watanabe, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/439,117

(22) Filed: Jun. 12, 2019

(65) Prior Publication Data

US 2019/0295779 A1 Sep. 26, 2019

Related U.S. Application Data

(63) Continuation of application No. PCT/JP2018/000146, filed on Jan. 9, 2018.

(30) Foreign Application Priority Data

Feb. 17, 2017 (JP) .............. JP2017-027494

(51) Int. Cl.
*H01G 9/20* (2006.01)
*H01L 51/00* (2006.01)
(Continued)

(52) U.S. Cl.
CPC ......... *H01G 9/2063* (2013.01); *C09B 23/145* (2013.01); *C09B 57/008* (2013.01); *C09B 57/10* (2013.01); *H01G 9/2022* (2013.01); *H01G 9/2027* (2013.01); *H01G 9/2059* (2013.01); *H01L 51/0086* (2013.01); *H01G 9/2031* (2013.01); *Y02E 10/542* (2013.01)

(58) Field of Classification Search
CPC .. H01G 9/2027; H01G 9/2022; H01G 9/2031; H01G 9/2059; H01G 9/2063
See application file for complete search history.

(56) References Cited

U.S. PATENT DOCUMENTS

| | | | |
|---|---|---|---|
| 2002/0040728 A1* | 4/2002 | Yoshikawa | H01G 9/2031 136/263 |
| 2007/0017569 A1* | 1/2007 | Gui | H01G 9/2031 136/256 |
| 2009/0209762 A1* | 8/2009 | Wu | H01G 9/2059 546/12 |

FOREIGN PATENT DOCUMENTS

| | | |
|---|---|---|
| CN | 1202113 C | 5/2005 |
| CN | 102 660 135 A | 9/2012 |

(Continued)

OTHER PUBLICATIONS

JP 2012-216496 A online machine translation, translated on May 28, 2020.*
International Search Report dated Apr. 3, 2018 from the International Searching Authority in counterpart International Application No. PCT/JP2018/000146.

(Continued)

*Primary Examiner* — Golam Mowla
(74) *Attorney, Agent, or Firm* — Sughrue Mion, PLLC

(57) ABSTRACT

A photoelectric conversion element includes a conductive support, a photoconductor layer including an electrolyte, a charge transfer layer including an electrolyte, and a counter electrode, in which the photoconductor layer has semiconductor fine particles carrying a metal complex dye represented by a specific formula.

20 Claims, 1 Drawing Sheet

(51) Int. Cl.
*C09B 57/10* (2006.01)
*C09B 57/00* (2006.01)
*C09B 23/14* (2006.01)

(56) References Cited

FOREIGN PATENT DOCUMENTS

| | | | |
|---|---|---|---|
| CN | 103 665 047 A | 3/2014 |
| EP | 2 315 303 A1 | 4/2011 |
| JP | 2001-291534 A | 10/2001 |
| JP | 2008-021496 A | 1/2008 |
| JP | 2010-146864 A | 7/2010 |
| JP | 2011-228276 A | 11/2011 |
| JP | 4874454 B2 | 2/2012 |
| JP | 2012-131906 A | 7/2012 |
| JP | 2012-212533 A | 11/2012 |
| JP | 2012-216496 A | 11/2012 |

OTHER PUBLICATIONS

International Preliminary Report on Patentability dated Aug. 20, 2019 from the International Bureau in counterpart International Application No. PCT/JP2018/000146.
Written Opinion dated Apr. 3, 2018 from the International Bureau in counterpart International Application No. PCT/JP2018/000146.
Office Action dated Jun. 16, 2020, from the Japanese Patent Office in Japanese Application No. 2018-568038.
Partial supplementary European search report dated Aug. 17, 2020, from the European Patent Office in European Application No. 18754668.4.
Extended European Search Report dated Nov. 18, 2020, from the European Patent Office in European Application No. 18754668.4.
Office Action dated Nov. 23, 2020 by the China National Intellectual Property Administration in Chinese application No. 201880005801.3.

* cited by examiner

PHOTOELECTRIC CONVERSION ELEMENT, DYE-SENSITIZED SOLAR CELL, METAL COMPLEX DYE, DYE COMPOSITION, AND OXIDE SEMICONDUCTOR ELECTRODE

CROSS-REFERENCE TO RELATED APPLICATIONS

This application is a Continuation of PCT International Application No. PCT/JP2018/000146, filed on Jan. 9, 2018, which claims priority under 35 U.S.C. § 119(a) to Japanese Patent Application No. 2017-027494, filed on Feb. 17, 2017. Each of the above application(s) is hereby expressly incorporated by reference, in its entirety, into the present application.

BACKGROUND OF THE INVENTION

1. Field of the Invention

The present invention relates to a photoelectric conversion element, a dye-sensitized solar cell, a metal complex dye, a dye composition, and an oxide semiconductor electrode.

2. Description of the Related Art

Photoelectric conversion elements are used in various photosensors, copying machines, photoelectrochemical cells such as solar cells, and the like. These photoelectric conversion elements have adopted various systems to be put into use, such as systems utilizing metals, systems utilizing semiconductors, systems utilizing organic pigments or dyes, or systems utilizing combinations of these elements. In particular, solar cells utilizing inexhaustible solar energy do not necessitate fuels, and full-fledged practicalization of solar cells as an inexhaustible clean energy is being highly expected. Above all, research and development of silicon-based solar cells have long been in progress, and many countries also support policy-wise considerations, and thus dissemination of silicon-based solar cells is still in progress. However, silicon is an inorganic material, and thus, naturally has limitations in terms of improvement of throughput, cost, and the like.

Thus, research is being vigorously carried out on photoelectrochemical cells (also referred to as dye-sensitized solar cells) using metal complex dyes. In particular, what have built momentum toward such research was the research results from Graetzel et al. of École Polytechnique Fédérale de Lausanne in Switzerland. They employed a structure in which a dye formed from a ruthenium complex was fixed on the surface of a porous titanium oxide film, and realized photoelectric conversion efficiency which was comparable to that of amorphous silicon. Thus, dye-sensitized solar cells that can be produced even without use of expensive vacuum devices have instantly attracted the attention of researchers all over the world.

Hitherto, dyes called N3, N719, and N749 (also referred to as Black Dye), Z907, and J2 have generally been developed as metal complex dyes for use in dye-sensitized solar cells.

Furthermore, various metal complex dyes have been studied, in addition to those metal complex dyes.

For example, JP4874454B describes dyes (D-1 to D-3, and the like) having a bipyridine ligand in which two pyridine rings each have a 4-dialkylaminostyryl skeleton or a 4-diphenylaminostyryl skeleton, a 4,4'-dicarboxybipyridine ligand, and two isothiocyanate ligands. In addition, JP2008-021496A describes dyes (compound Nos. 21, 56, and the like) having a bipyridine ligand in which two pyridine rings each have a 4-diphenylaminostyryl skeleton, or a 4-di-(4-di(n-butyl)aminophenyl)aminostyryl skeleton, a 4,4'-dicarboxybipyridine ligand, and two isothiocyanate ligands that are bonded at trans positions with respect to a metal ion.

SUMMARY OF THE INVENTION

A higher level of performance has been required for a photoelectric conversion element and a dye-sensitized solar cell, and thus, there is a demand for a further improvement on heat resistance durability for stable maintenance of initial conversion efficiency even at a high temperature that exceeds room temperature as well as photoelectric conversion efficiency. In addition, from the viewpoint of effective use of light incident on a photoelectric conversion element, there is also a demand for an improvement of external quantum efficiency upon irradiation with light at a wavelength that is longer than 700 nm.

It is an object of the present invention to provide a photoelectric conversion element and a dye-sensitized solar cell, each of which has excellent photoelectric conversion efficiency, external quantum efficiency for long-wavelength light, and heat resistance durability; and a metal complex dye, a dye composition, and an oxide semiconductor electrode, each of which is used in the photoelectric conversion element and the dye-sensitized solar cell.

The present inventors have found that external quantum efficiency for long-wavelength light and heat resistance durability as well as photoelectric conversion efficiency can be improved by using a combination of geometric isomers with respect to a six-coordination complex structure for a metal complex dye having a bipyridine ligand formed by the bonding of two pyridine rings having a specific substituent at the ring-constituting carbon atom at the 4-position with respect to a ring-constituting nitrogen atom, a bipyridine ligand formed by the bonding of two pyridine rings having a carboxyl group or a salt thereof, and two monodentate ligands. The present inventors have conducted further studies thereon, and as a result, they have found that even in a case where a metal complex dye having a trans structure with respect to two monodentate ligands, in which a group including a di(hetero)arylaminophenyl group is introduced as a substituent at the ring-constituting carbon atom, may be used singly among the metal complex dyes, any of photoelectric conversion efficiency, external quantum efficiency for long-wavelength light, and heat resistance durability can be improved. Based on these findings, the present invention has been completed by further repletion of the studies.

That is, the objects of the present invention have been achieved by the following means.

<1> A photoelectric conversion element comprising:
a conductive support;
a photoconductor layer including an electrolyte;
a charge transfer layer including an electrolyte; and
a counter electrode,
in which the photoconductor layer has semiconductor fine particles carrying a metal complex dye represented by Formula (1) and a metal complex dye represented by Formula (2), Formula (1)

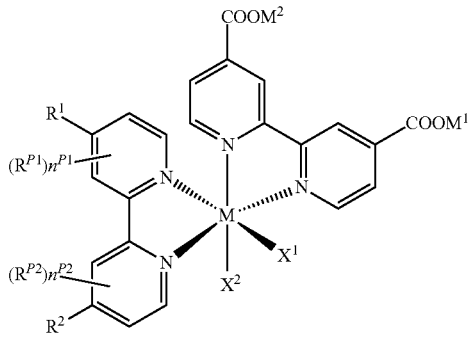

Formula (2)

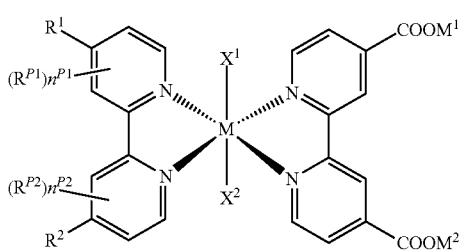

in the formulae, M represents a metal ion, $R^1$ and $R^2$ each independently represent an alkenyl group, an alkynyl group, an aryl group, or a heteroaryl group, $R^{P1}$ and $R^{P2}$ each independently represent an alkyl group, an alkoxy group, an alkylthio group, an aryl group, a heteroaryl group, an amino group, or a halogen atom, and $n^{P1}$ and $n^{P2}$ are each independently an integer of 0 to 3, $X^1$ and $X^2$ each independently represent a monodentate ligand, and $M^1$ and $M^2$ each independently represent any one of a proton, a metal cation, or a non-metal cation.

<2> The photoelectric conversion element as described in <1>, in which $R^1$ and $R^2$ are each independently represented by any one of Formulae (3-1) to (3-4), Formula (3-1)

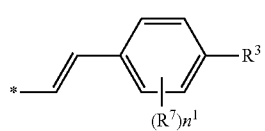

Formula (3-2)

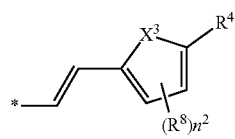

Formula (3-3)

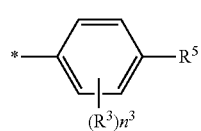

Formula (3-4)

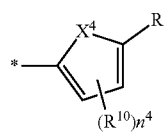

in the formulae, $R^3$ to $R^6$ each independently represent a hydrogen atom, an alkyl group, an alkenyl group, an alkynyl group, an alkoxy group, an alkylthio group, an aryl group, a heteroaryl group, an amino group, or a halogen atom, $R^7$ to $R^{10}$ each independently represent an alkyl group, an alkenyl group, an alkynyl group, an alkoxy group, an alkylthio group, an aryl group, a heteroaryl group, an amino group, or a halogen atom, $n^1$ and $n^3$ are each independently an integer of 0 to 4, and $n^2$ and $n^4$ are each independently an integer of 0 to 2, $X^3$ and $X^4$ each independently represent a sulfur atom or an oxygen atom, and

* represents a bonding moiety to a pyridine ring in each of Formula (1) and Formula (2).

<3> The photoelectric conversion element as described in <1> or <2>, in which $X^1$ and $X^2$ each independently represent an isothiocyanate group or a thiocyanate group.

<4> The photoelectric conversion element as described in any one of <1> to <3>, in which the $R^1$ and $R^2$ are each independently represented by Formula (4), Formula (4)

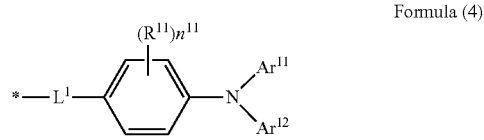

in the formula, $L^1$ represents a single bond or an ethenylene group.

$Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, provided that in a case where $L^1$ is an ethenylene group and the aryl group has an alkyl group as the substituent, the alkyl group is a linear alkyl group having 3 or more carbon atoms or a branched alkyl group, and in a case where $L^1$ is an ethenylene group and the aryl group has a mono- or dialkylamino group as the substituent, at least one alkyl group in the alkylamino group is a linear alkyl group having 5 or more carbon atoms, or a branched alkyl group, $R^{11}$ represents an alkyl group, an alkoxy group, an alkylthio group, an aryl group, a heteroaryl group, an amino group, or a halogen atom, and $n^{11}$ is an integer of 0 to 4, and

* represents a bonding moiety to a pyridine ring in each of Formula (1) and Formula (2), <Substituent Group $S_{Ar}$> an alkyl group, an alkoxy group, an aryloxy group, an alkylthio group, an arylthio group, an aryl group, a heteroaryl group, an amino group, a halogen atom, or a cyano group.

<5> The photoelectric conversion element as described in <4>, in which $Ar^{11}$ and $Ar^{12}$ are each independently represented by any one of Formula (5-1) to Formula (5-5), Formula (5-1)

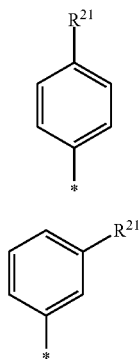

Formula (5-2)

Formula (5-3)

Formula (5-4)

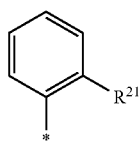

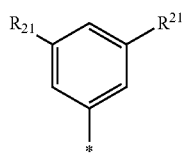

Formula (5-5)

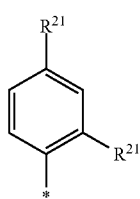

in Formula (5-1) to Formula (5-3), $R^{21}$ represents an alkyl group, an alkoxy group, an aryl group, a heteroaryl group, or a halogen atom, in Formula (5-4) and Formula (5-5), $R^{21}$ represents a hydrogen atom, an alkyl group, an alkoxy group, an aryl group, a heteroaryl group, or a halogen atom, and at least one of $R^{21}$'s represents an alkyl group, an alkoxy group, an aryl group, a heteroaryl group, or a halogen atom, provided that in a case where $L^1$ is an ethenylene group, the alkyl group is a linear alkyl group having 3 or more carbon atoms or a branched alkyl group, and * represents a bonding moiety to a nitrogen atom in Formula (4).

<6> The photoelectric conversion element as described in any one of <1> to <5>, in which the semiconductor fine particles carry a metal complex dye represented by Formula (6),

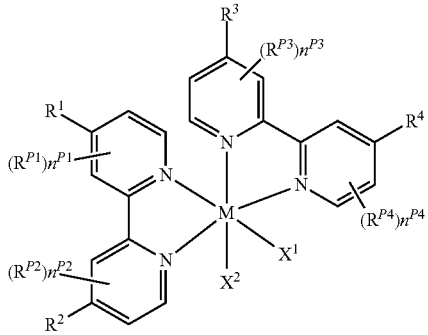

Formula (6)

in the formulae, M represents a metal ion, $R^1$ to $R^4$ each independently represent an alkenyl group, an alkynyl group, an aryl group, or a heteroaryl group, $R^{P1}$ to $R^{P4}$ each independently represent an alkyl group, an alkoxy group, an alkylthio group, an aryl group, a heteroaryl group, an amino group, or a halogen atom, and $n^{P1}$ to $n^{P4}$ are each independently an integer of 0 to 3, and $X^1$ and $X^2$ each independently represent a monodentate ligand.

<7> A photoelectric conversion element comprising:
a conductive support;
a photoconductor layer including an electrolyte;
a charge transfer layer including an electrolyte; and
a counter electrode, in which the photoconductor layer has semiconductor fine particles carrying a metal complex dye represented by Formula (2A),

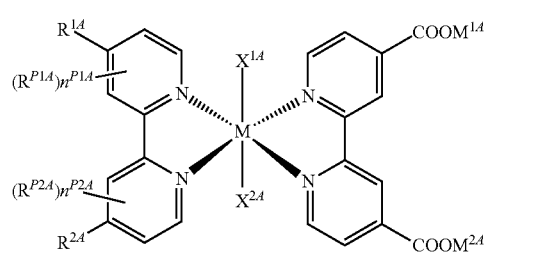

Formula (2A)

in Formula (2A), M represents a metal ion.

$R^{1A}$ and $R^{2A}$ each independently represent a group represented by Formula (4), $R^{P1A}$ and $R^{P2A}$ each independently represent an alkyl group, an alkoxy group, an alkylthio group, an aryl group, a heteroaryl group, an amino group, or a halogen atom, and $n^{P1A}$ and $n^{P2A}$ are each independently an integer of 0 to 3, $X^{1A}$ and $X^{2A}$ each independently represent a monodentate ligand, and $M^{1A}$ and $M^{2A}$ each independently represent any one of a proton, a metal cation, or a non-metal cation, Formula (4)

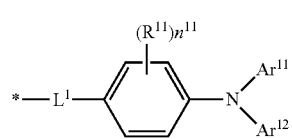

in Formula (4), $L^1$ represents a single bond or an ethenylene group.

$Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, provided that in a case where $L^1$ is an ethenylene group and the aryl group has an alkyl group as the substituent, the alkyl group is a linear alkyl group having 3 or more carbon atoms or a branched alkyl group, and in a case where $L^1$ is an ethenylene group and the aryl group has a mono- or dialkylamino group as the substituent, at least one alkyl group in the alkylamino group is a linear alkyl group having 5 or more carbon atoms or a branched alkyl group, $R^{11}$ represents an alkyl group, an alkoxy group, an alkylthio group, an aryl group, a heteroaryl group, an amino group, or a halogen atom, and $n^{11}$ is an integer of 0 to 4, and

* represents a bonding moiety to a pyridine ring in Formula (2A),

<Substituent Group $S_{Ar}$> an alkyl group, an alkoxy group, an aryloxy group, an alkylthio group, an arylthio group, an aryl group, a heteroaryl group, an amino group, a halogen atom, or a cyano group.

<8> The photoelectric conversion element as described in any one of <1> to <7>, further comprising a metal oxide film on a surface of at least one of the conductive support or the semiconductor fine particles.

<9> A dye-sensitized solar cell comprising the photoelectric conversion element as described in any one of <1> to <8>.

<10> A dye composition comprising a metal complex dye represented by Formula (1) and a metal complex dye represented by Formula (2), Formula (1)

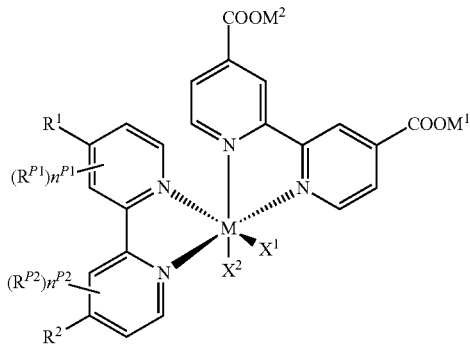

Formula (2)

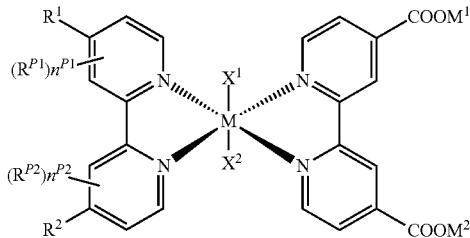

in the formulae, M represents a metal ion, $R^1$ and $R^2$ each independently represent an alkenyl group, an alkynyl group, an aryl group, or a heteroaryl group, $R^{P1}$ and $R^{P2}$ each independently represent an alkyl group, an alkoxy group, an alkylthio group, an aryl group, a heteroaryl group, an amino group, or a halogen atom, and $n^{P1}$ and $n^{P2}$ are each independently an integer of 0 to 3, $X^1$ and $X^2$ each independently represent a monodentate ligand, and $M^1$ and $M^2$ each independently represent any one of a proton, a metal cation, or a non-metal cation.

<11> The dye composition as described in <10>, in which $R^1$ and $R^2$ are each independently represented by Formula (4), Formula (4)

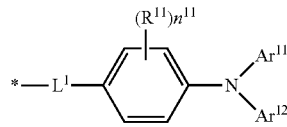

in the formula, $L^1$ represents a single bond or an ethenylene group.

$Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, provided that in a case where $L^1$ is an ethenylene group and the aryl group has an alkyl group as the substituent, the alkyl group is a linear alkyl group having 3 or more carbon atoms or a branched alkyl group, and in a case where $L^1$ is an ethenylene group and the aryl group has a mono- or dialkylamino group as the substituent, at least one alkyl group in the alkylamino group is a linear alkyl group having 5 or more carbon atoms or a branched alkyl group, $R^{11}$ represents an alkyl group, an alkoxy group, an alkylthio group, an aryl group, a heteroaryl group, an amino group, or a halogen atom, and $n^{11}$ is an integer of 0 to 4, and

* represents a bonding moiety to a pyridine ring in each of Formula (1) and Formula (2), <Substituent Group $S_{Ar}$> an alkyl group, an alkoxy group, an aryloxy group, an alkylthio group, an arylthio group, an aryl group, a heteroaryl group, an amino group, a halogen atom, or a cyano group.

<12> The dye composition as described in <10> or <11>, further comprising a metal complex dye represented by Formula (6), Formula (6)

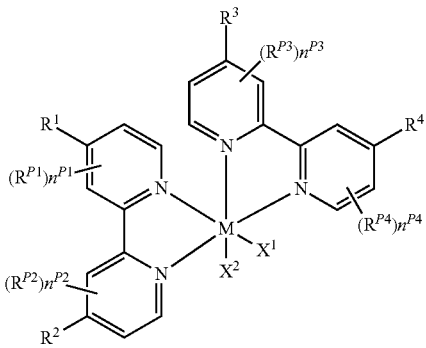

in the formulae, M represents a metal ion, $R^1$ to $R^4$ each independently represent an alkenyl group, an alkynyl group, an aryl group, or a heteroaryl group, $R^{P1}$ to $R^{P4}$ each independently represent an alkyl group, an alkoxy group, an alkylthio group, an aryl group, a heteroaryl group, an amino group, or a halogen atom, and $n^{P1}$ to $n^{P4}$ are each independently an integer of 0 to 3, and $X^1$ and $X^2$ each independently represent a monodentate ligand.

<13> The dye composition as described in any one of <10> to <12>, further comprising a total of 0.000001 to 1.5 moles of a metal cation and a non-metal cation in the total molar amount of $M^1$ and $M^2$ contained in the metal complex dye represented by Formula (1) and the metal complex dye represented by Formula (2).

<14> The dye composition as described in any one of <10> to <13>, further comprising a solvent.

<15> An oxide semiconductor electrode comprising the dye composition as described in any one of <10> to <14>.

<16> A metal complex dye represented by Formula (2A),

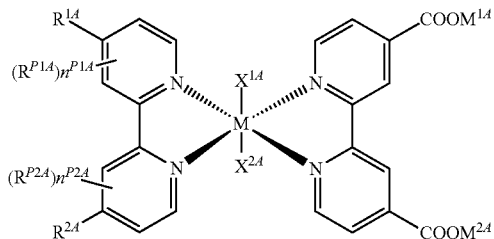

Formula (2A)

in Formula (2A), M represents a metal ion.

$R^{1A}$ and $R^{2A}$ each independently represent a group represented by Formula (4), $R^{P1A}$ and $R^{P2A}$ each independently represent an alkyl group, an alkoxy group, an alkylthio group, an aryl group, a heteroaryl group, an amino group, or a halogen atom, and $n^{P1A}$ and $n^{P2A}$ are each independently an integer of 0 to 3, $X^{1A}$ and $X^{2A}$ each independently represent a monodentate ligand, and $M^{1A}$ and $M^{2A}$ each independently represent any one of a proton, a metal cation, or a non-metal cation,

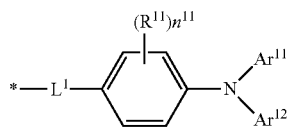

Formula (4)

in Formula (4), $L^1$ represents a single bond or an ethenylene group.

$Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, provided that in a case where $L^1$ is an ethenylene group and the aryl group has an alkyl group as the substituent, the alkyl group is a linear alkyl group having 3 or more carbon atoms or a branched alkyl group, and in a case where $L^1$ is an ethenylene group and the aryl group has a mono- or dialkylamino group as the substituent, at least one alkyl group in the alkylamino group is a linear alkyl group having 5 or more carbon atoms or a branched alkyl group, $R^{11}$ represents an alkyl group, an alkoxy group, an alkylthio group, an aryl group, a heteroaryl group, an amino group, or a halogen atom, and $n^{11}$ is an integer of 0 to 4, and

* represents a bonding moiety to a pyridine ring in Formula (2A),

<Substituent Group $S_{Ar}$> an alkyl group, an alkoxy group, an aryloxy group, an alkylthio group, an arylthio group, an aryl group, a heteroaryl group, an amino group, a halogen atom, or a cyano group.

In the present specification, in a case where a double bond exists in an E configuration or a Z configuration in the molecule, it may be either one of the two configurations or a mixture thereof unless otherwise specified.

In a case where there are a plurality of substituents, linking groups, ligands, or the like (hereinafter referred to as substituents or the like) represented by specific symbols or formulae, or in a case where a plurality of substituents and the like are defined at the same time, the respective substituents or the like may be the same as or different from each another unless otherwise specified. This shall also apply to the definition of the number of substituents or the like. Further, in a case where a plurality of substituents and the like are close to each other (in particular, adjacent to each other), they may be linked to each other to form a ring, unless otherwise specified. In addition, the ring, for example, an alicycle, an aromatic ring, or a heterocycle may further be fused to form a fused ring, unless otherwise specified.

In the present specification, reference to a compound (including a complex and a dye) is used to encompass, in addition to the compound itself, salts and ions of the compound. Further, within a scope in which the effects of the present invention are exhibited, the reference is used to encompass modifications of some of the structure. A compound for which substitution or non-substitution is not explicitly described is meant to indicate that the compound may have an optional substituent within a scope in which the effects of the present invention are exhibited. This shall also apply to substituents, linking groups, and ligands.

In addition, in the present specification, a numerical value range represented by "(a value) to (a value)" means a range including the numerical values represented before and after "to" as a lower limit value and an upper limit value, respectively.

According to the present invention, it is possible to provide a photoelectric conversion element and a dye-sensitized solar cell, each of which has excellent photoelectric conversion efficiency, external quantum efficiency for long-wavelength light, and heat resistance durability. Further, according to the present invention, it is also possible to provide a metal complex dye, a dye composition, and an oxide semiconductor electrode, each of which is suitably used in the photoelectric conversion element and the dye-sensitized solar cell, and exhibits excellent characteristics as described above.

DESCRIPTION OF THE PREFERRED EMBODIMENTS

Figure 1:
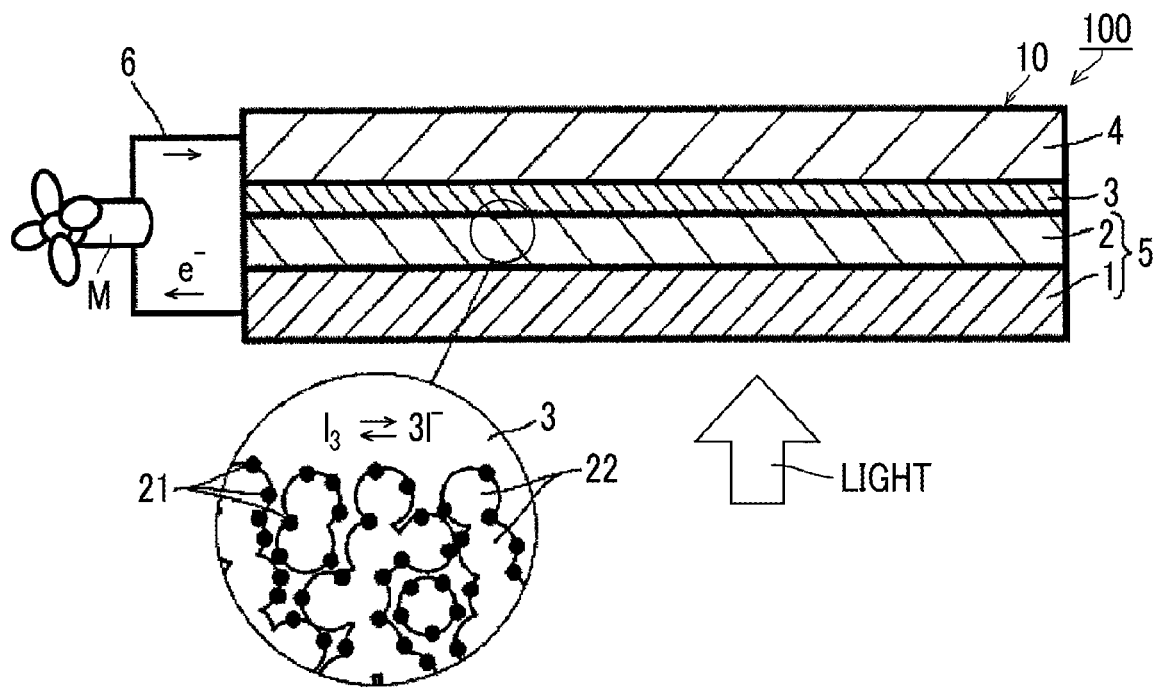
FIG. 1 is a cross-sectional view schematically showing a photoelectric conversion element in a first aspect of the present invention, including an enlarged view of the circled portion in a layer, in a system in which the photoelectric conversion element is applied in cell uses.

[Photoelectric Conversion Element and Dye-Sensitized Solar Cell]

The photoelectric conversion element of an embodiment of the present invention has a conductive support, a photoconductor layer including an electrolyte, a charge transfer layer including an electrolyte, and a counter electrode (opposite electrode). The photoconductor layer, the charge transfer layer, and the counter electrode are provided in this order on the conductive support.

In the photoelectric conversion element of the embodiment of the present invention, the semiconductor fine particles that form the photoconductor layer carry a combination of a metal complex dye represented by Formula (1) which will be described later and a metal complex dye represented by Formula (2) which will be described later, or a metal complex dye represented by Formula (2A) which will be described later as a sensitizing dye, respectively.

In the present invention, an expression of the metal complex dye means a dye carried on semiconductor fine particles unless otherwise specified. Specifically, the metal complex dye means any one or a combination of two or more of the metal complex dye represented by Formula (1), the metal complex dye represented by Formula (2), or the metal complex dye represented by Formula (2A).

Here, the aspect in which the metal complex dye is carried on the surface of the semiconductor fine particles encompasses an aspect in which the metal complex dye is adsorbed onto the surface of the semiconductor fine particles, an aspect in which the metal complex dye is deposited on the surface of the semiconductor fine particles, an aspect in which the metal complex dye is associated or interacted with the metal complex dye adsorbed onto the surface of the semiconductor fine particles, and a mixture of these aspects. The adsorption encompasses chemical adsorption and physical adsorption.

Moreover, the photoconductor layer includes an electrolyte. The electrolyte included in the photoconductor layer has the same definition as the electrolyte included in the charge transfer layer which will be described later, and preferred examples are also the same. The electrolyte included in the photoconductor layer may be the same as or different from the electrolyte included in the charge transfer layer, but they are preferably the same as each other.

The photoelectric conversion element of the embodiment of the present invention is not particularly limited in terms of configurations other than the configuration defined in the present invention, and may adopt and use known configurations regarding photoelectric conversion elements. The respective layers constituting the photoelectric conversion element of the embodiment of the present invention are designed depending on purposes, and may be formed into, for example, a single layer or multiple layers. Further, layers other than the layers may be included, as desired.

The dye-sensitized solar cell of an embodiment of the present invention is formed using the photoelectric conversion element of the embodiment of the present invention.

Hereinafter, preferred embodiments of the photoelectric conversion element and the dye-sensitized solar cell of the embodiments of the present invention will be described.

A system 100 shown in FIG. 1 is a system in which a photoelectric conversion element 10 in the first aspect of the present invention is applied in cell uses where an operating means M (for example, an electric motor) in an external circuit 6 is forced to work.

The photoelectric conversion element 10 includes semiconductor fine particles 22 sensitized by carrying a conductive support 1 and a dye (metal complex dye) 21, a photoconductor layer 2 including an electrolyte between the semiconductor fine particles 22, a charge transfer layer 3 that is a hole transport layer, and a counter electrode 4.

In the photoelectric conversion element 10, the photoconductor layer 2 has the metal complex dye adsorbed on the semiconductor fine particles 22, which is also referred to as an oxide semiconductor electrode. Further, the light-receiving electrode 5 has the conductive support 1 and the photoconductor layer 2, and functions as a functional electrode.

In the system 100 in which the photoelectric conversion element 10 is applied, light incident to the photoconductor layer 2 excites the metal complex dye 21. The excited metal complex dye 21 has electrons having high energy, and these electrons are transferred from the metal complex dye 21 to a conduction band of the semiconductor fine particles 22, and further reach the conductive support 1 by diffusion. At this time, the metal complex dye 21 is in an oxidized form (cation). While the electrons reaching the conductive support 1 work in an external circuit 6, they reach the oxidized form of the metal complex dye 21 through the counter electrode 4 and the charge transfer layer 3, and the oxidized form is reduced. By repeating a cycle of the excitation of the metal complex dye and the electron movement, the system 100 functions as a solar cell.

Figure 2:
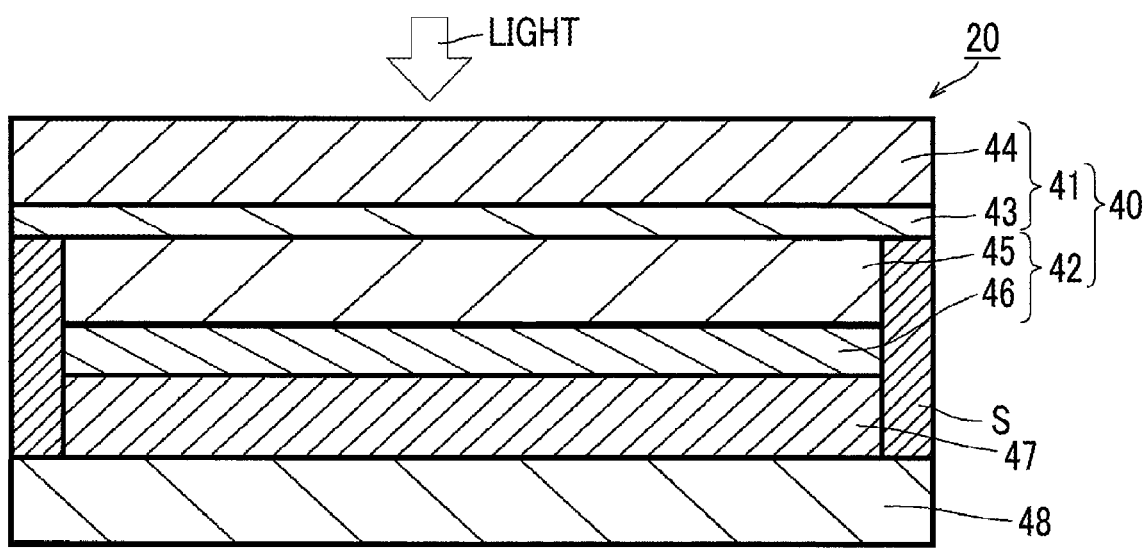
FIG. 2 is a cross-sectional view schematically showing a dye-sensitized solar cell including a photoelectric conversion element in a second aspect of the present invention.

A dye-sensitized solar cell 20 shown in FIG. 2 is constituted with the photoelectric conversion element in the second aspect of the present invention.

The photoelectric conversion element which serves as the dye-sensitized solar cell 20 is different from the photoelectric conversion element shown in FIG. 1 in terms of the configurations of the conductive support 41 and the photoconductor layer 42, and incorporation of a spacer S, but except for these points, has the same configuration as the photoelectric conversion element 10 shown in FIG. 1. That is, the conductive support 41 has a bilayered structure including a substrate 44 and a transparent conductive film 43 which is formed on the surface of the substrate 44. Further, the photoconductor layer 42 has a bilayered structure including a semiconductor layer 45 and a light-scattering layer 46 which is formed adjacent to the semiconductor layer 45. The photoconductor layer 42 has a metal complex dye adsorbed on semiconductor fine particles which form at least the photoconductor layer 42, which is also referred to as an oxide semiconductor electrode. A spacer S is provided between the conductive support 41 and the counter electrode 48. In the dye-sensitized solar cell 20, 40 is a light-receiving electrode and 47 is a charge transfer layer.

In a similar manner to the system 100 in which the photoelectric conversion element 10 is applied, the dye-sensitized solar cell 20 functions as a solar cell by light incident on the photoconductor layer 42.

The photoelectric conversion element and the dye-sensitized solar cell of the embodiments of the present invention exhibit excellent photoelectric conversion efficiency, external quantum efficiency for long-wavelength light, and heat resistance durability even upon irradiation with (pseudo) sunlight or even upon irradiation with artificial light from an illumination device such as a fluorescent lamp. In particular, the photoelectric conversion element and the dye-sensitized solar cell of the embodiments of the present invention exhibit an effect of further improvement of photoelectric conversion efficiency, external quantum efficiency for long-wavelength light, and heat resistance durability upon irradiation with (pseudo)sunlight including light in a long wavelength range, by an increase in a light absorption ability in a long wavelength range as described later, or the like.

The photoelectric conversion element and the dye-sensitized solar cell of the embodiment of the present invention are not limited to the above preferred aspects, and the configurations and the like of each of the aspects can be combined as appropriate within a range not departing from the scope of the present invention.

In the present invention, the materials and the respective members for use in the photoelectric conversion element and the dye-sensitized solar cell can be prepared by ordinary methods. Reference can be made to, for example, U.S. Pat. Nos. 4,927,721A, 4,684,537A, 5,084,365A, 5,350,644A, 5,463,057A, 5,525,440A, JP1985-249790A (JP-H07-249790A), JP2001-185244A, JP2001-210390A, JP2003-217688A, JP2004-220974A, and JP2008-135197A.

<Metal Complex Dye>

The photoelectric conversion element and the dye-sensitized solar cell of the embodiment of the present invention have a metal complex dye adsorbed onto semiconductor fine particles in the following dye adsorption aspects.

A first dye adsorption aspect is a combination of a metal complex dye represented by Formula (1) (hereinafter also referred to as a metal complex dye (1) in some cases) and a metal complex dye represented by Formula (2) (hereinafter also referred to as a metal complex dye (2) in some cases), and preferably a combination of the metal complex dye (1), the metal complex dye (2), and a metal complex dye represented by Formula (6) which will be described later (hereinafter also referred to as a metal complex dye (6) in some cases). In this dye adsorption aspect, a metal complex dye (2A) can be used as the metal complex dye (2) in a preferred aspect thereof.

A second dye adsorption aspect is a metal complex dye represented by Formula (2A) (hereinafter also referred to as a metal complex dye (2A) in some cases). In this dye adsorption aspect, the metal complex dye (2A) and the metal complex dye (1) or metal complex dye (6) can be used in combination, but in this case, the aspect is classified into the first dye adsorption aspect. Further, in the second dye adsorption aspect, another metal complex dye other than the metal complex dye (2A) among the metal complex dyes (2) can also be used in combination.

In each of the dye adsorption aspects, a further combination with other metal complex dyes in addition to the metal complex dyes may also be used.

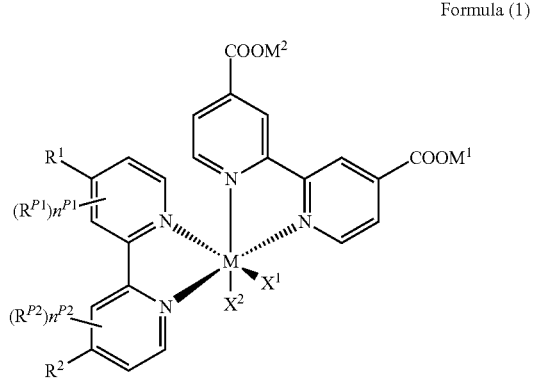

Formula (1)

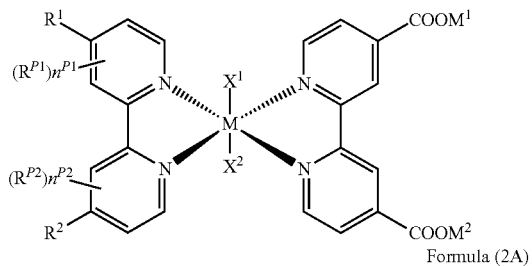

Formula (2)

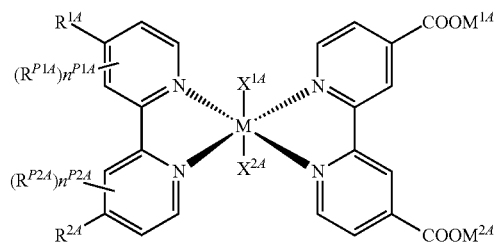

Formula (2A)

Details of symbols in each of the formulae will be described later.

The metal complex dye (1) is one of geometric isomers with respect to the six-coordination complex structure as described above, and is a cis form in which two monodentate ligands $X^1$ and $X^2$ in adjacent to each other are coordinated.

The metal complex dyes (2) and (2A) are each different geometric isomers with respect to the six-coordination complex structure, and are each trans forms in which two monodentate ligands $X^1$ and $X^2$ are coordinated (at trans positions) in a back-to-back direction (straight line).

In the present invention, in a case where the metal complex dyes (1), (2), and (2A) are each present in the form of isomers such as an optical isomer, a geometric isomer other than the geometric isomers with respect to the six-coordination complex structure, a bond isomer, and an ionized isomer, the metal complex dyes may be any one of these isomers or a mixture of these isomers.

As described above, the metal complex dye (1) and the metal complex dye (2) are in relationship of geometric isomers with respect to the monodentate ligand in the six-coordination complex structure. Details of a reason why excellent performance is imparted to the photoelectric conversion element and the dye-sensitized solar cell in a case where the metal complex dye (1) and the metal complex dye (2) in such a relationship are used in combination are not still clear, but are considered to be as follows.

In the photoelectric conversion element and the dye-sensitized solar cell, in a case where the metal complex dye (1) and the metal complex dye (2) are adsorbed, the association of the metal complex dye is effectively prevented, and a light absorption ability in a long wavelength range is enhanced, as compared with a case of a single use of the metal complex dye (1). This is considered to lead to further improvement of both the photoelectric conversion efficiency and the external quantum efficiency for long-wavelength light. Further, it is considered that an adsorption state of these metal complex dyes onto the semiconductor fine particles is changed from the adsorption state upon the single use of the metal complex dye (1), and thus, the heat resistance durability is also improved.

In addition, it is considered that in a case where the metal complex dye (6) is used in combination with the metal complex dye (1) and the metal complex dye (2), the association among the metal complex dyes is effectively suppressed, and thus, the metal complex dyes are adsorbed onto the semiconductor fine particles in a more stable state. Thus, while improvement of the photoelectric conversion efficiency and the external quantum efficiency is maintained, an effect of improving the heat resistance durability is further increased.

On the other hand, in a case where the metal complex dye (2A) is used, details of a reason why the excellent performance is imparted onto the photoelectric conversion element and the dye-sensitized solar cell are still not clear, but are considered to be as follows. That is, since a trans form of the metal complex dye (2A) absorbs light at a longer wavelength, as compared with the corresponding cis form of the metal complex dye (1), the "external quantum efficiency in a long wavelength range" is improved. Further, the metal complex dye (2A) has a less effect on a potential (energy level) of a lowest unoccupied molecular orbital (LUMO) by the longer wavelength, as compared with the cis form having the same ligand, and exhibits the "photoelectric conversion efficiency" that is equal to or higher than the cis form. In addition, in a case where the metal complex dye (2A) has an aromatic aminophenyl group, the light absorption coefficient on the longer wavelength side of the metal complex dye (2A) is significantly increased, whereby an effect of improving the "external quantum efficiency in a long wavelength range" becomes remarkable.

In a case where the metal complex dyes (1), (2), and (2A), and the like are used in combination, the structural elements (substituents, atoms, cations, ligands, and the like constituting the metal complex dyes) represented by the same symbols in each of the formulae may be the same as or different from each other among the metal complex dye to be used in combination, and are preferably the same as each other. For example, with regard to the substituent $R^1$, $R^1$ in the metal complex dye (1) and $R^1$ in the metal complex dye (2) may be the same as or different from each other. This shall also apply to a case where the substituent $R^1$ has a structure represented by Formula (3-1), Formula (4), or the like which will be described later.

This shall also be the same among the metal complex dyes to be used in combination in a case where the metal complex dye (6) which will be described later is used in combination with other metal complex dyes. Further, in the metal complex dye (6), two bipyridine ligands may be the same as or different from each other, and are preferably the same as each other.

It is preferable that each of the metal complex dyes (1), (2), and (2A) does not have an acidic group other than —COOM$^1$ and —COOM$^2$, or a salt thereof. It is also preferable that the metal complex dye (6) does not have an acidic group or a salt thereof. In particular, in each of the metal complex dyes (1), (2), and (2A), it is preferable that the bipyridine ligand having $R^1$ and $R^2$ does not have an acidic group or a salt thereof.

In the present invention, the acidic group refers to a substituent having a dissociative proton, which has a pKa of 11 or less. The pKa of the acidic group can be determined in accordance with the "SMD/M05-2X/6-31G*" method described in J. Phys. Chem. A2011, 115, pp. 6641-6645. Examples of the acidic group include a carboxyl group (—COOH), a phosphonyl group (—PO(OH)$_2$), a phosphoryl group (—O—PO(OH)$_2$), a sulfo group (—SO$_3$H), a boric acid group, a (phenolic)hydroxyl group, a (phenolic) thiol group (mercapto group), and a sulfonamide group.

A salt of the acidic group may be a metal salt or a non-metal salt. The counter ion as the acidic group becomes a salt is not particularly limited, and examples thereof include a metal cation or a non-metal cation, which can be adopted and used as each of $M^1$ and $M^2$ —Metal Complex Dye Represented by Formula (1)—

This metal complex dye (1) is represented by Formula (1)

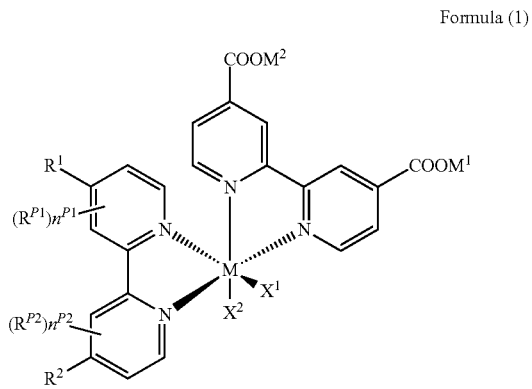

Formula (1)

In Formula (1), M represents a metal ion, and examples thereof include ions of elements belonging to Groups 6 to 12 on the long-form periodic table of the elements. Examples of such a metal ion include respective ions of Ru, Fe, Os, Cu, W, Cr, Mo, Ni, Pd, Pt, Co, Ir, Rh, Re, Mn, and Zn. The metal ion M may be one kind of ion, or two or more kinds of ions.

In the present invention, the metal ion M is preferably $Os^{2+}$, $Ru^{2+}$, or $Fe^{2+}$, more preferably $Os^{2+}$ or $Ru^{2+}$, and particularly preferably $Ru^{2+}$ among those.

In a state of being incorporated in the photoelectric conversion element, the valence of M is changed by a redox reaction with the surrounding material in some cases.

$R^1$ and $R^2$ each represent an alkenyl group, an alkynyl group, an aryl group, or a heteroaryl group. $R^1$ and $R^2$ are each preferably an alkenyl group, an aryl group, or a heteroaryl group, more preferably an alkenyl group or an aryl group, and still more preferably an alkenyl group.

The alkenyl group which can be adopted and used as each of $R^1$ and $R^2$ is not particularly limited, and examples thereof include an alkenyl group in the substituent group T which will be described later. Among those, an ethenyl group is preferable.

The alkynyl group which can be adopted and used as each of $R^1$ and $R^2$ is not particularly limited, and examples thereof include an alkynyl group in the substituent group T which will be described later. Among those, an ethynyl group is preferable.

Examples of the aryl group which can be adopted and used as each of $R^1$ and $R^2$ include may be a monocyclic aromatic hydrocarbon ring group and a ring group exhibiting aromaticity, formed by fusion of two or more monocyclic hydrocarbon rings (a fused polycyclic aromatic hydrocarbon ring group). Examples of the monocyclic hydrocarbon ring include a monocyclic aromatic hydrocarbon ring, and a hydrocarbon ring not exhibiting aromaticity, such as cyclopentadiene.

As the aryl group, a monocyclic aromatic hydrocarbon ring group is preferable.

The monocyclic aromatic hydrocarbon ring group is not particularly limited, but is preferably a benzene ring group.

The fused polycyclic aromatic hydrocarbon ring group is not particularly limited, but is preferably a group formed by fusion of at least two rings selected from a benzene ring or a cyclopentadiene ring. In the fused polycyclic aromatic hydrocarbon ring group, the number of ring members of the fused hydrocarbon ring is not particularly limited, but is preferably 4 to 8, and more preferably 5 or 6. Incidentally, the number of the fused hydrocarbon rings is not particularly limited, and is preferably 2 to 5, more preferably 2 or 3, and still more preferably 2. Examples of the fused polycyclic aromatic hydrocarbon ring group include each group of a naphthalene ring, an anthracene ring, a phenanthrene ring, a triphenylene ring, a chrysene ring, a picene ring, a pyrene ring, a fluorene ring, or an azulene ring.

The number of ring-constituting atoms of the aryl group which can be adopted and used as each of $R^1$ and $R^2$ is not particularly limited, but is preferably 6 to 30, more preferably 6 to 10, and still more preferably 6.

In the present invention, even in a case where the fused polycyclic aromatic hydrocarbon ring group can be interpreted as a group formed by combination of an (monocyclic) aromatic hydrocarbon ring with another group, it is not interpreted as such a group but interpreted as a fused polycyclic aromatic hydrocarbon ring. For example, the fluorene ring is a benzene ring having a methyl group and a phenyl group as the substituent, and it can be interpreted as a ring formed by mutual bonding of two substituents to form a fused ring together with the benzene ring. However, in the present invention, the fluorene ring is not interpreted as such, which shall also apply to a fused polycyclic aromatic heterocyclic group which will be described later.

Examples of the heteroaryl group which can be adopted and used as each of $R^1$ and $R^2$ include a monocyclic aromatic heterocyclic group and a ring group exhibiting aromaticity (fused polycyclic aromatic heterocyclic group) formed by fusion of a plurality of monocycles (including ones not exhibiting aromaticity), including heterocycles. Examples of the monocycle forming the fused polycyclic aromatic heterocyclic group include a monocyclic aromatic heterocycle and a monocyclic hydrocarbon ring. The monocyclic hydrocarbon ring has the same definitions as the monocyclic hydrocarbon ring in the aryl group.

As the heteroaryl group, a monocyclic aromatic heterocyclic group is preferable.

The monocyclic aromatic heterocyclic group is not particularly limited, but is preferably an aromatic heterocyclic group having carbon atoms and at least one heteroatom (for example, a nitrogen atom, an oxygen atom, a sulfur atom, a silicon atom, a selenium atom, and a phosphorous atom) as a ring-constituting atom. The monocyclic aromatic heterocyclic group is not particularly limited, but is preferably a group with a 5- or 6-membered ring.

Examples of the monocyclic aromatic heterocyclic group include each group of a thiophene ring, a furan ring, a pyrrole ring, a selenophene ring, a thiazole ring, an oxazole ring, an isothiazole ring, an isoxazole ring, an imidazole ring, a pyrazole ring, a thiadiazole ring, an oxadiazole ring, a triazole ring, a silole ring, a phosphole ring, a pyridine ring, a pyrazine ring, a pyrimidine ring, a pyridazine ring, a triazine ring, or a tetrazine ring, each group of the thiophene ring or the furan ring are preferable, and the thiophene ring group is more preferable.

The fused polycyclic aromatic heterocyclic group is not particularly limited, and examples thereof include a ring group in which a monocyclic aromatic heterocyclic group is bonded to a pyridine ring in Formula (1), for example, a ring group formed by a plurality of fusions of monocyclic aromatic heterocycles and a ring group formed by a plurality of fusions of monocyclic aromatic heterocycles and monocyclic hydrocarbon rings. In the fused polycyclic aromatic heterocyclic group, the number of ring members and the number of monocycles in the fused monocycles are not particularly limited, and are the same as the number of ring members and the number of hydrocarbon rings in the fused polycyclic hydrocarbon rings in the fused polycyclic aromatic hydrocarbon ring group, and preferred examples thereof are also the same.

Examples of the fused polycyclic aromatic heterocyclic group include each group of a benzofuran ring, an isobenzofuran ring, a benzothiophene ring, a benzoisothiophene ring, an indazole ring, an indole ring, an isoindole ring, an indolizine ring, a carbazole ring (dibenzopyrrole ring), a quinoline ring, an isoquinoline ring, a benzoxazole ring, a benzisoxazole ring, a benzothiazole ring, a benzisothiazole ring, a benzimidazole ring, a benzotriazole ring, a dibenzofuran ring, a dibenzothiophene ring, a thienopyridine ring, a silafluorene ring (dibenzosilole ring), a thienothiophene ring, a trithiophene ring, a cyclopentadithiophene ring, a cyclopentadifuran ring, a benzodifuran ring, a benzodithiophene ring, a dithienopyrrole ring, a dithienofuran ring, and a dithienosilole ring.

The number of ring-constituting carbon atoms of the heteroaryl group which can be adopted and used as each of $R^1$ and $R^2$ is not particularly limited, but is preferably 0 to 24, and more preferably 1 to 18.

$R^1$ and $R^2$ may each have a substituent, but preferably have a substituent. The substituent is not particularly limited, but examples thereof include the group selected from the substituent group T which will be described later, or a group formed by combination of groups selected from the substituent group T.

The group selected from the substituent group T is not particularly limited, and is more preferably an alkyl group, an alkenyl group, an alkynyl group, an alkoxy group, an aryloxy group, an alkylthio group, an arylthio group, an aryl group, a heteroaryl group, an amino group, a halogen atom, or a cyano group, and more preferably an alkyl group, an alkoxy group, an aryloxy group, an alkylthio group, an arylthio group, an aryl group, a heteroaryl group, an amino group, a halogen atom, or a cyano group.

The alkyl group which can be adopted and used as the substituent that may be contained in each of $R^1$ and $R^2$ has the same definition as the alkyl group in the substituent group T which will be described later, except for the number of carbon atoms. The number of carbon atoms in the linear alkyl group or the branched alkyl group among the alkyl groups is preferably 1 to 30, more preferably 2 to 26, still more preferably 3 to 20, and particularly preferably 3 to 12. The number of carbon atoms of the cyclic alkyl group is preferably 3 to 30, more preferably 5 to 30, still more preferably 6 to 26, and particularly preferably 6 to 20.

The aryl group, the heteroaryl group, the alkenyl group, and the alkynyl group which can be adopted and used as the substituent that may be contained in each of $R^1$ and $R^2$ each have the same definitions as the corresponding groups which can be adopted and used as each of $R^1$ and $R^2$, and preferred examples thereof are also the same.

The alkyl moiety of the alkoxy group and the alkylthio group which can be adopted and used as the substituent that may be contained in each of $R^1$ and $R^2$ has the same definition as the alkyl group which can be adopted and used as the substituent, and preferred examples thereof are also the same.

Examples of the aryloxy group and arylthio group which can be adopted and used as the substituent that may be contained in each of $R^1$ and $R^2$ each include a heteroaryloxy group and a heteroarylthio group, in addition to an aromatic hydrocarbon ring oxy group and an aromatic hydrocarbon ring thio group. The aromatic hydrocarbon ring group in the aryloxy group and the arylthio group has the same definition as the aryl group (the monocyclic aromatic hydrocarbon ring group and the fused polycyclic aromatic hydrocarbon ring group) which can be adopted and used as each of $R^1$ and $R^2$. Further, the heteroaryl ring group in the aryloxy group and the arylthio group has the same definition as the heteroaryl group (the monocyclic aromatic heterocyclic group and the fused polycyclic aromatic heterocyclic group) which can be adopted and used as each of $R^1$ and $R^2$. The number of carbon atoms in the aryloxy group and the arylthio group is preferably 3 to 30, more preferably 3 to 25, still more preferably 3 to 20, and particularly preferably 3 to 16.

Examples of the halogen atom which can be adopted and used as the substituent that may be contained in each of $R^1$ and $R^2$ include the corresponding groups in the substituent group T which will be described later, and preferred examples thereof are also the same.

Examples of the amino group which can be adopted and used as the substituent that may be contained in each of $R^1$ and $R^2$ include an alkylamino group, an arylamino group, and a heteroarylamino group, in addition to an unsubstituted amino group (—$NH_2$).

Here, examples of the alkylamino group include an N-alkylamino group and an N,N-dialkylamino group. Examples of the arylamino group include an N-arylamino group, an N-alkyl-N-arylamino group, and an N,N-diarylamino group. In the arylamino group, it is preferable that at least one of the aryl groups bonded to the nitrogen atom has a substituent, and it is more preferable that two aryl groups have the same or different substituents. Details (restrictive), substitution positions, and the like of preferred substituents contained in the aryl group will be described later. Examples of the heteroarylamino group include an N-heteroarylamino group, an N-alkyl-N-heteroarylamino group, an N-aryl-N-heteroarylamino group, and an N,N-diheteroarylamino group.

As the amino group, an N,N-dialkylamino group, an N,N-diarylamino group, or an N,N-diheteroarylamino group is preferable, and the N,N-diarylamino group is more preferable.

The alkyl group, the aryl group, and the heteroaryl group bonded to the nitrogen atom in the amino group are not particularly limited and have the same definitions as the alkyl group, the aryl group, and the heteroaryl group which can be adopted and used as each of $R^1$ and $R^2$, and preferred examples thereof are also the same.

In a case where the amino group has a total of two alkyl groups, aryl groups, or heteroaryl groups bonded to the nitrogen atom, the groups may be bonded to each other directly or through a linking group. Such a linking group is not particularly limited, and examples thereof include —O—, —S—, —$NR^{NR}$—, —$C(R^{NR})_2$—, and —$Si(R^{NR})_2$—. Here, examples of $R^{NR}$ include a hydrogen atom, or a group selected from the substituent group T, and preferably an alkyl group.

The substituent other than the respective groups which can be adopted and used as the substituent that may be contained in each of $R^1$ and $R^2$ has same definition as the group in the substituent group T which will be described later, and preferred examples thereof are also the same.

The group formed by the combination which can be adopted and used as the substituent that may be contained in each of $R^1$ and $R^2$ is not particularly limited as long as it is a group formed by combination of a group selected from the substituent group T. Examples of the group formed by the combination include groups represented by Formulae (3-1) to (3-4) which will be described later, a group represented by Formula (4) which will be described later, or an alkyl group substituted with a halogen atom (halogenated alkyl group), and the group represented by Formulae (3-1) to (3-4) or the group represented by Formula (4) which will be described later is preferable. Further, the groups represented by Formulae (3-1) to (3-4), and Formula (4) are shown as a group including $R^1$ or $R^2$. The number of groups to be combined is not particularly limited as long as it is 2 or more, and the number of the groups is preferably 2 to 16, and more preferably 2 to 8.

It is preferable that $R^1$ and $R^2$ each have a group formed by combination of groups selected from the substituent group T as a substituent, among the groups selected from the substituent group T, or a group formed by combination of the groups selected from the substituent group T.

$R^1$ and $R^2$ having a substituent are each preferably a group represented by any one of Formulae (3-1) to (3-4). * in each of the formulae represents a bonding moiety to the pyridine ring in each of Formula (1) and Formula (2).

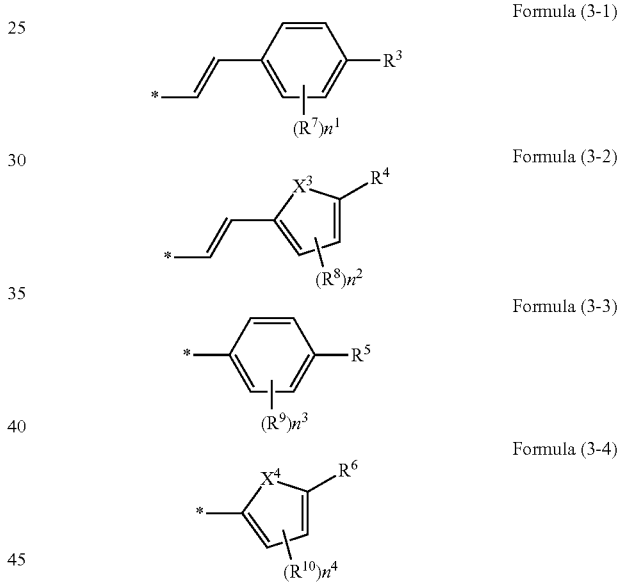

In Formulae (3-1) to (3-4), $R^3$ to $R^6$ each represent a hydrogen atom, an alkyl group, an alkenyl group, an alkynyl group, an alkoxy group, an alkylthio group, an aryl group, a heteroaryl group, an amino group, or a halogen atom. Among those, the alkyl group, the alkoxy group, the alkylthio group, the aryl group, the heteroaryl group, or the amino group is preferable, and the amino group is more preferable.

The respective groups which can be adopted and used as each of $R^3$ to $R^6$ have the same definitions as the above-mentioned group which can be adopted and used as the substituent that may be contained in each of $R^1$ and $R^2$, and preferred examples thereof are also the same.

The respective groups which can be adopted and used as each of $R^3$ to $R^6$ may be each a group alone or a group formed by combination of the respective groups which can be adopted and used as each of $R^3$ to $R^6$, or a group formed by combination of groups other than the respective groups selected from the substituent group T.

In Formulae (3-1) to (3-4), $R^7$ to $R^{10}$ each represent an alkyl group, an alkenyl group, an alkynyl group, an alkoxy group, an alkylthio group, an aryl group, a heteroaryl group, an amino group, or a halogen atom. Among those, the alkyl group or the alkoxy group is preferable.

The respective groups which can be adopted and used as each of $R^7$ to $R^{10}$ each have the same definitions as the corresponding groups which can be adopted and used as the substituent that may be contained in each of $R^1$ and $R^2$, and preferred examples thereof are also the same.

The respective groups which can be adopted and used as each of $R^7$ to $R^{10}$ may each further have a substituent. Examples of such a substituent include groups selected from the substituent group T, and among those, the substituent which may be contained in each of $R^1$ and $R^2$ is preferable.

In Formulae (3-1) to (3-4), $n^1$ and $n^3$ are each an integer of 0 to 4, preferably an integer of 0 to 2, more preferably 0 or 1, and still more preferably 0.

$n^2$ and $n^4$ are each an integer of 0 to 2, preferably 0 or 1, and more preferably 0.

In Formulae (3-1) to (3-4), $X^3$ and $X^4$ each represent a sulfur atom or an oxygen atom, and are preferably a sulfur atom.

$R^1$ and $R^2$ are each more preferably a group represented by Formula (4). * in the formulae represents a bonding moiety to the pyridine ring in each of Formula (1) and Formula (2).

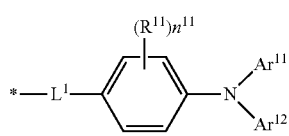

Formula (4)

In Formula (4), L represents a single bond or an ethenylene group, and is preferably the ethenylene group.

$Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$.

<Substituent Group $S_{Ar}$> an alkyl group, an alkoxy group, an aryloxy group, an alkylthio group, an arylthio group, an aryl group, a heteroaryl group, an amino group, a halogen atom, or a cyano group.

The aryl group (before substitution with a substituent) which can be adopted and used as each of $Ar^{11}$ and $Ar^{12}$ is not particularly limited, and has the same definition as the aryl group which can be adopted and used as each of $R^1$ and $R^2$, and preferred examples thereof are also the same. Here, it is preferable that the aryl group which can be adopted and used as each of $Ar^{11}$ and $Ar^{12}$ does not have a fused ring structure.

The heteroaryl group (unsubstituted or before substitution with a substituent) which can be adopted and used as each of $Ar^{11}$ and $Ar^{12}$ is not particularly limited, and has the same definition as the heteroaryl group which can be adopted and used as each of $R^1$ and $R^2$, and preferred examples thereof are also the same.

Among those, $Ar^{11}$ and $Ar^{12}$ are each preferably an aryl group having at least one substituent selected from the substituent group $S_{Ar}$, and more preferably a phenyl group having at least one substituent selected from the substituent group $S_{Ar}$.

$Ar^{11}$ and $Ar^{12}$ may be bonded to each other directly or through a linking group. The linking group is not particularly limited, and is as described with regard to the amino group. In the present invention, it is preferable that $Ar^{11}$ and $Ar^{12}$ are not bonded to each other.

As the substituent selected from the substituent group $S_{Ar}$, an alkyl group, an alkoxy group, an aryl group, a heteroaryl group, or a halogen atom is preferable, and the alkyl group or the alkoxy group is more preferable.

The respective groups included in the substituent group $S_{Ar}$ have the same definitions as the respective groups which can be adopted and used as the substituent that may be contained in each of $R^1$ and $R^2$, and preferred examples thereof are also the same.

However, in a case where $L^1$ is an ethenylene group, and the aryl group (particularly a phenyl group) which can be adopted and used as each of $Ar^{11}$ and $Ar^{12}$ has an alkyl group as the substituent (in a case where $Ar^{11}$ and $Ar^{12}$ are each an alkylaryl group), the alkyl group that forms the alkylaryl group is a linear alkyl group having 3 or more carbon atoms, or a branched alkyl group. The linear alkyl group and the branched alkyl group each have the same definition as the alkyl group which can be adopted and used as the substituent that may be contained in each of $R^1$ and $R^2$, except that the lower limit of the number of carbon atoms is 3, and preferred examples thereof are also the same. The number of carbon atoms of the branched alkyl group is preferably 4 or more.

In addition, in a case where $L^1$ is an ethenylene group, and the aryl group (particularly a phenyl group) which can be adopted and used as each of $Ar^{11}$ and $Ar^{12}$ has a monoalkylamino group or a dialkylamino group as the substituent (in a case where $Ar^{11}$ and $Ar^{12}$ are each a monoalkylaminoaryl group or a dialkylaminoaryl group), at least one of the alkyl groups that form an alkylamino groups is a linear alkyl group having 5 or more carbon atoms or a branched alkyl group. The linear alkyl group has the same definition as the alkyl group which can be adopted and used as the substituent that may be contained in each of $R^1$ and $R^2$, except that the lower limit of the number of carbon atoms is 5, and preferred examples thereof are also the same. The branched alkyl group has the same definition as the alkyl group which can be adopted and used as the substituent that may be contained in each of $R^1$ and $R^2$, and preferred examples thereof are also the same.

In a case where $Ar^{11}$ and $Ar^{12}$ have the substituent, the number of the substituents is not particularly limited, and is preferably 1 to 4, and more preferably 1 or 2. In a case where $Ar^{11}$ and $Ar^{12}$ have a plurality of substituents, these substituents may be the same as or different from each other.

In a case where $Ar^{11}$ and $Ar^{12}$ have the substituent, the position of the substituent is not particularly limited. For example, in the aryl group or the heteroaryl group which can be adopted and used as each of $Ar^{11}$ and $Ar^{12}$, the position at which the substituent is substituted may be any one of the 2-position (ortho position), the 3-position (meta position), or the 4-position (para position) with respect to the ring-constituting carbon atom bonded to the N atom, and is preferably the 3-position or the 4-position. In a case where $Ar^{11}$ and $Ar^{12}$ are substituted with two substituents or the like, the substitution positions are preferably the 2-position and the 4-position, or are both the 3-positions.

The respective groups included in the substituent group $S_{Ar}$ may have a substituent. Such a substituent is not particularly limited, but examples thereof include a group selected from the substituent group T which will be described later.

The aryl groups having at least one substituent selected from the substituent group $S_{Ar}$ which can be adopted and used as each of $Ar^{11}$ and $Ar^{12}$ are each preferably a group represented by any one of Formula (5-1) to Formula (5-5), more preferably a group represented by Formula (5-1) or Formula (5-2), and still more preferably a group represented by Formula (5-1). In each of the formulae, * represents a bonding moiety to the nitrogen atom in Formula (4).

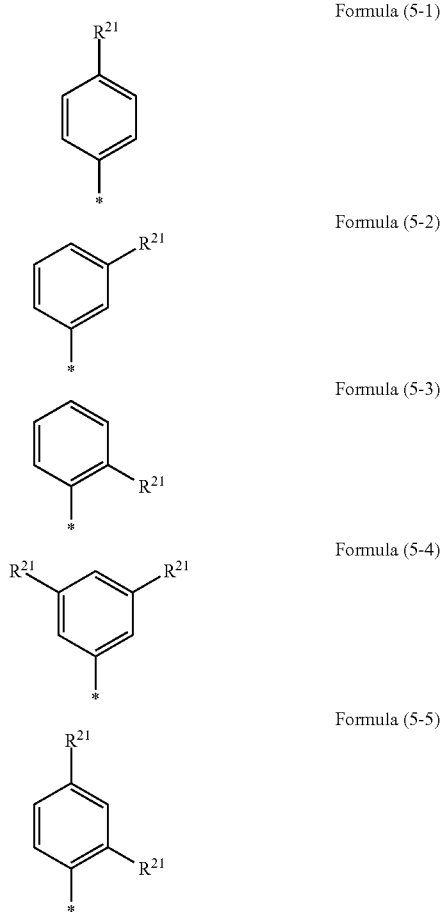

Formula (5-1)

Formula (5-2)

Formula (5-3)

Formula (5-4)

Formula (5-5)

In Formula (5-1) to Formula (5-3), $R^{21}$ represents an alkyl group, an alkoxy group, an aryl group, a heteroaryl group, or a halogen atom. In Formula (5-4) to Formula (5-5), $R^{21}$ represents a hydrogen atom, an alkyl group, an alkoxy group, an aryl group, a heteroaryl group, or a halogen atom, and at least one of $R^{21}$'s represents an alkyl group, an alkoxy group, an aryl group, a heteroaryl group, or a halogen atom.

As the group which can be adopted and used as $R^{21}$, an alkyl group, an alkoxy group, an aryl group, or a halogen atom is preferable, and the alkyl group or the alkoxy group is more preferable.

The respective groups which can be adopted and used as $R^{21}$ each have the same definitions as the corresponding groups included in the substituent group $S_{Ar}$, and preferred examples thereof are also the same. Here, in a case where $L^1$ is an ethenylene group, the alkyl group is a linear alkyl group having 3 or more carbon atoms or a branched alkyl group.

In Formula (5-4) and Formula (5-5), two $R^{21}$'s may be the same as or different from each other.

In Formula (4), $R^{11}$ represents an alkyl group, an alkoxy group, an alkylthio group, an aryl group, a heteroaryl group, an amino group, or a halogen atom. Among those, the alkyl group or the alkoxy group is preferable.

The respective groups which can be adopted and used as $R^{11}$ have the same definition as the group which can be adopted and used as each of $R^7$, and preferred examples thereof are also the same.

In Formula (4), $n^{11}$ is an integer of 0 to 4. $n^{11}$ has the same definition as $n^1$, and preferred examples thereof are also the same.

In Formula (1), $R^{P1}$ and $R^{P2}$ each represent an alkyl group, an alkoxy group, an alkylthio group, an aryl group, a heteroaryl group, an amino group, or a halogen atom. Among those, the alkyl group, the alkoxy group, the aryl group, or the halogen atom is preferable, and the alkyl group or the aryl group is more preferable.

Examples of the respective groups which can be adopted and used as each of $R^{P1}$ and $R^{P2}$ each include the corresponding groups in the substituent group T which will be described later, and preferred examples thereof are also the same.

$R^{P1}$ and $R^{P2}$ may be the same as or different from each other.

The respective groups which can be adopted and used as each of $R^{P1}$ and $R^{P2}$ may further have a substituent. The substituent which may be further contained is not particularly limited, and is preferably a substituent selected from the substituent group T which will be described later. Further, it is preferable that the respective groups which can be adopted and used as each of $R^{P1}$ and $R^{P2}$ do not have the above-mentioned acidic group or a salt thereof.

In Formula (1), $n^{P1}$ and $n^{P2}$ are each an integer of 0 to 3, preferably 0 or 1, and more preferably 0.

In Formula (1), $X^1$ and $X^2$ each represent a monodentate ligand.

The monodentate ligand which can be adopted and used as $X^1$ and $X^2$ is not particularly limited, and examples thereof include a ligand (hereinafter simply referred to as a XXX group) that coordinates to a group selected from the group consisting of an acyloxy group, a thioacylthio group, an acylaminooxy group, a dithiocarbamate group, a dithiocarbonate group, a trithiocarbonate group, a thiocyanate group (—SCN, thiocyanate anion), an isothiocyanate group (—NCS, isothiocyanate anion), an isoselenocyanate group, a cyanate group, an isocyanate group, a cyano group, an alkylthio group, an arylthio group, an alkoxy group, and an aryloxy group, or a ligand including a halogen atom, carbonyl, a 1,3-diketone, or a thiourea.

In a case where the ligand includes an alkyl group, an alkenyl group, an alkynyl group, an alkylene group, or the like in the molecule, it may be linear or branched, or may be substituted or unsubstituted. Further, in a case where the ligand includes an aryl group, a heterocyclic group, a cycloalkyl group, or the like, it may be substituted or unsubstituted, or may be a monocycle or a fused ring.

The monodentate ligand is preferably an acyloxy group, an acylaminooxy group, a dithiocarbamate group, a thiocyanate group, an isothiocyanate group, a cyanate group, an isocyanate group, a cyano group, an arylthio group, a halogen atom, a 1,3-diketone, or a thiourea, more preferably a dithiocarbamate group, a thiocyanate group, an isothiocyanate group, a cyanate group, an isocyanate group, a halogen atom, or a 1,3-diketone, still more preferably a dithiocarbamate group, a thiocyanate group, an isothiocyanate group, or a 1,3-diketone, particularly preferably an isothiocyanate group or a thiocyanate group, and most preferably an isothiocyanate group.

$X^1$ and $X^2$ may be the same as or different from each other.

In Formula (1), $M^1$ and $M^2$ each represent any one of a proton (hydrogen atom), a metal cation, or a non-metal cation. $M^1$ and $M^2$ are each preferably the non-metal cation from the viewpoint of improvement of photoelectric conversion efficiency, external quantum efficiency, and heat resistance durability.

The metal cation which can be adopted and used as each of $M^1$ and $M^2$ is not particularly limited, but examples thereof include an alkali metal ion, an alkaline earth metal ion, and a metal complex ion. Among those, the alkali metal ion or the alkaline earth metal ion is preferable, the alkali metal ion is more preferable, the lithium ion, the sodium ion, or the potassium ion is still more preferable, and the sodium ion or the potassium ion is particularly preferable.

The non-metal cation which can be adopted and used as each of $M^1$ and $M^2$ is not particularly limited, but examples thereof include inorganic or organic ammonium ions (for example, trialkylammonium ions and tetraalkylammonium ions), phosphonium ions (for example, tetraalkylphosphonium ions and alkyltriphenylphosphonium ions), pyridinium ions, imidazolium ions, amidinium ions, and guanidinium ions.

Among those, organic ammonium ions (tetramethylammonium ions, tetraethylammonium ions, tetrabutylammonium ions, tetrahexylammonium ions, tetraoctylammonium ions, tetradecylammonium ions, tetradodecylammonium ions, and the like), pyridinium ions, imidazolium ions, or amidinium ions are preferable, organic ammonium ions, pyridinium ions, imidazolium ions, or amidinium ions are more preferable, organic ammonium ions, pyridinium ions, or imidazolium ions are more preferable, and organic ammonium ions are particularly preferable.

In the metal complex dye (1), in a case where a proton, a metal cation, and a non-metal cation are present in mixture as each of $M^1$ and $M^2$, any of $M^1$ and $M^2$ may be the proton.

—Metal Complex dye Represented by Formula (2)—

The metal complex dye (2) is represented by Formula (2).

The metal complex dye (2) is the same as the metal complex dye (1), except that it is a geometric isomer with respect to $X^1$ and $X^2$ of the metal complex dye (1), as described above.

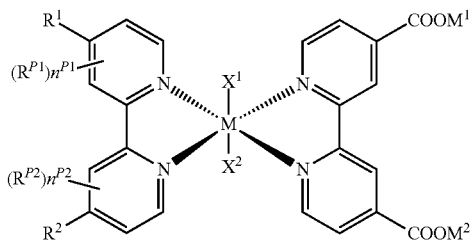

Formula (2)

In Formula (2), M, $R^1$, $R^2$, $R^{P1}$, $R^{P2}$, $n^{P1}$, $n^{P2}$, $X^1$, $X^2$, $M^1$, and $M^2$ each have the same definitions as in Formula (1), and preferred examples thereof are also the same.

—Metal Complex dye Represented by Formula (6)—

The metal complex dye (6) is represented by Formula (6).

The metal complex dye (6) is a metal complex dye (without consideration of geometric isomerism) further having a bipyridine ligand in which each of two pyridine rings has a substituent ($R^3$ or $R^4$), instead of the bipyridine ligand having —$COOM^1$ and —$COOM^2$ in metal complex dye (1), as described above. That is, the metal complex dye (6) is the same as the metal complex dye (1), except that it does not have two bipyridine ligands in which each of two pyridine rings has a substituent ($R^1$ to $R^4$) and a bipyridine ligand having —$COOM^1$ and —$COOM^2$, without consideration of geometric isomerism.

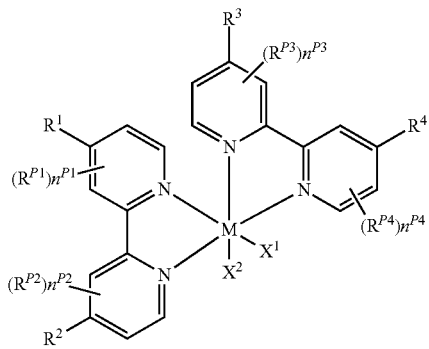

Formula (6)

In Formula (6), M, $R^1$, $R^2$, $R^{P1}$, $R^{P2}$, $n^{P1}$, $n^{P2}$, $X^1$, and $X^2$ have the same definitions as in Formula (1), and preferred examples thereof are also the same. Further, $R^3$ and $R^4$ have the same definitions as the $R^1$ and $R^2$ in Formula (1), and preferred examples thereof are also the same.

$R^{P3}$ and $R^{P4}$ each have the same definition as $R^{P1}$ in Formula (1), and preferred examples thereof are also the same. Further, $n^{P3}$ and $n^{P4}$ each have the same definition as $n^{P1}$ in Formula (1), and preferred examples thereof are also the same.

In the present invention, in a case where the metal complex dye (6) exists as an isomer such as an optical isomer, a geometric isomer, a bond isomer, and an ionized isomer, it may be either any of these isomers or a mixture of these isomers. For example, the metal complex dye (6) does not need to be particularly classified to geometric isomers with regard to the six-coordination complex structure, and may be either a cis form or a trans form, or a mixture of these forms.

—Metal Complex dye Represented by Formula (2A)—

The metal complex dye (2A) is a metal complex dye which is used in the first and second dye adsorption aspects, and is represented by Formula (2A). This metal complex dye (2A) is the same as the metal complex dye (2), except that $R^{1A}$ and $R^{2A}$ are each a group represented by Formula (4), as shown below. That is, the metal complex dye (2A) is a metal complex dye in which $R^1$ and $R^2$ of the metal complex dye (2) are each limited to a group represented by Formula (4), and constitutes a part of the metal complex dye (2). This metal complex dye (2A) is a trans form with respect to $X^{1A}$ and $X^{2A}$.

Formula (2A)

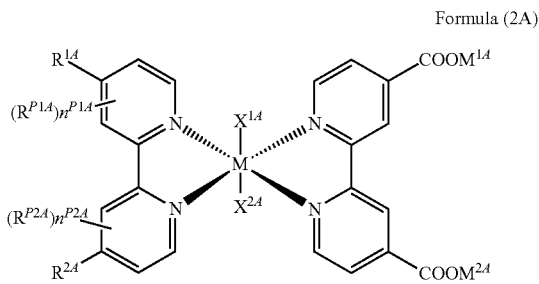

In Formula (2A), M, $R^{P1A}$, $R^{P2A}$, $n^{P1A}$, $n^{P2A}$, $X^{1A}$, $X^{2A}$, $M^{1A}$, and $M^{2A}$ each have the same definitions as M, $R^{P1}$, $R^{P2}$, $n^{P1}$, $n^{P2}$, $X^1$, $X^2$, $M^1$, and $M^2$ in Formula (1), respectively, and preferred examples thereof are also the same.

In Formula (2A), $R^{1A}$ and $R^{2A}$ are each a group represented by Formula (4), the group represented by Formula (4) has the same definition as the group described in the metal complex dye (1), and preferred examples thereof are also the same.

Formula (4)

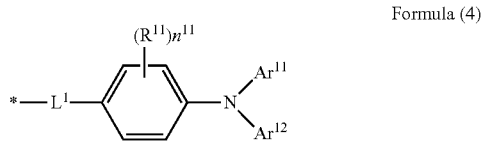

In Formula (4), $Ar^{11}$, $Ar^{12}$, $L^1$, $R^{11}$, and $n^{11}$ each have the same definitions as $Ar^{11}$, $Ar^{12}$, $L^1$, $R^{11}$, and $n^{11}$ of the group represented by Formula (4), respectively, which can be adopted and used as each of $R^1$ and $R^2$ in Formula (2), and preferred examples thereof are also the same.

In Formula (4), * represents a bonding moiety to a pyridine ring in Formula (2A).

—Physical Properties of Metal Complex Dye—

The maximum absorption wavelength in a solution of any of the metal complex dye (1), the metal complex dye (2), the metal complex dye (2A), and the metal complex dye (6) is preferably in a range of 300 to 1,000 nm, more preferably in a range of 350 to 950 nm, and particularly preferably in a range of 370 to 900 nm.

A dye composition including at least the metal complex dye (2) or the metal complex dye (2A) has an absorption spectrum extended to a long wavelength range of, for example, 700 nm or more.

—Synthesis of Metal Complex Dye—

The metal complex dye (1) can be synthesized by, for example, the methods described in JP4874454B and JP2008-021496A, the patent publications regarding solar cells, known methods, or the methods equivalent thereto.

The metal complex dye (2), the metal complex dye (2A), and the metal complex dye (6) can each be obtained upon synthesis of the metal complex dye (1). In the synthesis of the metal complex dye (1), the amounts of the metal complex dye (2), the metal complex dye (2A), and the metal complex dye (6) to be produced can be changed by changing the synthesis conditions (reaction conditions) and the like. For example, the amount of the metal complex dye (2), the metal complex dye (2A), or the metal complex dye (6) to be produced can be increased or decreased by changing the heating temperature or heating time, or the solvent used, or the like upon coordination of a bipyridine ligand having $R^1$ and $R^2$, and a bipyridine ligand having —$COOM^1$ and —$COOM^2$ to a metal ion (upon synthesis of an ester compound in Examples which will be described later) among the reaction conditions. By isolating and purifying a crude product (mixture of metal complex dyes) obtained by the changing the reaction conditions by an ordinary method, for example, a silica gel column chromatography, each of the metal complex dyes can be obtained.

<Substituent Group T>

In the present invention, preferred examples of the substituent include the groups selected from the following substituent group T.

Incidentally, in the present specification, in a case where there is only a simple description of a substituent, the description is intended to refer to this substituent group T, and in a case where each of the groups, for example, an alkyl group is merely described, preferable range and specific examples for the corresponding group for the substituent group T are applied.

Moreover, in the present specification, in a case where an alkyl group is described as distinguishable from a cyclic (cyclo) alkyl group, the alkyl group is used to mean inclusion of both of a linear alkyl group and a branched alkyl group. On the other hand, in a case where an alkyl group is not described as distinguishable from a cycloalkyl group (a case where an alkyl group is simply described and a case where there is no particular description), the alkyl group is used to mean any of a linear alkyl group, a branched alkyl group, and a cycloalkyl group. This shall also apply to a group (an alkoxy group, an alkylthio group, an alkenyloxy group, and the like) including a group (an alkyl group, an alkenyl group, an alkynyl group, and the like) which can adopt and use a cyclic structure, and a compound including a group which can adopt and use a cyclic structure. In the following description of the substituent group T, for example, a group with a linear or branched structure and a group with a cyclic structure are sometimes separately described for clarification of both groups, such as an alkyl group and a cycloalkyl group.

Examples of the groups included in the substituent group T include the following groups, or groups formed by combination of a plurality of the following groups:

an alkyl group (preferably an alkyl group having 1 to 20 carbon atoms, and more preferably an alkyl group having 1 to 12 carbon atoms, for example, methyl, ethyl, n-propyl, i-propyl, n-butyl, t-butyl, pentyl, heptyl, 1-ethylpentyl, benzyl, 2-ethoxyethyl, 1-carboxymethyl, and trifluoromethyl), an alkenyl group (preferably an alkenyl group having 2 to 20 carbon atoms, and more preferably an alkenyl group having 2 to 12 carbon atoms, for example, vinyl, allyl, and oleyl), an alkynyl group (preferably an alkynyl group having 2 to 20 carbon atoms, and more preferably an alkynyl group having 2 to 12 carbon atoms, for example, ethynyl, butynyl, and phenylethynyl), a cycloalkyl group (preferably a cycloalkyl group having 3 to 20 carbon atoms), a cycloalkenyl group (preferably a cycloalkenyl group having 5 to 20 carbon atoms), an aryl group (preferably an aryl group having 6 to 26 carbon atoms, for example, phenyl, 1-naphthyl, 4-methoxyphenyl, 2-chlorophenyl, 3-methylphenyl, difluorophenyl, and tetrafluorophenyl), and a heterocyclic group (preferably a heterocyclic group having 2 to 20 carbon atoms, and more preferably a 5- or 6-membered heterocyclic group having at least one oxygen atom, sulfur atom, or nitrogen atom). Examples of the heterocycle include an aromatic ring and an aliphatic ring. Examples of the aromatic heterocyclic group (heteroaryl group) include the following groups. For example, 2-pyridyl, 4-pyridyl, 2-imidazolyl, 2-benzimidazolyl, 2-thienyl, 2-phenyl, 2-thiazolyl, and 2-oxazolyl), an alkoxy group (preferably an alkoxy group having 1 to 20 carbon atoms, and more preferably an alkoxy group having 1 to 12 carbon atoms, for example, methoxy, ethoxy, isopropyloxy, and benzyloxy), an alkenyloxy group (preferably an alkenyloxy group having 2 to 20 carbon atoms, and more preferably an alkenyloxy group having 2 to 12 carbon atoms), an alkynyloxy group (preferably an alkynyloxy group having 2 to 20 carbon atoms, and more preferably an alkynyloxy group having 2 to 12 carbon atoms), a cycloalkyloxy group (preferably a cycloalkyloxy group having 3 to 20 carbon atoms), an aryloxy group (preferably an aryloxy group having 6 to 26 carbon atoms), a heterocyclic oxy group (in a case where the heterocycle is an aromatic ring, it is also referred to a heteroaryloxy group, and the heterocyclic oxy group preferably has 2 to 20 carbon atoms), an alkoxycarbonyl group (preferably an alkoxycarbonyl group having 2 to 20 carbon atoms), a cycloalkoxycarbonyl group (preferably a cycloalkoxycarbonyl group having 4 to 20 carbon atoms), an aryloxycarbonyl group (preferably an aryloxycarbonyl group having 6 to 20 carbon atoms), and an amino group (preferably an amino group having 0 to 20 carbon atoms including an alkylamino group, an alkenylamino group, an alkynylamino group, a cycloalkylamino group, a cycloalkenylamino group, an arylamino group, and a heterocyclic amino group (in a case where the heterocycle is an aromatic ring, it is also referred to a heteroarylamino group), for example, amino, N,N-dimethylamino, N,N-diethylamino, N-ethylamino, N-allylamino, N-(2-propynyl)amino, N-cyclohexylamino, N-cyclohexenylamino, anilino, pyridylamino, imidazolylamino, benzimidazolylamino, thiazolylamino, benzothiazolylamino, and triazinylamino), a sulfamoyl group (preferably a sulfamoyl group having 0 to 20 carbon atoms, preferably an alkyl-, cycloalkyl-, or aryl-sulfamoyl group), an acyl group (preferably an acyl group having 1 to 20 carbon atoms), an acyloxy group (preferably an acyloxy group having 1 to 20 carbon atoms), a carbamoyl group (preferably a carbamoyl group having 1 to 20 carbon atoms, preferably an alkyl-, cycloalkyl-, or aryl-carbamoyl group), an acylamino group (preferably an acylamino group having 1 to 20 carbon atoms), a sulfonamido group (preferably a sulfonamido group having 0 to 20 carbon atoms, and preferably an alkyl-, cycloalkyl-, or aryl-sulfonamido group), an alkylthio group (preferably an alkylthio group having 1 to 20 carbon atoms, and more preferably an alkylthio group having 1 to 12 carbon atoms, for example, methylthio, ethylthio, isopropylthio, and benzylthio), a cycloalkylthio group (preferably a cycloalkylthio group having 3 to 20 carbon atoms), an arylthio group (preferably an arylthio group having 6 to 26 carbon atoms), a heterocyclic thio group (in a case where the heterocycle is an aromatic ring, it is also referred to a heteroarylthio group, and the heterocyclic thio group preferably has 2 to 20 carbon atoms), an alkyl-, cycloalkyl-, or aryl-sulfonyl group (preferably an alkyl-, cycloalkyl-, or aryl-sulfonyl group having 1 to 20 carbon atoms), a silyl group (preferably a silyl group having 1 to 20 carbon atoms, preferably an alkyl-, aryl-, alkoxy-, and aryloxy-substituted silyl group), a silyloxy group (preferably a silyloxy group having 1 to 20 carbon atoms, preferably an alkyl-, aryl-, alkoxy-, and aryloxy-substituted silyloxy group), a hydroxyl group, a cyano group, a nitro group, a halogen atom (for example, a fluorine atom, a chlorine atom, a bromine atom, and iodine atom), a carboxy group, a sulfo group, a phosphonyl group, a phosphoryl group, and a boric acid group.

The group selected from the substituent group T is more preferably a group other than an acidic group or a salt thereof, still more preferably an alkyl group, an alkenyl group, a cycloalkyl group, an aryl group, a heterocyclic group, an alkoxy group, a cycloalkoxy group, an aryloxy group, an alkoxycarbonyl group, a cycloalkoxycarbonyl group, an amino group, an acylamino group, a cyano group, or a halogen atom, and particularly preferably an alkyl group, an alkenyl group, a heterocyclic group, an alkoxy group, an alkoxycarbonyl group, an amino group, an acylamino group, or a cyano group.

In a case where the compound, the substituent, or the like includes an alkyl group, an alkenyl group, or the like, these may be substituted or unsubstituted. Further, in a case where the compound, the substituent, or the like includes an aryl group, a heterocyclic group, or the like, these may be a monocycle or a fused ring, and may be substituted or unsubstituted.

—Specific Examples of Metal Complex Dye—

Specific examples of the metal complex dye (1), the metal complex dye (2), the metal complex dye (2A), and the metal complex dye (6) are shown below, but the present invention is not limited to these metal complex dyes.

In the following specific examples, the metal complex dye (1), the metal complex dye (2), and the metal complex dye (2A) are shown in summary according to the structural formulae (without consideration of steric structures). Thus, in the following metal complex dye D-1, the metal complex dye (1) and the metal complex dye (2) are included.

In the following specific examples, the metal complex dye is denoted as "D-n". Here, n is a serial number of the metal complex dye.

In the following specific examples, M represents the metal ion (preferably $Ru^{2+}$). "*" in the sections of $L^1$ and $L^2$ represents a bonding moiety to $D^1$ or $D^2$, and "**" represents a bonding moiety to the pyridine ring. Further, "*" in the sections of $D^1$ and $D^2$ each represents a bonding moiety to $L^1$ or $L^2$. Further, Me represents methyl.

Specific examples of the metal complex dye (6) are not clearly represented by the following structural formulae, but the metal complex dye (6) is a metal complex dye in which a bipyridine ligand having -$L^1$-$D^1$ and -$L^2$-$D^2$ replaces a bipyridine ligand having —$COOM^1$ and —$COOM^2$ in each of the following specific examples of the metal complex dye (1), the metal complex dye (2), and the metal complex dye (2A), and thus, specific examples thereof are construed to be shown as follows.

| | | Structural formula of metal complex dye | | | |
|---|---|---|---|---|---|
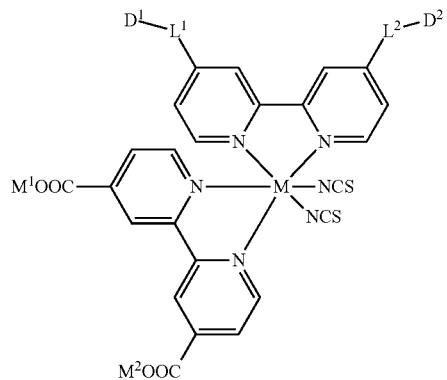
| D-n | L¹ and L² | D¹ | D² | M¹ | M² |
|---|---|---|---|---|---|
| D-1 | **—CH=CH—* | | | $H^+$, $K^+$, $Na^+$, or $TBA^+$ | $H^+$, $K^+$, $Na^+$, or $TBA^+$ |
| D-2 | **—CH=CH—* | | | $H^+$, $K^+$, $Na^+$, or $TBA^+$ | $H^+$, $K^+$, $Na^+$, or $TBA^+$ |
| D-3 | **—CH=CH—* | | | $H^+$, $K^+$, $Na^+$, or $TBA^+$ | $H^+$, $K^+$, $Na^+$, or $TBA^+$ |
| D-4 | **—CH=CH—* | | | $H^+$, $K^+$, $Na^+$, or $TBA^+$ | $H^+$, $K^+$, $Na^+$, or $TBA^+$ |

-continued
| | | | | |
|---|---|---|---|---|
| D-5 | \*\*—CH=CH—\* | 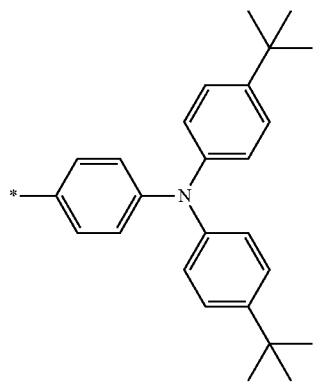 [SMILES: *c1ccc(N(c2ccc(C(C)(C)C)cc2)c2ccc(C(C)(C)C)cc2)cc1] | 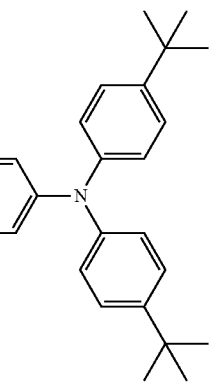 | H+, K+, Na+, or TBA+   H+, K+, Na+, or TBA+ |
| D-6 | \*\*—CH=CH—\* | 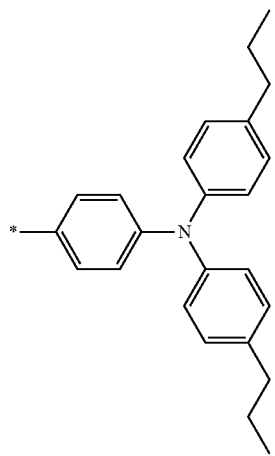 [SMILES: *c1ccc(N(c2ccc(CCC)cc2)c2ccc(CCC)cc2)cc1] | 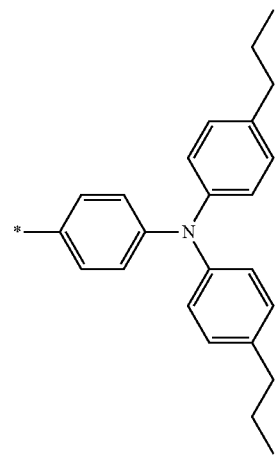 [SMILES: *c1ccc(N(c2ccc(CCC)cc2)c2ccc(CCC)cc2)cc1] | H+, K+, Na+, or TBA+   H+, K+, Na+, or TBA+ |
| D-7 | \*\*—CH=CH—\* | 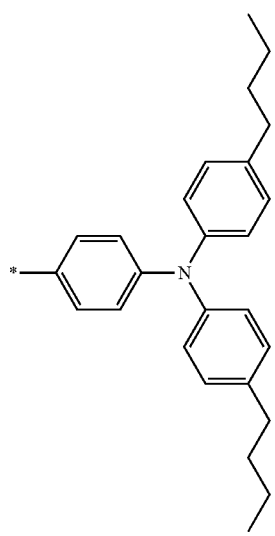 [SMILES: *c1ccc(N(c2ccc(CCCC)cc2)c2ccc(CCCC)cc2)cc1] | 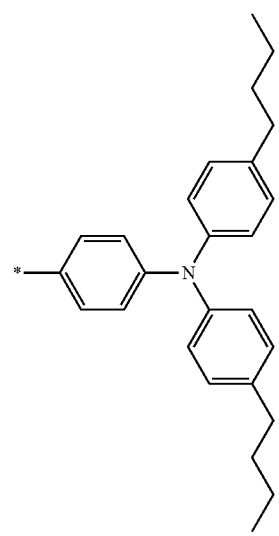 [SMILES: *c1ccc(N(c2ccc(CCCC)cc2)c2ccc(CCCC)cc2)cc1] | H+, K+, Na+, or TBA+   H+, K+, Na+, or TBA+ |

-continued
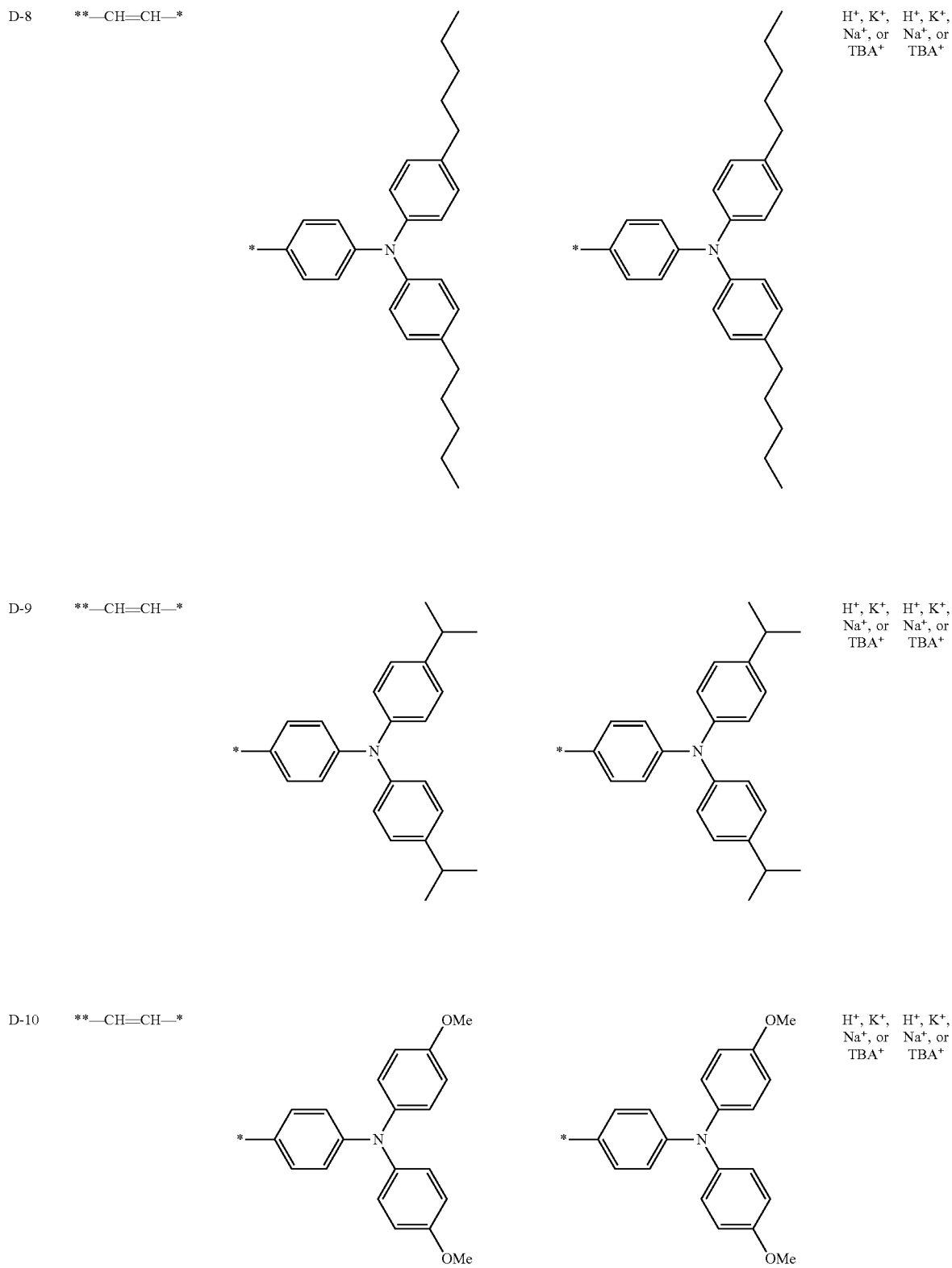

-continued
| | | | | |
|---|---|---|---|---|
| D-11 | \*\*—CH=CH—\* | 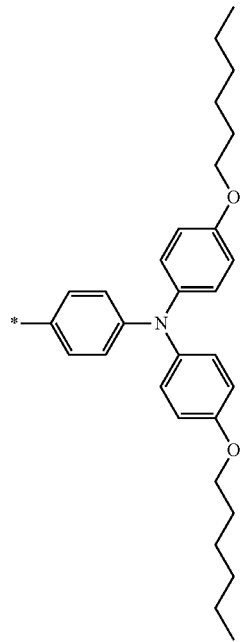 [SMILES: *c1ccc(N(c2ccc(OCCCCCC)cc2)c2ccc(OCCCCCC)cc2)cc1] | 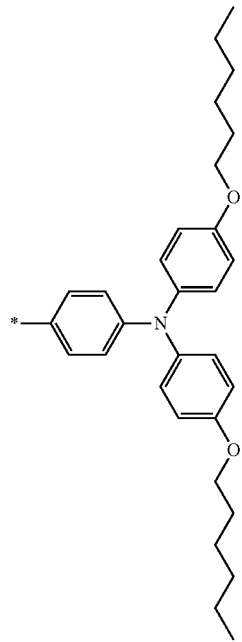 [SMILES: *c1ccc(N(c2ccc(OCCCCCC)cc2)c2ccc(OCCCCCC)cc2)cc1] | H+, K+, Na+, or TBA+    H+, K+, Na+, or TBA+ |
| D-12 | \*\*—CH=CH—\* | 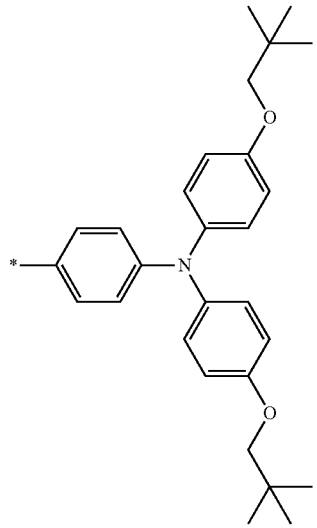 [SMILES: *c1ccc(N(c2ccc(OCC(C)(C)C)cc2)c2ccc(OCC(C)(C)C)cc2)cc1] | 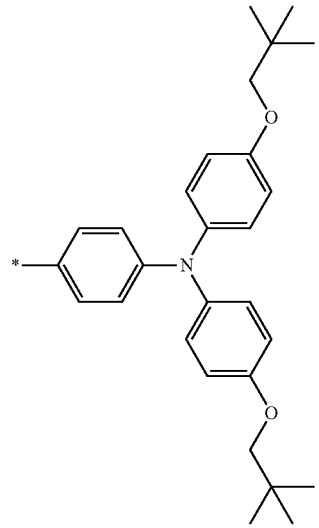 [SMILES: *c1ccc(N(c2ccc(OCC(C)(C)C)cc2)c2ccc(OCC(C)(C)C)cc2)cc1] | H+, K+, Na+, or TBA+    H+, K+, Na+, or TBA+ |
| D-13 | \*\*—CH=CH—\* | 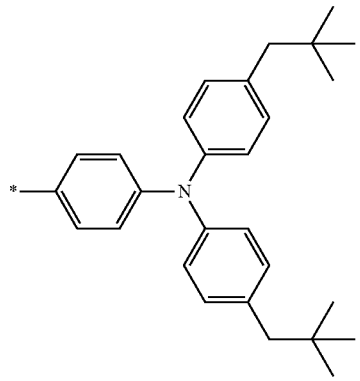 [SMILES: *c1ccc(N(c2ccc(CC(C)(C)C)cc2)c2ccc(CC(C)(C)C)cc2)cc1] | 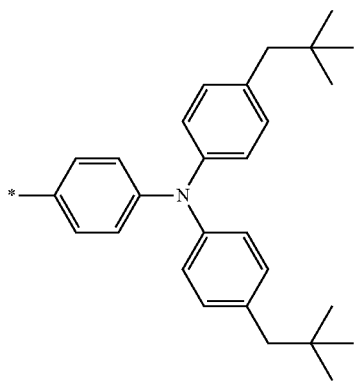 [SMILES: *c1ccc(N(c2ccc(CC(C)(C)C)cc2)c2ccc(CC(C)(C)C)cc2)cc1] | H+, K+, Na+, or TBA+    H+, K+, Na+, or TBA+ |

-continued
| | | | | |
|---|---|---|---|---|
| D-14 | **—CH=CH—* | 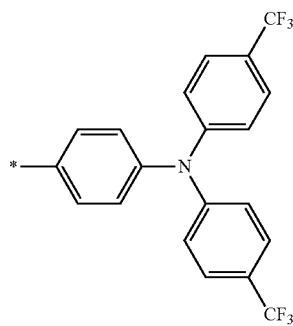 [SMILES: *c1ccc(N(c2ccc(C(F)(F)F)cc2)c2ccc(C(F)(F)F)cc2)cc1] | 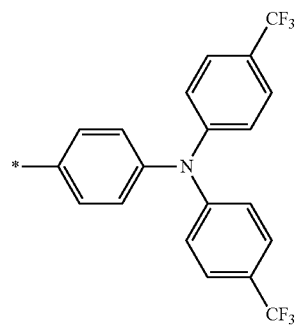 [SMILES: *c1ccc(N(c2ccc(C(F)(F)F)cc2)c2ccc(C(F)(F)F)cc2)cc1] | H+, K+, Na+, or TBA+   H+, K+, Na+, or TBA+ |
| D-15 | **—CH=CH—* | 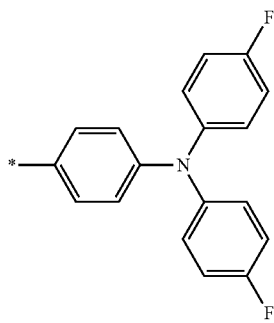 [SMILES: *c1ccc(N(c2ccc(F)cc2)c2ccc(F)cc2)cc1] | 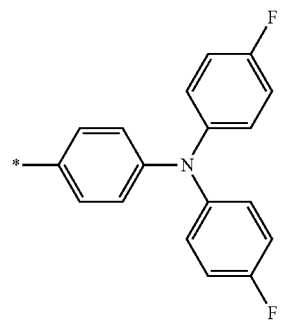 [SMILES: *c1ccc(N(c2ccc(F)cc2)c2ccc(F)cc2)cc1] | H+, K+, Na+, or TBA+   H+, K+, Na+, or TBA+ |
| D-16 | **—CH=CH—* | 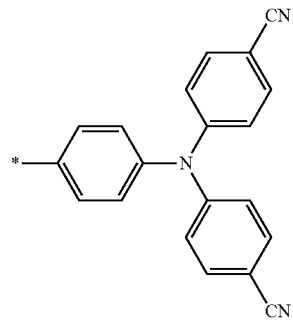 [SMILES: *c1ccc(N(c2ccc(C#N)cc2)c2ccc(C#N)cc2)cc1] | 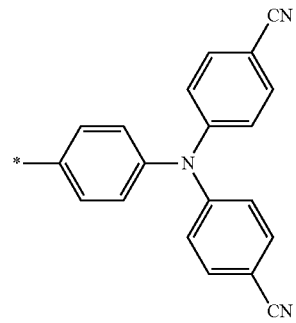 [SMILES: *c1ccc(N(c2ccc(C#N)cc2)c2ccc(C#N)cc2)cc1] | H+, K+, Na+, or TBA+   H+, K+, Na+, or TBA+ |
| D-17 | **—CH=CH—* | 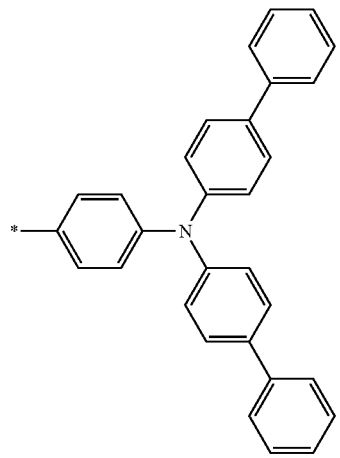 [SMILES: *c1ccc(N(c2ccc(-c3ccccc3)cc2)c2ccc(-c3ccccc3)cc2)cc1] | 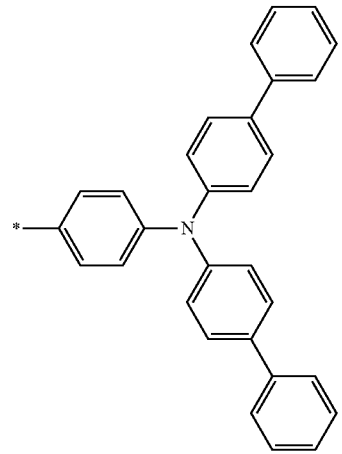 [SMILES: *c1ccc(N(c2ccc(-c3ccccc3)cc2)c2ccc(-c3ccccc3)cc2)cc1] | H+, K+, Na+, or TBA+   H+, K+, Na+, or TBA+ |

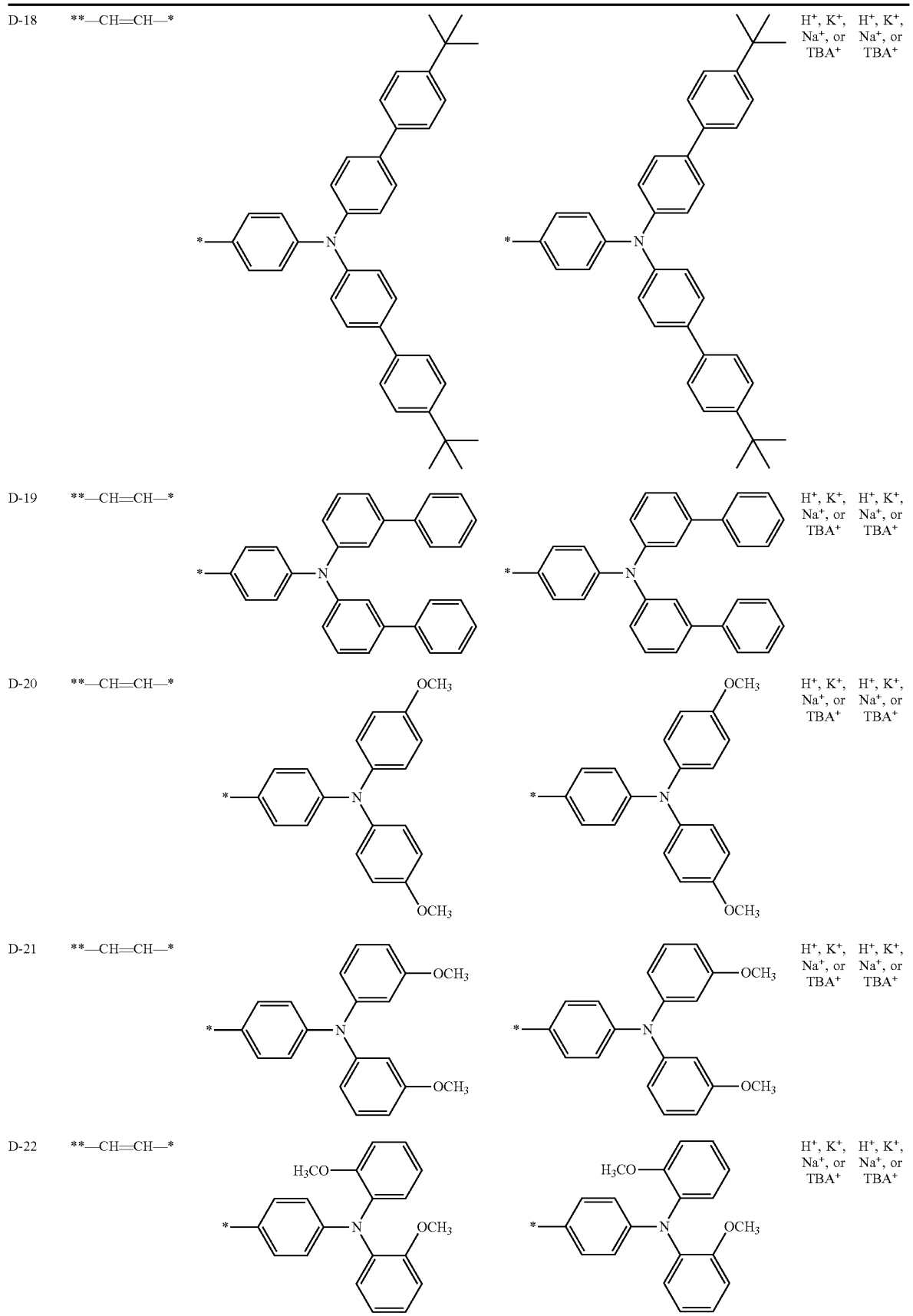

| | | | | |
|---|---|---|---|---|
| D-23 | **—CH=CH—* | 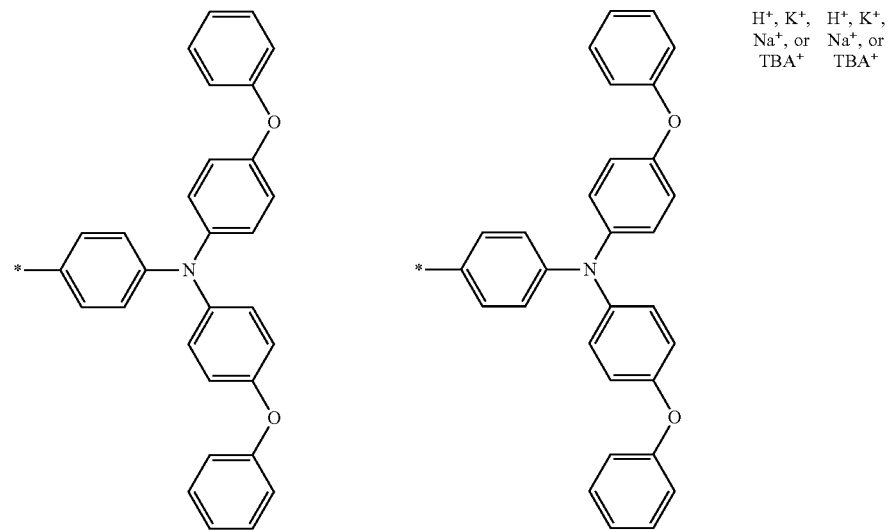 | | H+, K+, Na+, or TBA+   H+, K+, Na+, or TBA+ |
| D-24 | **—CH=CH—* | 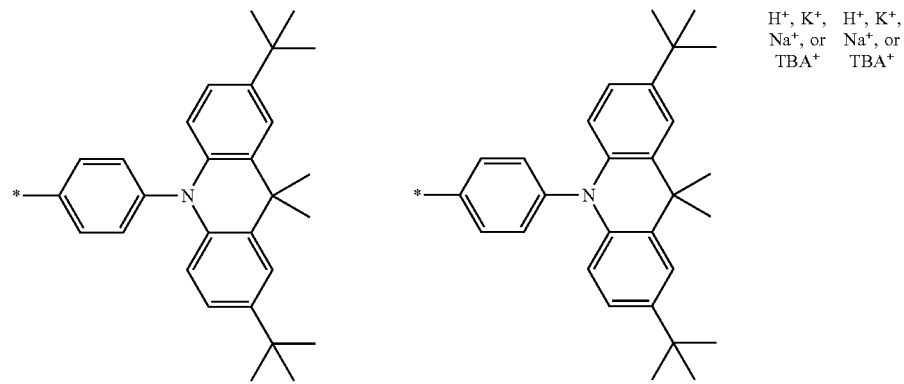 | | H+, K+, Na+, or TBA+   H+, K+, Na+, or TBA+ |
| D-25 | **—CH=CH—* | 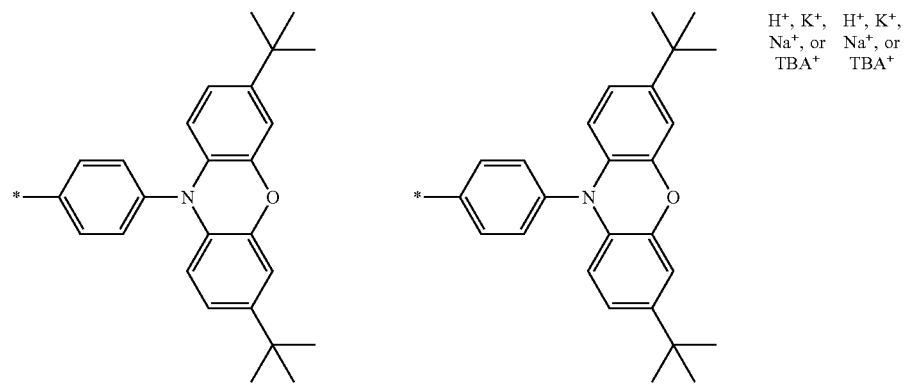 | | H+, K+, Na+, or TBA+   H+, K+, Na+, or TBA+ |

-continued
| | | | | |
|---|---|---|---|---|
| D-26 | **—CH=CH—* | 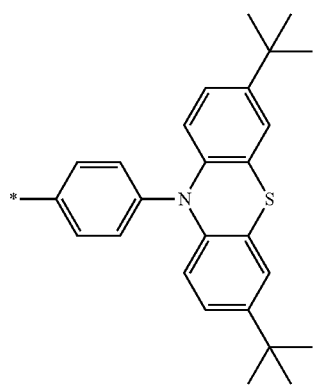 [SMILES: *c1ccc(N2c3ccc(C(C)(C)C)cc3Sc3cc(C(C)(C)C)ccc32)cc1] | 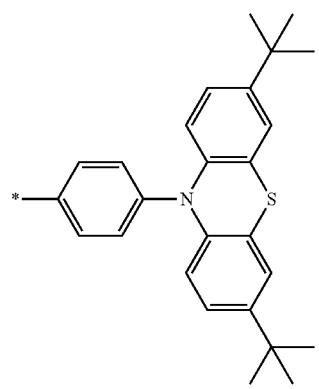 [SMILES: *c1ccc(N2c3ccc(C(C)(C)C)cc3Sc3cc(C(C)(C)C)ccc32)cc1] | H+, K+, Na+, or TBA+   H+, K+, Na+, or TBA+ |
| D-27 | **—CH=CH—* | 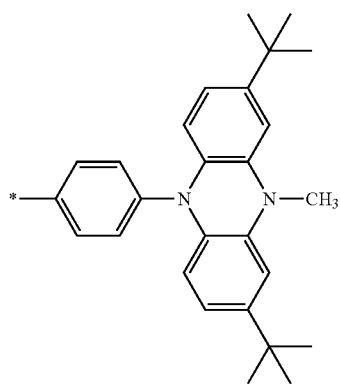 [SMILES: *c1ccc(N2c3ccc(C(C)(C)C)cc3N(C)c3cc(C(C)(C)C)ccc32)cc1] | 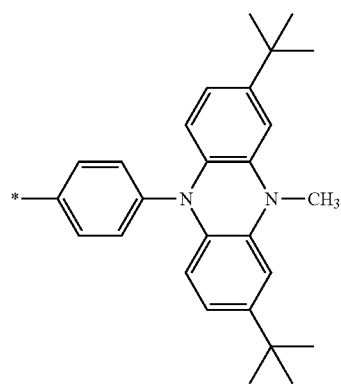 [SMILES: *c1ccc(N2c3ccc(C(C)(C)C)cc3N(C)c3cc(C(C)(C)C)ccc32)cc1] | H+, K+, Na+, or TBA+   H+, K+, Na+, or TBA+ |
| D-28 | **—CH=CH—* | 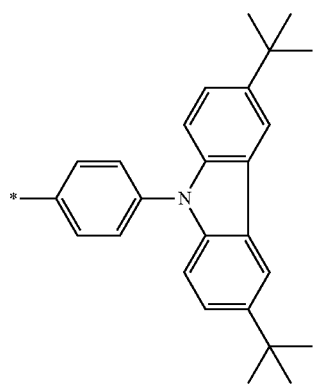 [SMILES: *c1ccc(-n2c3ccc(C(C)(C)C)cc3c3cc(C(C)(C)C)ccc32)cc1] | 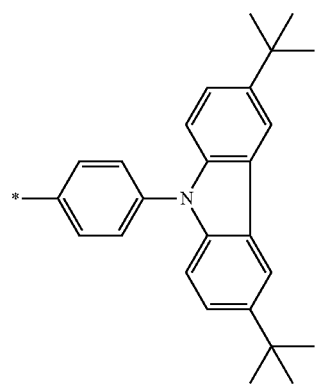 [SMILES: *c1ccc(-n2c3ccc(C(C)(C)C)cc3c3cc(C(C)(C)C)ccc32)cc1] | H+, K+, Na+, or TBA+   H+, K+, Na+, or TBA+ |
| D-29 | **—CH=CH—* | 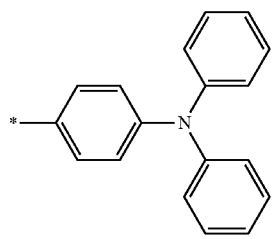 [SMILES: *c1ccc(N(c2ccccc2)c2ccccc2)cc1] | 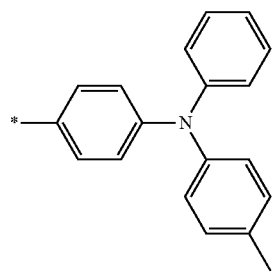 [SMILES: *c1ccc(N(c2ccccc2)c2ccc(C)cc2)cc1] | H+, K+, Na+, or TBA+   H+, K+, Na+, or TBA+ |

-continued
| | | | | |
|---|---|---|---|---|
| D-30 | **—CH=CH—* | 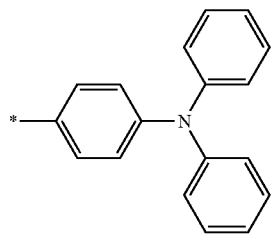 [SMILES: *c1ccc(N(c2ccccc2)c2ccccc2)cc1] | 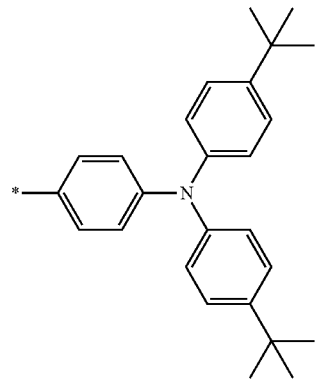 [SMILES: *c1ccc(N(c2ccc(C(C)(C)C)cc2)c2ccc(C(C)(C)C)cc2)cc1] | H+, K+, Na+, or TBA+  H+, K+, Na+, or TBA+ |
| D-31 | **—CH=CH—* | 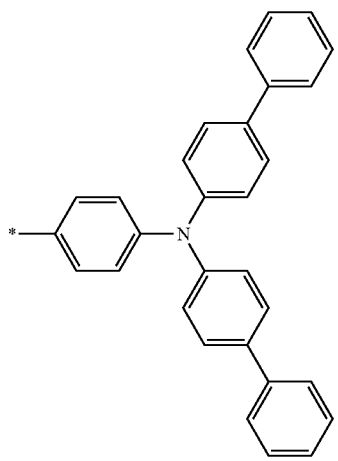 [SMILES: *c1ccc(N(c2ccc(-c3ccccc3)cc2)c2ccc(-c3ccccc3)cc2)cc1] | 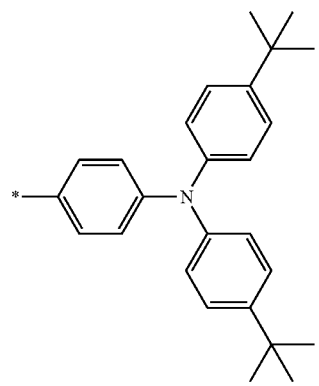 [SMILES: *c1ccc(N(c2ccc(C(C)(C)C)cc2)c2ccc(C(C)(C)C)cc2)cc1] | H+, K+, Na+, or TBA+  H+, K+, Na+, or TBA+ |
| D-32 | **—CH=CH—* | 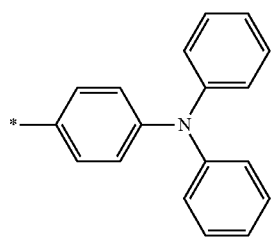 [SMILES: *c1ccc(N(c2ccccc2)c2ccccc2)cc1] | 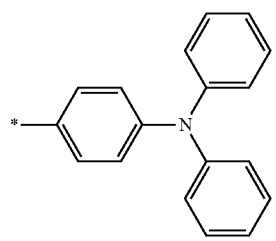 [SMILES: *c1ccc(N(c2ccccc2)c2ccccc2)cc1] | H+, K+, Na+, or TBA+  H+, K+, Na+, or TBA+ |
| D-33 | **—CH=CH—* | 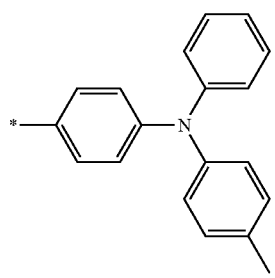 [SMILES: *c1ccc(N(c2ccccc2)c2ccc(C)cc2)cc1] | 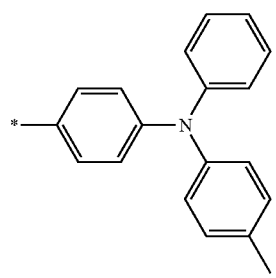 [SMILES: *c1ccc(N(c2ccccc2)c2ccc(C)cc2)cc1] | H+, K+, Na+, or TBA+  H+, K+, Na+, or TBA+ |

-continued
| | | | | |
|---|---|---|---|---|
| D-34 | **—CH=CH—* | 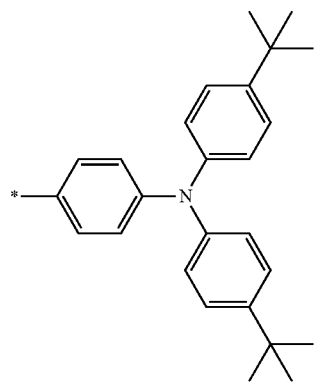 [SMILES: *c1ccc(N(c2ccc(C(C)(C)C)cc2)c2ccc(C(C)(C)C)cc2)cc1] | 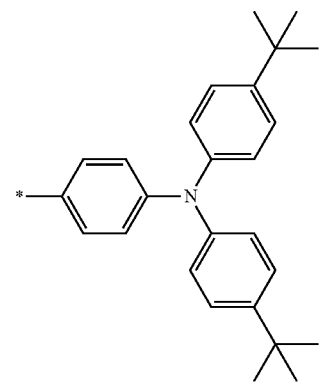 [SMILES: *c1ccc(N(c2ccc(C(C)(C)C)cc2)c2ccc(C(C)(C)C)cc2)cc1] | H⁺, K⁺, Na⁺, or TBA⁺   H⁺, K⁺, Na⁺, or TBA⁺ |
| D-35 | **—CH=CH—* | 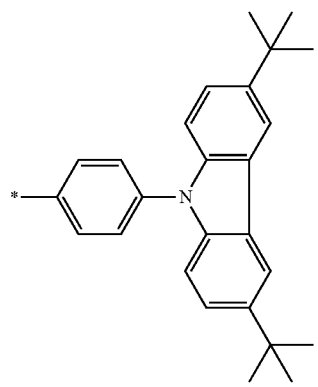 [SMILES: *c1ccc(-n2c3ccc(C(C)(C)C)cc3c3cc(C(C)(C)C)ccc32)cc1] | 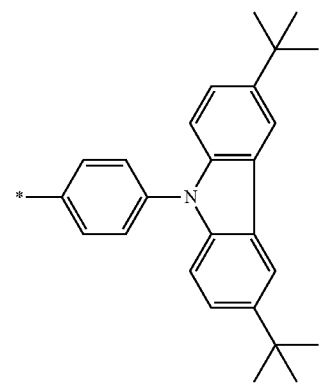 [SMILES: *c1ccc(-n2c3ccc(C(C)(C)C)cc3c3cc(C(C)(C)C)ccc32)cc1] | H⁺, K⁺, Na⁺, or TBA⁺   H⁺, K⁺, Na⁺, or TBA⁺ |
| D-36 | **—CH=CH—* | 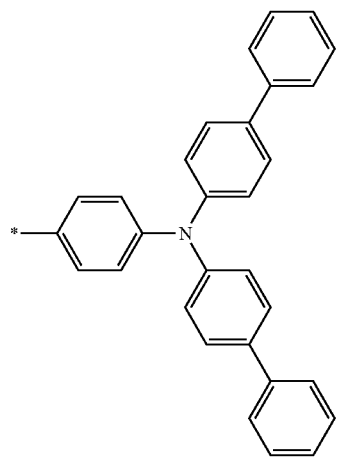 [SMILES: *c1ccc(N(c2ccc(-c3ccccc3)cc2)c2ccc(-c3ccccc3)cc2)cc1] | 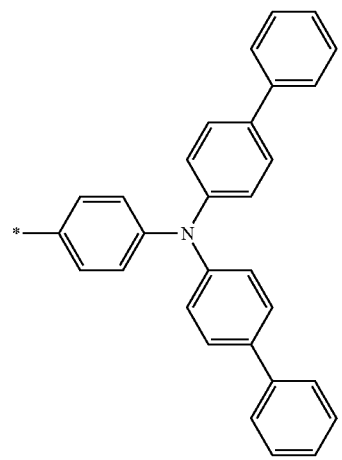 [SMILES: *c1ccc(N(c2ccc(-c3ccccc3)cc2)c2ccc(-c3ccccc3)cc2)cc1] | H⁺, K⁺, Na⁺, or TBA⁺   H⁺, K⁺, Na⁺, or TBA⁺ |
| D-37 | **—CH=CH—* | 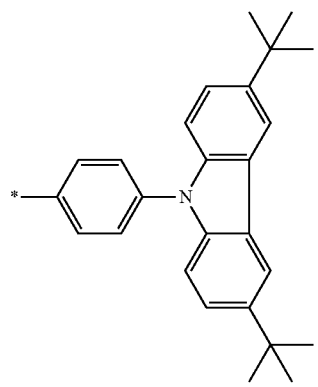 [SMILES: *c1ccc(-n2c3ccc(C(C)(C)C)cc3c3cc(C(C)(C)C)ccc32)cc1] | 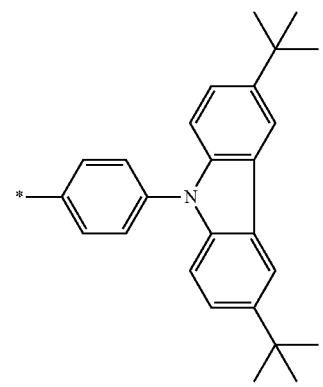 [SMILES: *c1ccc(-n2c3ccc(C(C)(C)C)cc3c3cc(C(C)(C)C)ccc32)cc1] | H⁺, K⁺, Na⁺, or TBA⁺   H⁺, K⁺, Na⁺, or TBA⁺ |

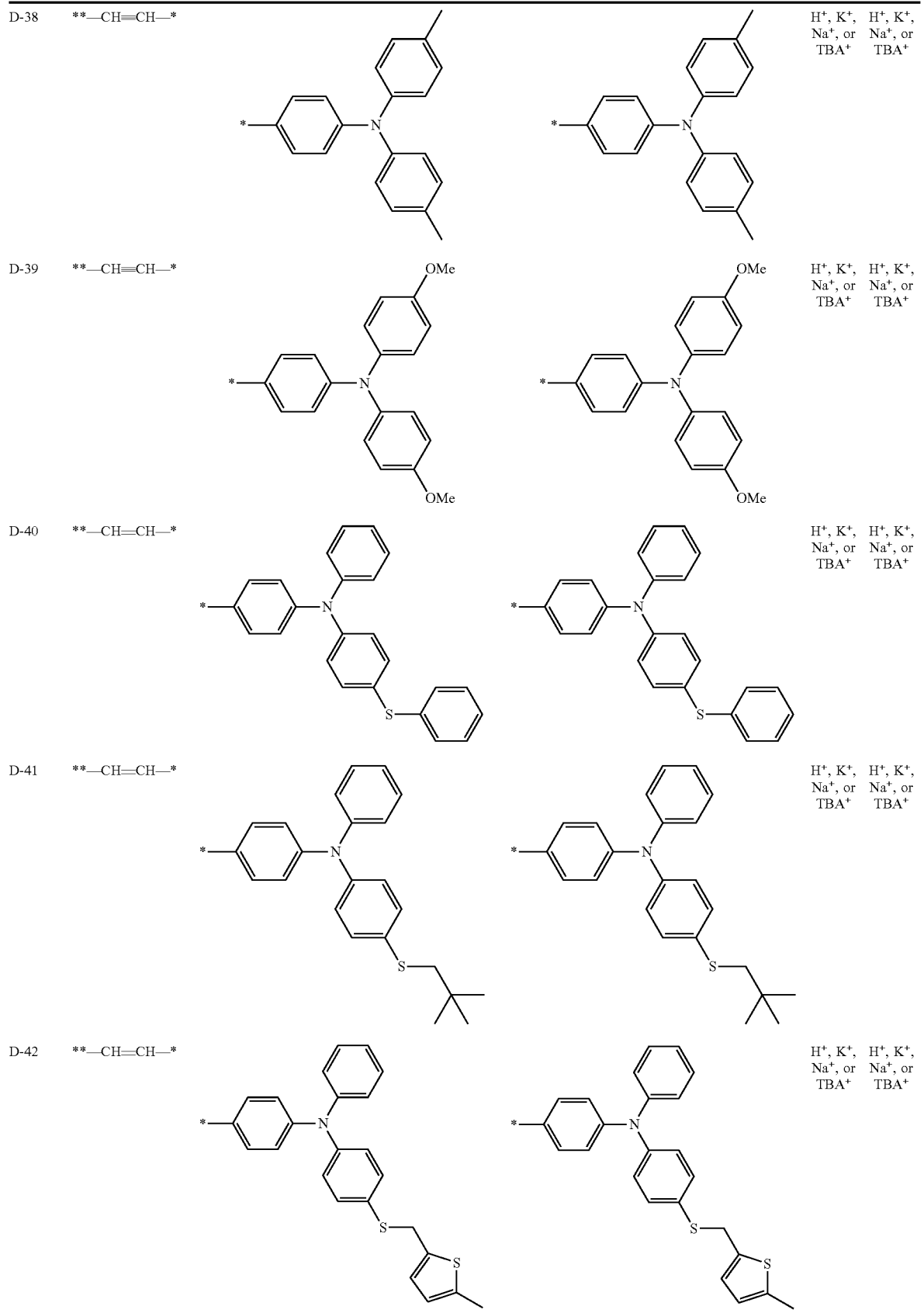

-continued
| | | | | |
|---|---|---|---|---|
| D-43 | **—CH=CH—* | 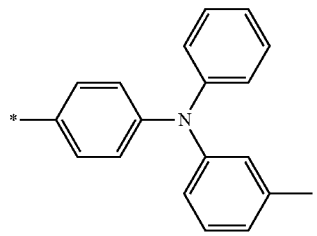 [SMILES: *c1ccc(N(c2ccccc2)c2cccc(C)c2)cc1] | 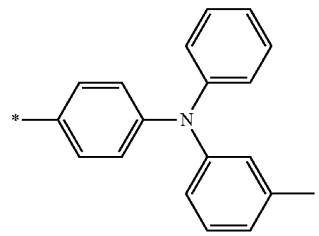 [SMILES: *c1ccc(N(c2ccccc2)c2cccc(C)c2)cc1] | H⁺, K⁺, Na⁺, or TBA⁺   H⁺, K⁺, Na⁺, or TBA⁺ |
| D-44 | **—CH=CH—* | 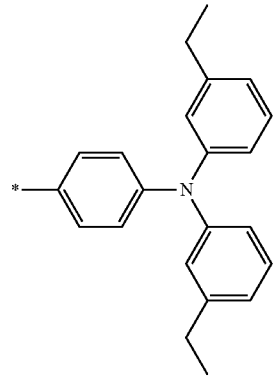 [SMILES: *c1ccc(N(c2cccc(CC)c2)c2cccc(CC)c2)cc1] | 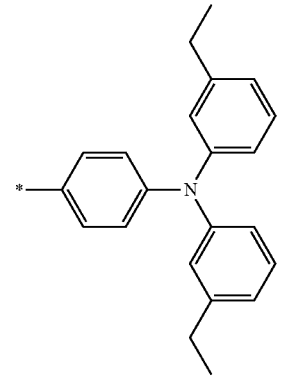 [SMILES: *c1ccc(N(c2cccc(CC)c2)c2cccc(CC)c2)cc1] | H⁺, K⁺, Na⁺, or TBA⁺   H⁺, K⁺, Na⁺, or TBA⁺ |
| D-45 | **—CH=CH—* | 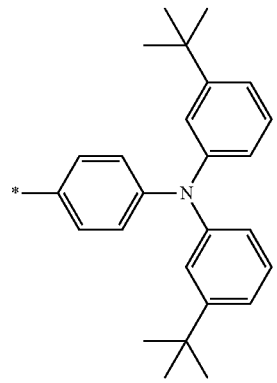 [SMILES: *c1ccc(N(c2cccc(C(C)(C)C)c2)c2cccc(C(C)(C)C)c2)cc1] | 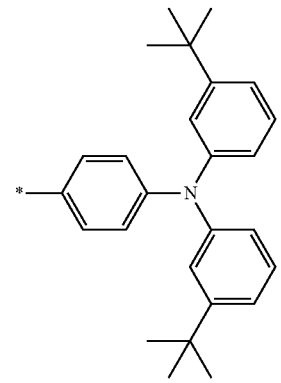 [SMILES: *c1ccc(N(c2cccc(C(C)(C)C)c2)c2cccc(C(C)(C)C)c2)cc1] | H⁺, K⁺, Na⁺, or TBA⁺   H⁺, K⁺, Na⁺, or TBA⁺ |
| D-46 | **—CH=CH—* | 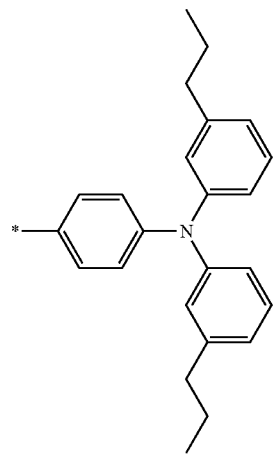 [SMILES: *c1ccc(N(c2cccc(CCC)c2)c2cccc(CCC)c2)cc1] | 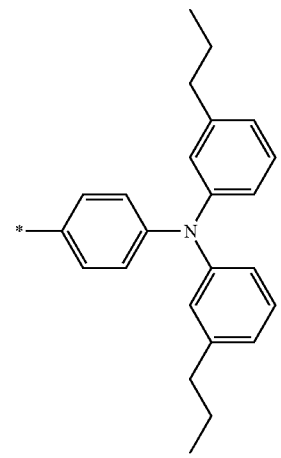 [SMILES: *c1ccc(N(c2cccc(CCC)c2)c2cccc(CCC)c2)cc1] | H⁺, K⁺, Na⁺, or TBA⁺   H⁺, K⁺, Na⁺, or TBA⁺ |

-continued
| | | | | |
|---|---|---|---|---|
| D-47 | **—CH=CH—* | 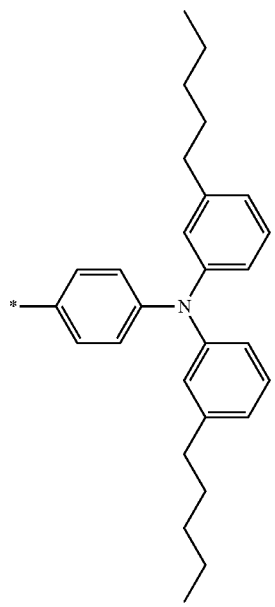 [SMILES: *c1ccc(N(c2cccc(CCCCC)c2)c2cccc(CCCCC)c2)cc1] | 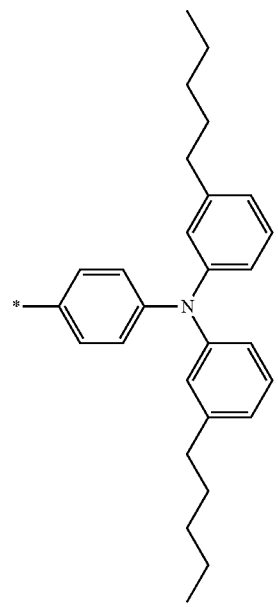 [SMILES: *c1ccc(N(c2cccc(CCCCC)c2)c2cccc(CCCCC)c2)cc1] | H+, K+, Na+, or TBA+   H+, K+, Na+, or TBA+ |
| D-48 | **—CH=CH—* | 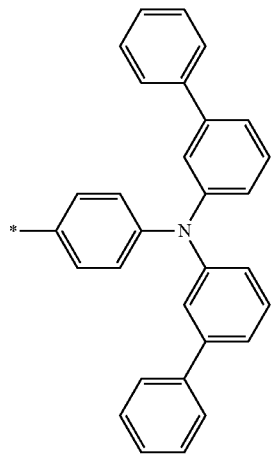 [SMILES: *c1ccc(N(c2cccc(-c3ccccc3)c2)c2cccc(-c3ccccc3)c2)cc1] | 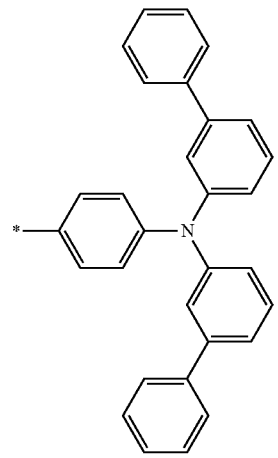 [SMILES: *c1ccc(N(c2cccc(-c3ccccc3)c2)c2cccc(-c3ccccc3)c2)cc1] | H+, K+, Na+, or TBA+   H+, K+, Na+, or TBA+ |
| D-49 | **—CH=CH—* | 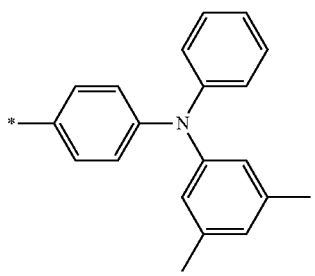 [SMILES: *c1ccc(N(c2ccccc2)c2cc(C)cc(C)c2)cc1] | 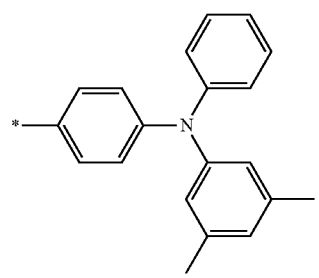 [SMILES: *c1ccc(N(c2ccccc2)c2cc(C)cc(C)c2)cc1] | H+, K+, Na+, or TBA+   H+, K+, Na+, or TBA+ |

-continued
| | | | | | |
|---|---|---|---|---|---|
| D-50 | **—CH=CH—* | 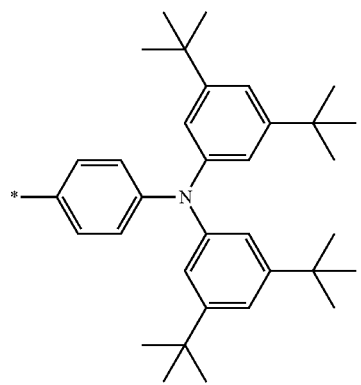 [SMILES: *c1ccc(N(c2cc(C(C)(C)C)cc(C(C)(C)C)c2)c2cc(C(C)(C)C)cc(C(C)(C)C)c2)cc1] | 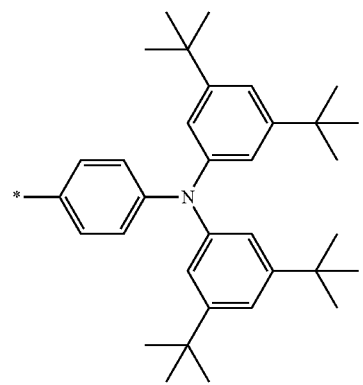 [SMILES: *c1ccc(N(c2cc(C(C)(C)C)cc(C(C)(C)C)c2)c2cc(C(C)(C)C)cc(C(C)(C)C)c2)cc1] | H+, K+, Na+, or TBA+ | H+, K+, Na+, or TBA+ |
| D-51 | **—CH=CH—* | 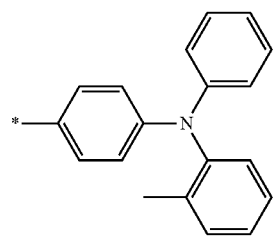 [SMILES: *c1ccc(N(c2ccccc2)c2ccccc2C)cc1] | 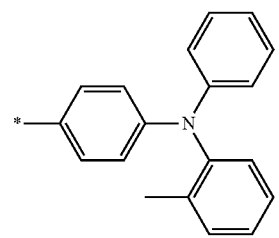 [SMILES: *c1ccc(N(c2ccccc2)c2ccccc2C)cc1] | H+, K+, Na+, or TBA+ | H+, K+, Na+, or TBA+ |
| D-52 | **—CH=CH—* | 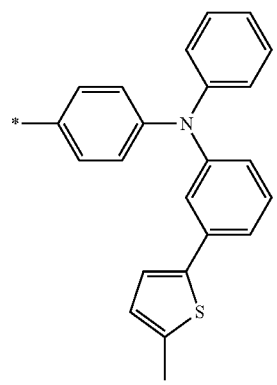 [SMILES: *c1ccc(N(c2ccccc2)c2cccc(-c3ccc(C)s3)c2)cc1] | 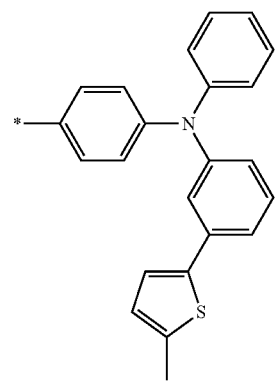 [SMILES: *c1ccc(N(c2ccccc2)c2cccc(-c3ccc(C)s3)c2)cc1] | H+, K+, Na+, or TBA+ | H+, K+, Na+, or TBA+ |

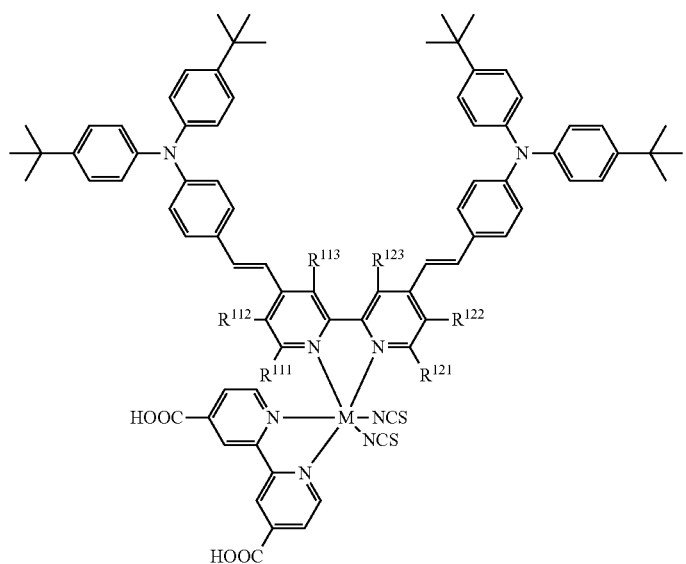
| Metal complex dye | $R^{111}$ | $R^{112}$ | $R^{113}$ | $R^{121}$ | $R^{122}$ | $R^{123}$ |
|---|---|---|---|---|---|---|
| D-53 | H | Me | H | H | H | H |
| D-54 | H | Ph | H | H | H | H |
| D-55 | H | Me | H | H | Ph | H |
| D-56 | H | Me | H | H | Me | H |
| D-57 | H | OMe | H | H | OMe | H |
| D-58 | H | Ph | H | H | Ph | H |
| D-59 | H | SMe | H | H | SMe | H |
| D-60 | H | *–(2,5-thienyl)–Me | H | H | *–(2,5-thienyl)–Me | H |
| D-61 | H | NMe$_2$ | H | H | NMe$_2$ | H |
| D-62 | H | F | H | H | F | H |
| D-63 | H | F | H | H | F | H |
| D-64 | F | H | H | F | H | H |
| D-65 | F | F | H | F | F | H |
| D-66 | H | H | F | F | H | F |
| D-67 | H | Cl | H | H | Cl | H |
| D-68 | H | Br | H | H | Br | H |
| D-69 | H | I | H | H | I | H |

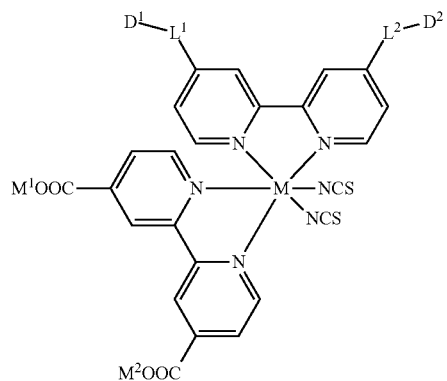

| D-n | L¹ and L² | D¹ | D² | M¹ | M² |
|---|---|---|---|---|---|
| D-70 | **—CH=CH—* | *-C₆H₄-N(CH₃)₂ | *-C₆H₄-N(CH₃)₂ | H⁺, K⁺, Na⁺, or TBA⁺ | H⁺, K⁺, Na⁺, or TBA⁺ |
| D-71 | **—CH=CH—* | *-C₆H₄-N(n-hexyl)₂ | *-C₆H₄-N(n-hexyl)₂ | H⁺, K⁺, Na⁺, or TBA⁺ | H⁺, K⁺, Na⁺, or TBA⁺ |
| D-72 | **—CH=CH—* | *-C₆H₄-OMe | *-C₆H₄-OMe | H⁺, K⁺, Na⁺, or TBA⁺ | H⁺, K⁺, Na⁺, or TBA⁺ |
| D-73 | **—CH=CH—* | *-C₆H₄-tBu | *-C₆H₄-tBu | H⁺, K⁺, Na⁺, or TBA⁺ | H⁺, K⁺, Na⁺, or TBA⁺ |
| D-74 | **—CH=CH—* | *-3,5-dimethylphenyl | *-3,5-dimethylphenyl | H⁺, K⁺, Na⁺, or TBA⁺ | H⁺, K⁺, Na⁺, or TBA⁺ |
| D-75 | **—CH=CH—* | *-(5-hexylthiophen-2-yl) | *-(5-hexylthiophen-2-yl) | H⁺, K⁺, Na⁺, or TBA⁺ | H⁺, K⁺, Na⁺, or TBA⁺ |
| D-76 | **—CH=CH—* | *-(5'-hexyl-2,2'-bithiophen-5-yl) | *-(5'-hexyl-2,2'-bithiophen-5-yl) | H⁺, K⁺, Na⁺, or TBA⁺ | H⁺, K⁺, Na⁺, or TBA⁺ |

-continued

| | | | | |
|---|---|---|---|---|
| D-77 | **—CH=CH—* | 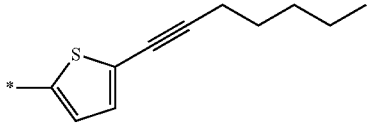 [SMILES: *c1ccc(C#CCCCCC)s1] |  | H+, K+, Na+, or TBA+    H+, K+, Na+, or TBA+ |
| D-78 | **—CH=CH—* | 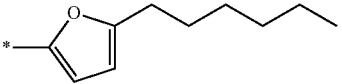 | 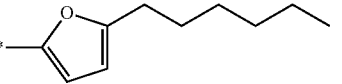 | H+, K+, Na+, or TBA+    H+, K+, Na+, or TBA+ |
| D-79 | Single bond | 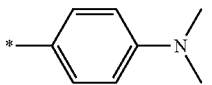 [SMILES: *c1ccc(N(C)C)cc1] | 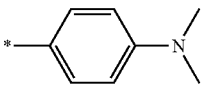 [SMILES: *c1ccc(N(C)C)cc1] | H+, K+, Na+, or TBA+    H+, K+, Na+, or TBA+ |
| D-79 | Single bond | 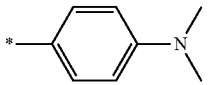 | 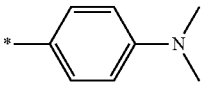 | H+, K+, Na+, or TBA+    H+, K+, Na+, or TBA+ |
| D-80 | Single bond | 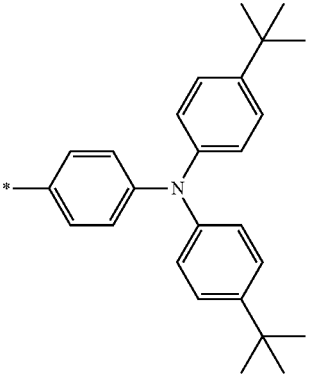 [SMILES: *c1ccc(N(c2ccc(C(C)(C)C)cc2)c2ccc(C(C)(C)C)cc2)cc1] | 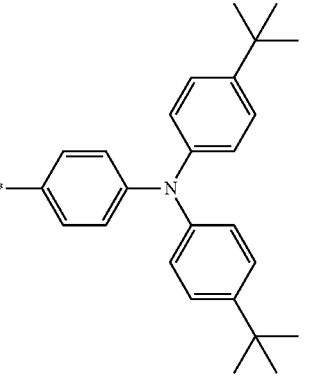 | H+, K+, Na+, or TBA+    H+, K+, Na+, or TBA+ |
| D-81 | Single bond | 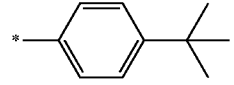 [SMILES: *c1ccc(C(C)(C)C)cc1] | 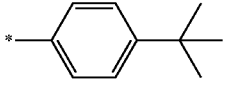 [SMILES: *c1ccc(C(C)(C)C)cc1] | H+, K+, Na+, or TBA+    H+, K+, Na+, or TBA+ |
| D-82 | Single bond | 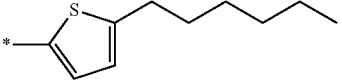 [SMILES: *c1ccc(CCCCCC)s1] | 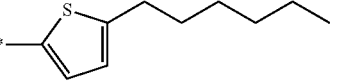 | H+, K+, Na+, or TBA+    H+, K+, Na+, or TBA+ |
| D-83 | Single bond | 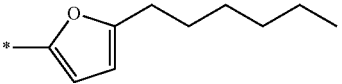 | 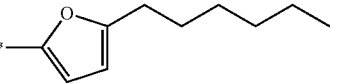 | H+, K+, Na+, or TBA+    H+, K+, Na+, or TBA+ |
| D-84 | **—CH=CH—* | 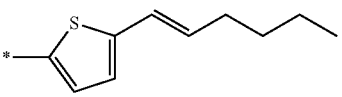 [SMILES: *c1ccc(/C=C/CCCC)s1] | 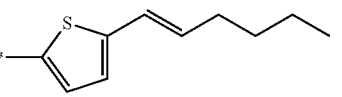 | H+, K+, Na+, or TBA+    H+, K+, Na+, or TBA+ |
| D-85 | **—CH=CH—* | 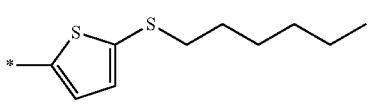 [SMILES: *c1ccc(SCCCCCC)s1] | 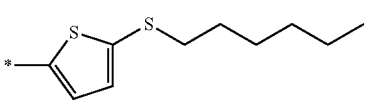 [SMILES: *c1ccc(SCCCCCC)s1] | H+, K+, Na+, or TBA+    H+, K+, Na+, or TBA+ |

-continued
| | | | | | |
|---|---|---|---|---|---|
| D-86 | **—CH=CH—* | 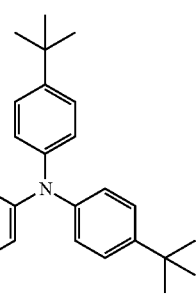 | 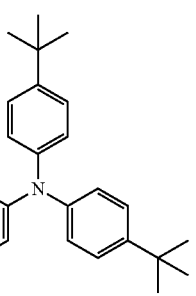 | H+, K+, Na+, or TBA+ | H+, K+, Na+, or TBA+ |
| D-87 | **—CH=CH—* | 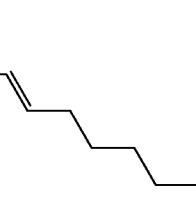 | 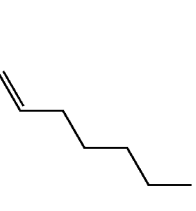 | H+, K+, Na+, or TBA+ | H+, K+, Na+, or TBA+ |
| D-88 | **—CH=CH—* | 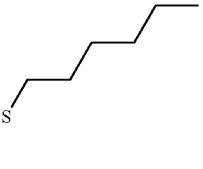 | 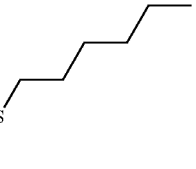 | H+, K+, Na+, or TBA+ | H+, K+, Na+, or TBA+ |
| D-89 | **—CH=CH—* | 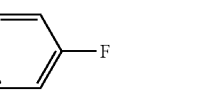 | 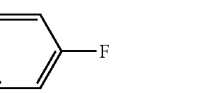 | H+, K+, Na+, or TBA+ | H+, K+, Na+, or TBA+ |
| D-90 | Single bond | 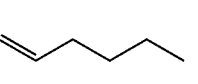 | 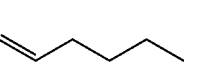 | H+, K+, Na+, or TBA+ | H+, K+, Na+, or TBA+ |
| D-91 | Single bond | 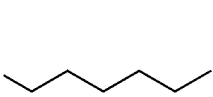 | 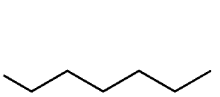 | H+, K+, Na+, or TBA+ | H+, K+, Na+, or TBA+ |
| D-92 | Single bond | 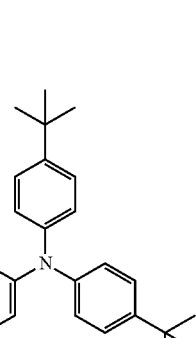 | 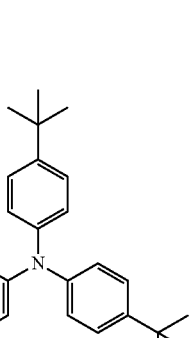 | H+, K+, Na+, or TBA+ | H+, K+, Na+, or TBA+ |
| D-93 | Single bond |  |  | H+, K+, Na+, or TBA+ | H+, K+, Na+, or TBA+ |

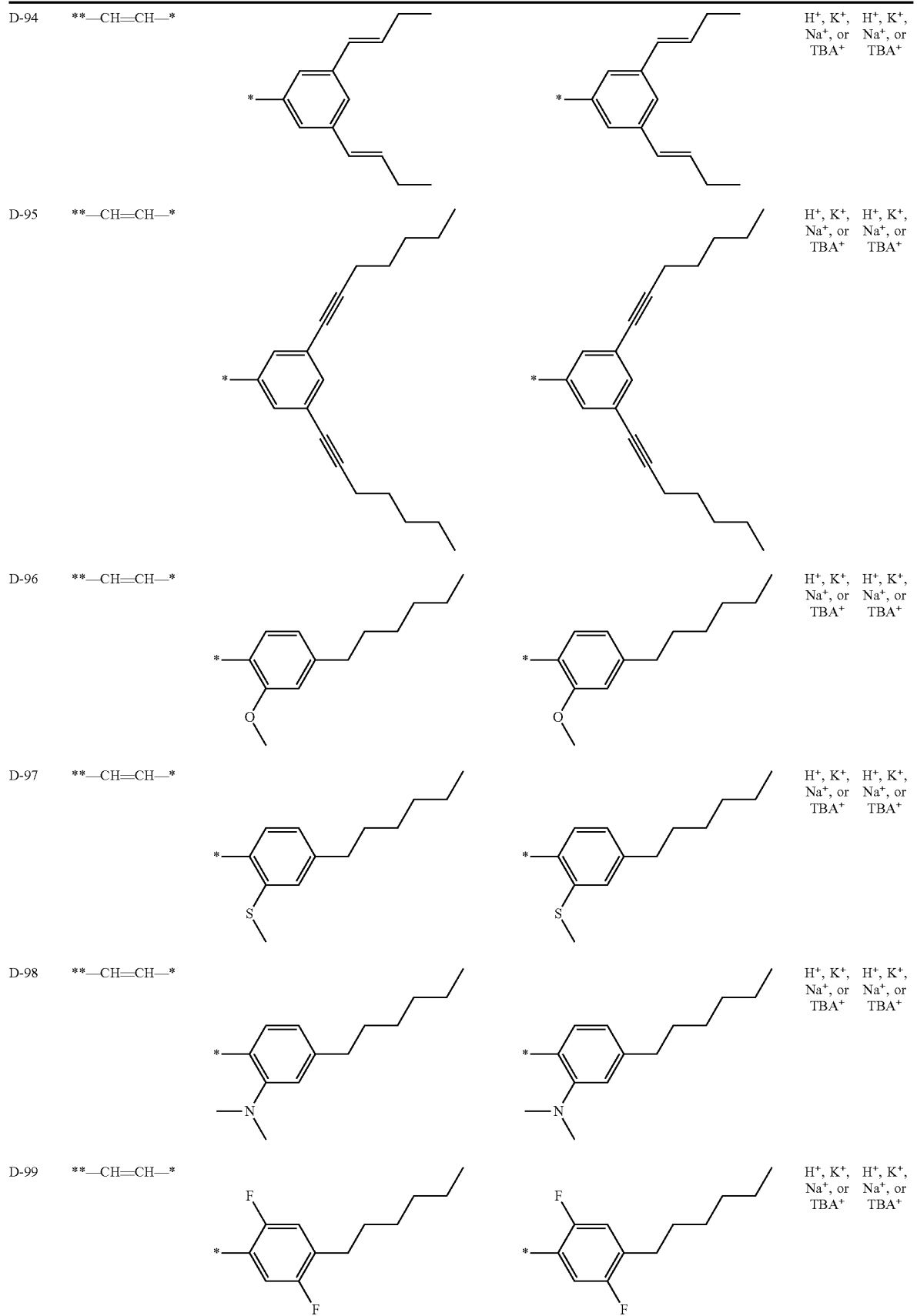

-continued
| | | | | |
|---|---|---|---|---|
| D-100 | **—CH=CH—* | 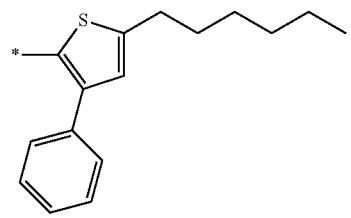 [SMILES: *c1sc(CCCCCC)cc1-c1ccccc1] | 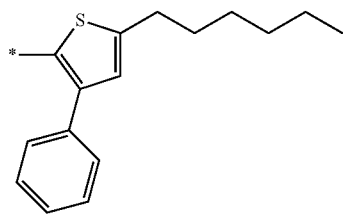 [SMILES: *c1sc(CCCCCC)cc1-c1ccccc1] | H+, K+, Na+, or TBA+   H+, K+, Na+, or TBA+ |
| D-101 | **—CH=CH—* | 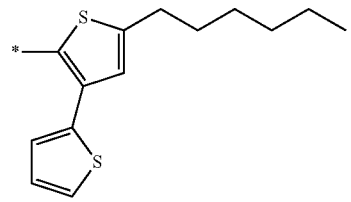 [SMILES: *c1sc(CCCCCC)cc1-c1cccs1] | 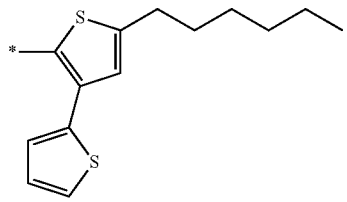 [SMILES: *c1sc(CCCCCC)cc1-c1cccs1] | H+, K+, Na+, or TBA+   H+, K+, Na+, or TBA+ |
| D-102 | **—CH=CH—* | 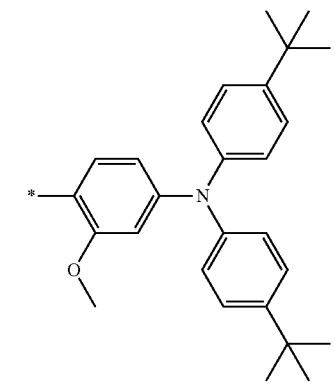 [SMILES: *c1ccc(N(c2ccc(C(C)(C)C)cc2)c2ccc(C(C)(C)C)cc2)cc1OC] | 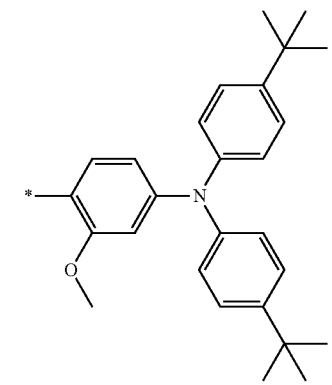 [SMILES: *c1ccc(N(c2ccc(C(C)(C)C)cc2)c2ccc(C(C)(C)C)cc2)cc1OC] | H+, K+, Na+, or TBA+   H+, K+, Na+, or TBA+ |
| D-103 | **—CH=CH—* | 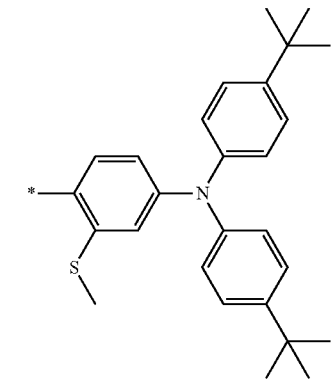 [SMILES: *c1ccc(N(c2ccc(C(C)(C)C)cc2)c2ccc(C(C)(C)C)cc2)cc1SC] | 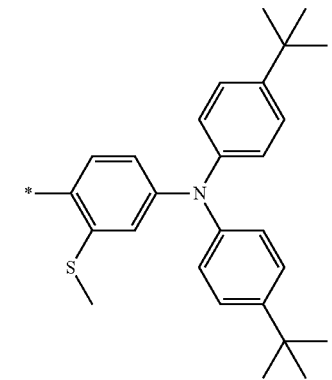 [SMILES: *c1ccc(N(c2ccc(C(C)(C)C)cc2)c2ccc(C(C)(C)C)cc2)cc1SC] | H+, K+, Na+, or TBA+   H+, K+, Na+, or TBA+ |
| D-104 | **—CH=CH—* | 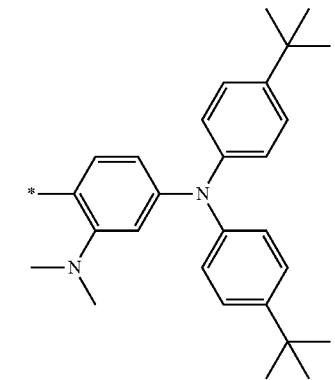 [SMILES: *c1ccc(N(c2ccc(C(C)(C)C)cc2)c2ccc(C(C)(C)C)cc2)cc1N(C)C] | 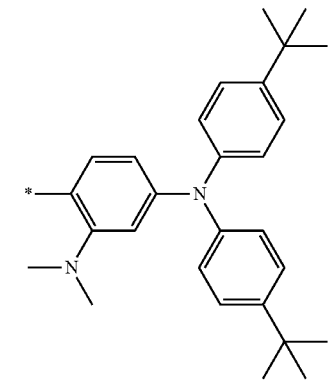 [SMILES: *c1ccc(N(c2ccc(C(C)(C)C)cc2)c2ccc(C(C)(C)C)cc2)cc1N(C)C] | H+, K+, Na+, or TBA+   H+, K+, Na+, or TBA+ |

-continued
| | | | | |
|---|---|---|---|---|
| D-105 | **—CH=CH—* | 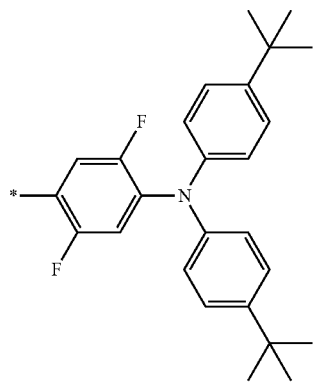 [SMILES: *c1cc(F)c(N(c2ccc(C(C)(C)C)cc2)c2ccc(C(C)(C)C)cc2)cc1F] | 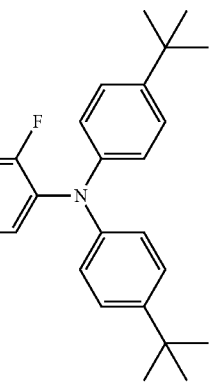 | H+, K+, Na+, or TBA+   H+, K+, Na+, or TBA+ |
| D-106 | **—CH=CH—* | 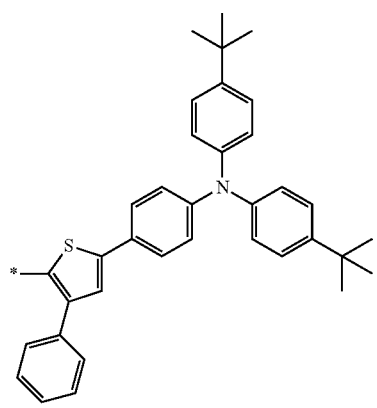 [SMILES: *c1sc(-c2ccc(N(c3ccc(C(C)(C)C)cc3)c3ccc(C(C)(C)C)cc3)cc2)cc1-c1ccccc1] | 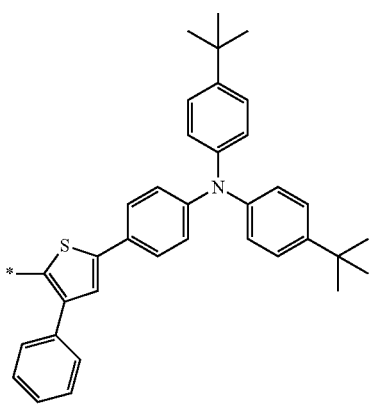 [SMILES: *c1sc(-c2ccc(N(c3ccc(C(C)(C)C)cc3)c3ccc(C(C)(C)C)cc3)cc2)cc1-c1ccccc1] | H+, K+, Na+, or TBA+   H+, K+, Na+, or TBA+ |
| D-107 | **—CH=CH—* | 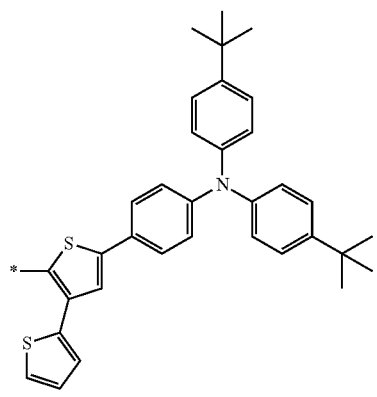 [SMILES: *c1sc(-c2ccc(N(c3ccc(C(C)(C)C)cc3)c3ccc(C(C)(C)C)cc3)cc2)cc1-c1cccs1] | 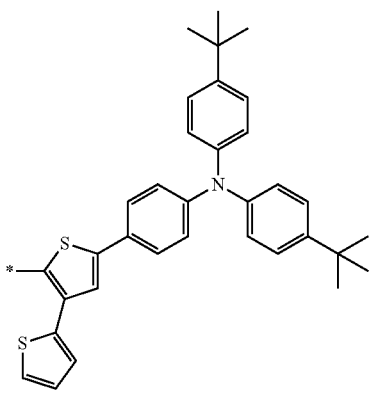 [SMILES: *c1sc(-c2ccc(N(c3ccc(C(C)(C)C)cc3)c3ccc(C(C)(C)C)cc3)cc2)cc1-c1cccs1] | H+, K+, Na+, or TBA+   H+, K+, Na+, or TBA+ |

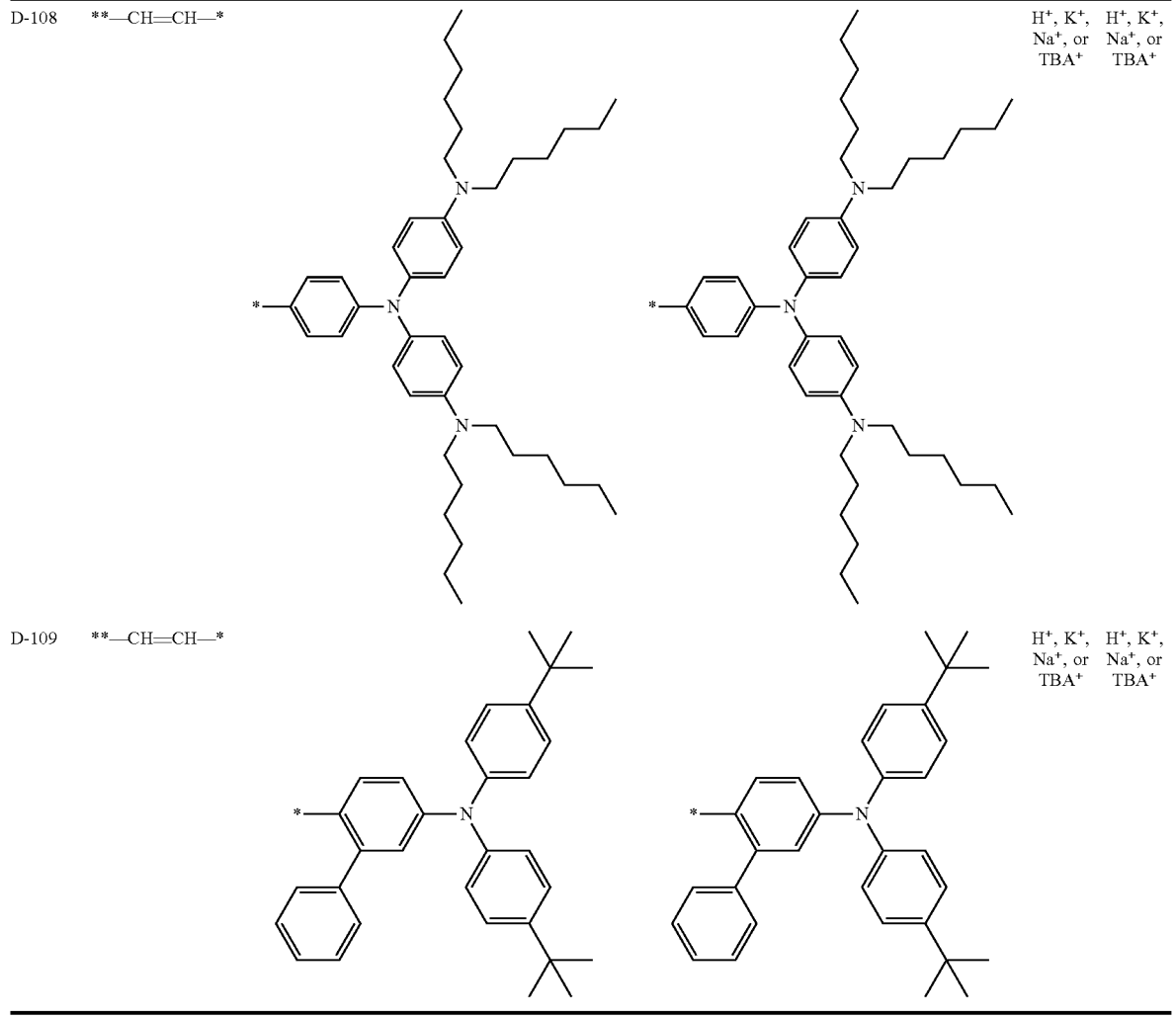

<Dye Composition>

The dye composition of an embodiment of the present invention includes at least the metal complex dye represented by Formula (1) and the metal complex dye represented by Formula (2), and preferably includes the metal complex dye represented by Formula (1), the metal complex dye represented by Formula (2), and the metal complex dye represented by Formula (6). In the dye composition, each of the metal complex dye (1), the metal complex dye (2), and the metal complex dye (6) may be of one kind or of two or more kinds.

The metal complex dye (1), the metal complex dye (2), and the metal complex dye (6) are each as described above.

In the dye composition, M, $R^1$, $R^2$, $R^{P1}$, $R^{P2}$, $n^{P1}$, $n^{P2}$, $X^1$, $X^2$, $M^1$, and $M^2$ in each of the metal complex dye (1), the metal complex dye (2), and the metal complex dye (6) may be the same as or different from each other. Further, $R^3$, $R^4$, $R^{P3}$, $R^{P4}$, $n^{P3}$, and $n^{P4}$ in metal complex dye (6) may be the same as or different from $R^1$, $R^2$, $R^{P1}$, $R^{P2}$, $n^{P1}$, and $n^{P2}$ of the metal complex dye (1) and the metal complex dye (2), respectively. For example, the metal complex dyes (1) and (2) which are the same as each other except for the configuration of $X^1$ and $X^2$ can be used in combination, and the metal complex dyes (1) and (2), and the metal complex dye (6) in which the bipyridine ligand having $R^3$ and $R^4$ is the same as in the metal complex dye (1) and/or (2) can be used in combination.

As described above, the metal complex dye (2) includes the metal complex dye (2A). Accordingly, in the dye composition of the embodiment of the present invention, an aspect of the metal complex dye (2) may include the metal complex dye (2A).

In the dye composition of the embodiment of the present invention, the content ratio (adsorption ratio) of the metal complex dye (1), the metal complex dye (2), and the metal complex dye (6) is not particularly limited. From the viewpoint that excellent photoelectric conversion efficiency, external quantum efficiency for long-wavelength light, and heat resistance durability can be imparted to the photoelectric conversion element and the dye-sensitized solar cell, the content ratio is preferably 0.1% to 99.9%:0.1% to 99.9%:0% to 10%, more preferably 40% to 99.9%:0.1% to 50%:0% to 10%, and still more preferably 65% to 99.9%:0.1% to 25%:0% to 5%, in terms of the molar amounts (100% in total) of the metal complex dye (1):the metal complex dye (2):the metal complex dye (6).

In an aspect in which the dye composition contains the metal complex dye (6), the lower limit of the content ratio of the metal complex dye (6) is not particularly limited, but can be set to, for example, 0.01% by mole.

In a case where the metal complex dye (2) includes the metal complex dye (2A), the content of the metal complex dye (2A) in the metal complex dye (2) is not particularly limited. A higher value of the content of the metal complex dye (2A) is more preferable, and is, for example, more preferably 50% to 100% by mole, and still more preferably 80% to 100% by mole.

The content ratio and the content can be determined using high performance liquid chromatography (HPLC) as described later.

In the dye composition of the embodiment of the present invention, in a case where the metal complex dye (1) and the metal complex dye (2) have at least one of a proton, a metal cation, or a non-metal cation as $M^1$ and $M^2$, they are not particularly limited in the presence ratio of the metal cation and the non-metal cation. For example, the metal cation and the non-metal cation are included in the amount of preferably 0.000001 to 1.5 moles, more preferably 0.000001 to 1.2 moles, and still more preferably 0.000001 to 1.0 mole, in the total molar amount (2.0 moles) of $M^1$ and $M^2$ contained in the metal complex dye (1) and the metal complex dye (2).

The proton may be contained in any of metal complex dyes, or may be contained in a plurality of metal complex dyes. Further, any one of $M^1$ or $M^2$ may be a proton, or both of them may be protons.

The dye composition of the embodiment of the present invention preferably includes a solvent (in the present invention, a dye composition including a solvent is also referred to as a dye solution). Further, the dye composition may contain other components such as a dye that can be used in combination which will be described later. Details of the solvent, the dye that can be used in combination, the other components, and the dye solution will be described later.

Next, preferred aspects of the main members of the photoelectric conversion element and the dye-sensitized solar cell will be described.

<Conductive Support>

The conductive support is not particularly limited as long as it has electrical conductivity and is capable of supporting a photoconductor layer 2 or the like. The conductive support is a material having electrical conductivity, for example, preferably a conductive support 1 formed of a metal which will be described later, or a conductive support 41 having a glass or plastic substrate 44 and a transparent conductive film 43 formed on the surface of the substrate 44.

Above all, the conductive support 41 having the transparent conductive film 43 of a metal oxide on the surface of the substrate 44 is more preferable. Such the conductive support 41 is obtained by applying a conductive metal oxide on the surface of the substrate 44 to form the transparent conductive film 43. Examples of the substrate 44 formed of plastics include the transparent polymer films described in paragraph No. 0153 of JP2001-291534A. Further, as a material which forms the substrate 44, ceramics (JP2005-135902A) or conductive resins (JP2001-160425A) can be used, in addition to glass and plastics. As the metal oxide, tin oxide (TO) is preferable, and indium-tin oxide (tin-doped indium oxide; ITO), and fluorine-doped tin oxide (FTO) such as tin oxide which has been doped with fluorine are particularly preferable. In this case, the coating amount of the metal oxide is preferably 0.1 to 100 g, per square meter of the surface area of the substrate 44. In a case of using the conductive support 41, it is preferable that light is incident from the substrate 44.

It is preferable that the conductive supports 1 and 41 are substantially transparent. The expression, "substantially transparent", means that the transmittance of light (at a wavelength of 300 to 1,200 nm) is 10% or more, preferably 50% or more, and particularly preferably 80% or more.

The thickness of the conductive supports 1 and 41 is not particularly limited, but is preferably 0.05 μm to 10 mm, more preferably 0.1 μm to 5 mm, and particularly preferably 0.3 μm to 4 mm.

In a case of including the transparent conductive film 43, the thickness of the transparent conductive film 43 is preferably 0.01 to 30 μm, more preferably 0.03 to 25 μm, and particularly preferably 0.05 to 20 am.

It is preferable that the conductive supports 1 and 41 have a metal oxide film including a metal oxide on the surface thereof. As the metal oxide, the metal oxide that forms the transparent conductive film 43 or the metal oxide mentioned as the metal oxide as the semiconductor fine particles which will be described later can be used, with the metal oxide mentioned as the semiconductor fine particles being preferable. The metal oxide may be the same as or different from the metal oxide that forms the transparent conductive film 43 or the metal oxide mentioned as the semi-conductive fine particles. The metal oxide film is usually formed on a thin film, and preferably has a thickness of 0.01 to 100 nm, for example. A method for forming the metal oxide film is not particularly limited, and examples thereof include the same method as the method for forming a layer formed by the semiconductor fine particles, which will be described later. For example, a liquid including a metal oxide or a precursor thereof (for example, a halide and an alkoxide) can be applied and heated (calcined) to form a metal oxide film.

The conductive supports 1 and 41 may be provided with a light management function at the surface, and may have, for example, the anti-reflection film having a high refractive index oxide film and a low refractive index oxide film alternately laminated described in JP2003-123859A, and the light guide function described in JP2002-260746A on the surface.

<Photoconductor Layer>

As long as the photoconductor layer has semiconductor fine particles 22 carrying the dye 21, and an electrolyte, it is not particularly limited in terms of the other configurations. Preferred examples thereof include the photoconductor layer 2 and the photoconductor layer 42.

—Semiconductor Fine Particles (Layer Formed by Semiconductor Fine Particles)—

The semiconductor fine particles 22 are preferably fine particles of chalcogenides of metals (for example, oxides, sulfides, and selenides) or of compounds having perovskite type crystal structures. Preferred examples of the chalcogenides of metals include oxides of titanium, tin, zinc, tungsten, zirconium, hafnium, strontium, indium, cerium, yttrium, lanthanum, vanadium, niobium, or tantalum, cadmium sulfide, and cadmium selenide. Preferred examples of the compounds having perovskite type crystal structures include strontium titanate and calcium titanate. Among those, titanium oxide (titania), zinc oxide, tin oxide, and tungsten oxide are particularly preferable.

Examples of the crystal structure of titania include structures of an anatase type, a brookite type, and a rutile type, with the structures of an anatase type and a brookite type being preferable. A titania nanotube, nanowire, or nanorod may be used singly or in mixture with titania fine particles.

The particle diameter of the semiconductor fine particles 22 is expressed in terms of an average particle diameter using a diameter in a case where a projected area is converted into a circle, and is preferably 0.001 to 1 jam as primary particles, and 0.01 to 100 µm as an average particle diameter of dispersions.

It is preferable that the semiconductor fine particles 22 have a large surface area so that they may adsorb a large amount of the dye 21. For example, in a state where the semiconductor fine particles 22 are coated on the conductive support 1 or 41, the surface area is preferably 10 times or more, and more preferably 100 times or more, with respect to the projected area. The upper limit of this value is not particularly limited, and the upper limit is usually approximately 5,000 times. In general, as the thickness of the layer (photoconductor layer) formed by the semiconductor fine particles increases, the amount of dye 21 that can be carried per unit area increases, and therefore, the light absorption efficiency increases. However, since the diffusion distance of generated electrons increases correspondingly, the loss due to charge recombination also increases.

Although a thickness of the layer formed by the semiconductor fine particles may vary depending on the applications of the photoelectric conversion element, it is typically preferably 0.1 to 100 µm, more preferably 1 to 50 µm, and still more preferably 3 to 30 am.

The layer of the semiconductor fine particles 22 can be formed by, for example, applying the semiconductor fine particles 22 onto the conductive support 1 or 41, and then calcining them at a temperature of 100° C. to 800° C. for 10 minutes to 10 hours. Thus, the semiconductor fine particles can be adhered to each other, which is thus preferable.

A method for coating the semiconductor fine particles 22 on the conductive support 1 or 41 includes a wet method a dry method, and other methods. The coating amount of the semiconductor fine particles 22 per square meter of the surface area of the conductive support is 0.5 to 500 g, and preferably 5 to 100 g.

The film-forming temperature is preferably 60° C. to 600° C. in a case where glass is used as a material for the conductive support 1 or the substrate 44.

—Light-Scattering Layer—

In the present invention, the light-scattering layer is different from the semiconductor layer from the viewpoint that the light-scattering layer has a function of scattering incident light.

In the dye-sensitized solar cell 20, the light-scattering layer 46 preferably contains rod-shaped or plate-shaped metal oxide fine particles. Examples of the metal oxide particles to be used in the light-scattering layer 46 include particles of the chalcogenides (oxides) of the metals, described above as the compound which forms semiconductor fine particles. In a case of providing the light-scattering layer 46, it is preferable that the thickness of the light-scattering layer is set to 10% to 50% of the thickness of the photoconductor layer.

The light-scattering layer 46 is preferably the light-scattering layer described in JP2002-289274A, and the description of JP2002-289274A is preferably incorporated herein by reference.

—Metal Oxide Layer Film—

In the present invention, semiconductor fine particles which form a photoconductor layer (including a case of forming the semiconductor layer 45 and the light-scattering layer 46), and preferably have a metal oxide film on the surface thereof. As the metal oxide which forms a metal oxide film, the metal oxide mentioned as the semiconductor fine particles can be used, and the metal oxide may be the same as or different from the semiconductor fine particles. This metal oxide film is usually formed on a thin film, and preferably has a thickness of 0.1 to 100 nm, for example. In the present invention, in a case where the semiconductor fine particles have a metal oxide film, the metal complex dye is adsorbed on the semiconductor fine particles via the metal oxide film. A method for forming the metal oxide film is as described above.

In the present invention, in particular, it is preferable that the surfaces of the conductive support and the semiconductor fine particles each have the metal oxide film. In this case, the respective metal oxide films may be formed of the same or different kinds of metal oxides.

—Dye—

In the photoelectric conversion element 10 and the dye-sensitized solar cell 20, the metal complex dye is adsorbed as a sensitizing dye in the dye adsorption aspect. Examples of the dye adsorption aspect include a first dye adsorption aspect in which at least the metal complex dye (1) and the metal complex dye (2) are adsorbed, and a second dye adsorption aspect in which at least the metal complex dye (2A) is adsorbed, as described above.

The metal complex dyes, combinations thereof, and the like in each of the dye adsorption aspects are as described above. In each of the dye adsorption aspects, the respective metal complex dyes may be of one kind or of two or more kinds.

In the respective metal complex dyes carried on the semiconductor fine particles, the structural elements represented by the references in each of formulae may be the same as or different from each other.

The content ratio (adsorption ratio) of the metal complex dye (in the photoconductor layer) adsorbed onto the semiconductor fine particles is not particularly limited. This content ratio can be quantified by a method which will be described later.

In the first dye adsorption aspect, from the viewpoints of photoelectric conversion efficiency, external quantum efficiency for long-wavelength light, and heat resistance durability, the content ratio is preferably 0.1% to 99.9%:0.1% to 99.9%:0% to 10%, more preferably 40% to 99.9%:0.1% to 50%:0% to 10%, and still more preferably 65% to 99.9%:

0.1% to 25%:0% to 5%, in terms of the molar amounts (100% in total) of the metal complex dye (1):the metal complex dye (2):the metal complex dye (6).

In a case where the metal complex dye (2) includes the metal complex dye (2A), the content of the metal complex dye (2A) in the metal complex dye (2) is not particularly limited. A higher value of the content is more preferable, and is, for example, more preferably 50% to 100% by mole, and still more preferably 80% to 100% by mole.

In the second dye adsorption aspect, the content of the metal complex dye (2A) is preferably 50% to 100% by mole, and more preferably 80% to 100% by mole, with respect to all the metal complex dyes, from the viewpoints of photoelectric conversion efficiency, external quantum efficiency for long-wavelength light, and heat resistance durability.

In the present invention, the semiconductor fine particles may carry other dyes, together with the metal complex dye (1), the metal complex dye (2), and the metal complex dye (6). Such other dyes which can be used in combination are not particularly limited, and examples thereof include a Ru complex dye, a squarylium cyanine dye, an organic dye, a porphyrin dye, and a phthalocyanine dye, which are other than the metal complex dye (1), the metal complex dye (2), and the metal complex dye (6). As such other dye which can be used in combination, the Ru complex dye, the squarylium cyanine dye, or the organic dye is preferable.

The amount (total amount) of the dye to be used cannot be routinely determined, but is preferably 0.01 to 100 millimoles, more preferably 0.1 to 50 millimoles, and particularly preferably 0.1 to 10 millimoles, per square meter of the surface area of the conductive support 1 or 41. Further, the amount of the dye to be adsorbed onto the semiconductor fine particles is preferably 0.001 to 1 millimole, and more preferably 0.1 to 0.5 millimoles, with respect to 1 g of the semiconductor fine particles. By setting the amount of the dye to such a range, the sensitization effect on the semiconductor fine particles is sufficiently obtained.

In a case where the metal complex dye (1), the metal complex dye (2), and the metal complex dye (6) are used in combination with other dyes, the ratio of the total mass of the metal complex dye (1), the metal complex dye (2), and the metal complex dye (6)/the mass of other dyes is preferably 95/5 to 10/90, more preferably 95/5 to 50/50, still more preferably 95/5 to 60/40, particularly preferably 95/5 to 65/35, and most preferably 95/5 to 70/30.

—Electrolyte—

The electrolyte included in the photoconductor layer is as described above.

—Co-Adsorbent—

In the present invention, it is preferable that the semiconductor fine particles carry a co-adsorbent, together with the metal complex dye (1), the metal complex dye (2), and the metal complex dye (6), or with other dyes to be used in combination, if desired. As such a co-adsorbent, a co-adsorbent having one or more acidic groups (preferably carboxyl groups or salts thereof) is preferable, and examples thereof include a fatty acid and a compound having a steroid skeleton.

The fatty acid may be a saturated fatty acid or an unsaturated fatty acid, and examples thereof include a butanoic acid, a hexanoic acid, an octanoic acid, a decanoic acid, a hexadecanoic acid, a dodecanoic acid, a palmitic acid, a stearic acid, an oleic acid, a linoleic acid, or a linolenic acid.

Examples of the compound having a steroid skeleton include a cholic acid, a glycocholic acid, a chenodeoxycholic acid, a hyocholic acid, a deoxycholic acid, a lithocholic acid, and an ursodeoxycholic acid, among which the cholic acid, the deoxycholic acid, or the chenodeoxycholic acid is preferable; and the deoxycholic acid or the chenodeoxycholic acid is more preferable.

Preferred examples of the co-adsorbent material include the compounds represented by Formula (CA) described in paragraph Nos. 0125 to 0129 of JP2014-082187A, and the description of paragraph Nos. 0125 to 0129 of JP2014-082187A are preferably incorporated herein by reference.

By making the co-adsorbent adsorbed onto the semiconductor fine particles, the co-adsorbent has an effect of suppressing the inefficient association of the metal complex dye and an effect of preventing reverse electron transfer from the surface of the semiconductor fine particles to the redox system in the electrolyte. The amount of the co-adsorbent to be used is not particularly limited, and from the viewpoint of exhibiting the above effects effectively, the amount is preferably 0.1 to 200 moles, more preferably 1 to 100 moles, and particularly preferably 2 to 50 moles, per mole of the metal complex dye.

—Amine Compound—

After the dye is carried on the semiconductor fine particles, the surface of the semiconductor fine particles may be treated with an amine compound. Preferred examples of the amine compound include a pyridine compound (for example, 4-t-butylpyridine and polyvinylpyridine). In a case where the amine compound is liquid, it may be used as it is or may be used after being dissolved in an organic solvent.

<Charge Transfer Layer>

The charge transfer layers 3 and 47 used in the photoelectric conversion element of the embodiment of the present invention are layers having a function of complementing electrons for the oxidized forms of the dye 21, and are provided between the light-receiving electrode 5 or 40 and the counter electrode 4 or 48.

The charge transfer layers 3 and 47 include electrolytes. Here, the expression, "the charge transfer layer includes an electrolyte", is meant to encompass both of an aspect in which the charge transfer layer consists only of an electrolyte and an aspect in which the charge transfer layer contains an electrolyte and materials other than the electrolyte.

The charge transfer layers 3 and 47 may be any of a solid form, a liquid form, a gel form, or a mixture thereof.

—Electrolyte—

Examples of the electrolyte include a liquid electrolyte having a redox pair dissolved in an organic solvent, and a so-called gel electrolyte in which a molten salt containing a redox pair and a liquid having a redox pair dissolved in an organic solvent are impregnated in a polymer matrix. Among those, from the viewpoint photoelectric conversion efficiency, a liquid electrolyte is preferable.

Examples of the redox pair include a combination of iodine and an iodide (preferably an iodide salt or an iodide ionic liquid, and more preferably lithium iodide, tetrabutylammonium iodide, tetrapropylammonium iodide, and methylpropylimidazolium iodide), a combination of an alkylviologen (for example, methylviologen chloride, hexylviologen bromide, and benzylviologen tetrafluoroborate) and a reductant thereof, a combination of a polyhydroxybenzene (for example, hydroquinone and naphthohydroquinone) and an oxidized form thereof, a combination of a divalent iron complex and a trivalent iron complex (for example, a combination of potassium ferricyanide and potassium ferrocyanide), and a combination of a divalent cobalt complex and a trivalent cobalt complex. Among those, a combination of iodine and an iodide, or a combination of a divalent cobalt complex and a trivalent cobalt complex is preferable, and a combination of iodine and an iodide is particularly preferable.

As the cobalt complex, the complex represented by Formula (CC) described in paragraph Nos. 0144 to 0156 of JP2014-82189A is preferable, and the descriptions of paragraph Nos. 0144 to 0156 of JP2014-82189A are preferably incorporated herein by reference.

In a case where a combination of iodine and iodide is used as an electrolyte, it is preferable that an iodine salt of a nitrogen-containing aromatic cation of a 5- or 6-membered ring is additionally used.

The organic solvent which is used in a liquid electrolyte and a gel electrolyte is not particularly limited, but is preferably an aprotic polar solvent (for example, acetonitrile, propylene carbonate, ethylene carbonate, dimethylformamide, dimethylsulfoxide, sulfolane, 1,3-dimethylimidazolinone, or 3-methyloxazolidinone).

In particular, as the organic solvent which is used for a liquid electrolyte, a nitrile compound, an ether compound, an ester compound, or the like is preferable, a nitrile compound is more preferable, and acetonitrile or methoxypropionitrile is particularly preferable.

As a molten salt or a gel electrolyte, those described in paragraph No. 0205 and paragraph Nos. 0208 to 0213 of JP2014-139931A are preferable, and the descriptions in paragraph No. 0205 and paragraph Nos. 0208 to 0213 of JP2014-139931A are preferably incorporated herein by reference.

The electrolyte may also contain an aminopyridine compound, a benzimidazole compound, an aminotriazole compound, an aminothiazole compound, an imidazole compound, an aminotriazine compound, a urea compound, an amide compound, a pyrimidine compound, and a heterocycle including no nitrogen, in addition to pyridine compounds such as 4-t-butylpyridine, as an additive.

Moreover, a method of controlling the moisture content of the electrolytic solution may be employed in order to enhance the photoelectric conversion efficiency. Preferred examples of the method of controlling the moisture content include a method of controlling a concentration, and a method of coexisting a dehydrating agent with other components. The moisture content (content ratio) of the electrolytic solution is preferably adjusted to 0% to 0.1% by mass.

Iodine can also be used as a clathrate compound of iodine with cyclodextrin. Furthermore, a cyclic amidine may be used, or an antioxidant, a hydrolysis inhibitor, a decomposition inhibitor, or zinc iodide may also be added.

A solid-state charge transport layer such as a p-type semiconductor or a hole transport material, for example, CuI or CuNCS, may be used in place of the liquid electrolyte and the quasi-solid-state electrolyte (gel electrolyte) as described above. Moreover, the electrolytes described in Nature, vol. 486, p. 487 (2012) and the like may also be used. For a solid-state charge transport layer, an organic hole transport material may be used. With regard to the organic hole transport material, those described in paragraph No. 0214 of JP2014-139931A are preferably described, and those described in paragraph No. 0214 of JP2014-139931A are preferably incorporated herein by reference.

The redox pair serves as an electron carrier, and therefore, it is preferably contained at a certain concentration. The concentration of the redox pair in total is preferably 0.01 mol/L or more, more preferably 0.1 mol/L or more, and particularly preferably 0.3 mol/L or more. In this case, the upper limit is not particularly limited, but is usually approximately 5 mol/L.

<Counter Electrode>

The counter electrodes 4 and 48 preferably work as a positive electrode in a dye-sensitized solar cell. The counter electrodes 4 and 48 usually have the same configurations as the conductive support 1 or 41, but in a configuration in which strength is sufficiently maintained, a substrate 44 is not necessarily required.

Materials having electrical conductivity, which form a counter electrode, are described for the conductive support 41, but other examples of the materials include metals such as platinum, gold, nickel, copper, silver, indium, ruthenium, palladium, rhodium, iridium, osmium, and aluminum, carbon materials, and conductive polymers.

A preferred structure of the counter electrodes 4 and 48 is a structure having a high charge collecting effect. At least one of the conductive support 1 or 41, or the counter electrode 4 or 48 should be substantially transparent so that light may reach the photoconductor layers 2 and 42. In the dye-sensitized solar cell of the embodiment of the present invention, the conductive support 1 or 41 is preferably transparent to allow solar light to be incident from the side of the conductive support 1 or 41. In this case, the counter electrodes 4 and 48 more preferably have light-reflecting properties. As the counter electrodes 4 and 48 of the dye-sensitized solar cell, glass or plastic on which a metal or a conductive oxide has been deposited is preferable, and glass on which platinum has been deposited is particularly preferable.

The film thickness of the counter electrode is not particularly limited, and is preferably 0.01 to 100 μm, more preferably 0.01 to 10 μm, and particularly preferably 0.01 to 1 μm.

<Other Configurations>

It is preferable that a short circuit-preventing layer is formed between the conductive support 1 or 41 and the photoconductor layer 2 or 42 so as to prevent reverse current due to a direct contact between the electrolyte included in the photoconductor layer 2 or 42 and the conductive support 1 or 41.

In addition, it is preferable to use a spacer S (see FIG. 2) and/or a separator so as to prevent a contact between the light-receiving electrode 5 or 40 and the counter electrode 4 or 48.

Furthermore, in the photoelectric conversion element or the dye-sensitized solar cell, a lateral side of the photoelectric conversion element or the dye-sensitized solar cell is preferably sealed with a polymer, an adhesive, or the like in order to prevent evaporation or the like of components.

The dye-sensitized solar cell of the embodiment of the present invention is constituted with the above-mentioned photoelectric conversion element. For example, as shown in FIG. 1, the conductive support and the counter electrode of the photoelectric conversion element are connected with an external circuit 6 to form a dye-sensitized solar cell. Known external circuits can be used as the external circuit 6 without particular limitation.

The photoelectric conversion element and the dye-sensitized solar cell carry a metal complex dye in the dye adsorption aspect. Thus, as described, in any of the dye adsorption aspects, high photoelectric conversion efficiency, high external quantum efficiency for long-wavelength light, and high heat stability (heat resistance durability) are exhibited. In particular, in a case where the metal complex dye is carried in the first dye adsorption aspect, excellent characteristics of a higher level of combination of the photoelectric conversion efficiency, the external quantum efficiency, and the heat resistance durability are exhibited.

The photoelectric conversion element and the dye-sensitized solar cell in which the metal complex dye (2A) is adsorbed in the second dye adsorption aspect exhibit desired action effects as described above, and function as each of the photoelectric conversion element and the dye-sensitized solar cell.

[Method for Producing Photoelectric Conversion Element and Dye-Sensitized Solar Cell]

The photoelectric conversion element and the dye-sensitized solar cell of the embodiment of the present invention are each preferably produced, using the dye composition (dye solution) of the embodiment of the present invention or the composition containing the metal complex dye (2A).

The dye solution of the embodiment of the present invention is a solution in which the metal complex dye (1) and the metal complex dye (2), preferably the metal complex dye (6), and the above-mentioned dyes that can be used in combination, if desired, are dissolved in a solvent. The dye solution may also include other components, if desired.

The composition (solution) containing the metal complex dye (2A) is a solution in which the metal complex dye (2A), and if desired, the metal complex dye (2) other than the metal complex dye (2A) or the above-mentioned dyes that can be used in combination are dissolved in a solvent. The composition containing the metal complex dye (2A) may further include other components, if desired.

The solution includes a suspension, a dispersion liquid, a paste, or the like, in addition to a liquid in which metal complex dyes and the like are dissolved in a solvent. Further, some of the metal complex dyes may be precipitated (deposited) in the solution.

Hereinafter, unless specified otherwise, a simple reference to a dye solution means a solution containing the dye solution of the embodiment of the present invention and the solution containing the metal complex dye (2A). This shall also apply to the dye composition.

Examples of the solvent include the solvents described in JP2001-291534A, but are not particularly limited thereto. In the present invention, an organic solvent is preferable, and an alcohol solvent, an amide solvent, a nitrile solvent, a ketone solvent, a hydrocarbon solvent, and a mixed solvent of two or more kinds of these solvents are more preferable.

As the mixed solvent, a mixed solvent of an alcohol solvent and a solvent selected from an amide solvent, a nitrile solvent, a ketone solvent, and a hydrocarbon solvent is preferable; a mixed solvent of an alcohol solvent and an amide solvent, a mixed solvent of an alcohol solvent and a hydrocarbon solvent, or a mixed solvent of an alcohol solvent and a nitrile solvent is more preferable; and a mixed solvent of an alcohol solvent and an amide solvent, or a mixed solvent of an alcohol solvent and a nitrile solvent are particularly preferable. Specifically, a mixed solvent of at least one kind of methanol, ethanol, propanol, and t-butanol, and at least one kind of dimethylformamide and dimethylacetamide, or a mixed solvent of at least one kind of methanol, ethanol, propanol, and t-butanol, and acetonitrile is preferable.

The dye solution preferably contains a co-adsorbent, and as the co-adsorbent, the aforementioned co-adsorbent is preferable.

Here, the dye solution is preferably one in which the concentration of the metal complex dye or the co-adsorbent has been adjusted so that the dye solution can be used as it is during production of the photoelectric conversion element or the dye-sensitized solar cell. In the present invention, the dye solution preferably contains 0.001% to 0.1% by mass in total of the metal complex dyes. The amount of the co-adsorbent to be used is the same as described above.

For the dye solution, a dye solution having a low moisture content ratio is preferable from the viewpoint of dye adsorption. For example, the moisture content is preferably adjusted to 0% to 0.1% by mass, at least during the use. The moisture content ratio can be adjusted in an ordinary method, at least during the use.

In the present invention, it is preferable to manufacture a photoconductor layer by making a metal complex dye in a desired dye adsorption aspect carried on the surface of the semiconductor fine particles, using a dye composition, and preferably the dye solution. That is, the photoconductor layer is preferably formed by applying (including a dipping method) the dye composition onto the semiconductor fine particles provided on the conductive support, followed by drying and curing.

By further providing a charge transfer layer, a counter electrode, or the like by a common method for a light-receiving electrode comprising the photoconductor layer manufactured as above, the photoelectric conversion element of the embodiment of the present invention in which a metal complex dye is adsorbed in the desired dye adsorption aspect can be obtained.

In addition, a dye-sensitized solar cell can be produced by connecting an external circuit 6 with the conductive support 1 and the counter electrode 4 of the photoelectric conversion element manufactured as above.

EXAMPLES

Hereinafter, the present invention will be described in more detail, based on Examples, but the present invention is not limited thereto.

In Examples, the metal complex dye is referred to as a "metal complex dye D-nX". Here, n means a compound No. of the metal complex dye, in a case where $M^1$ or $M^2$ is a cation, X means an element reference or abbreviation of the cationic species, an in a case where $M^1$ or $M^2$ is a proton, description thereof is omitted.

The metal complex dye (6) cannot be represented by the same chemical formula as the metal complex dye (1) or the like, but it has two bipyridine ligands having the same substituent as the metal complex dye (1), and thus, it is described simply as being encompassed by the metal complex dye D-n. In this case, a metal complex dye corresponding to the metal complex dye (1) is referred to as a metal complex dye D-nX(1), and in the same manner, metal complex dyes corresponding to the metal complex dye (2) and the metal complex dye (6) are referred to as a metal complex dye D-nX(2) and a metal complex dye D-nX(6), respectively. Since the metal complex dye (2A) is a preferred aspect of the metal complex dye (2), it is described as being encompassed by the metal complex dye (2).

In addition, this shall also apply to a synthesis intermediate for the metal complex dye.

Example 1 (Synthesis of Metal Complex Dye)

Hereinafter, Examples compounds for the metal complex dye of the embodiment of the present invention and synthesis methods therefor will be described in detail, but starting materials, dye intermediates, and synthesis routes therefor are not limited thereto.

In the present invention, a room temperature means 25° C.

The metal complex dyes synthesized in the present Example are shown below. In the following metal complex dye D-5TBA, $^n$Bu represents normal butyl.

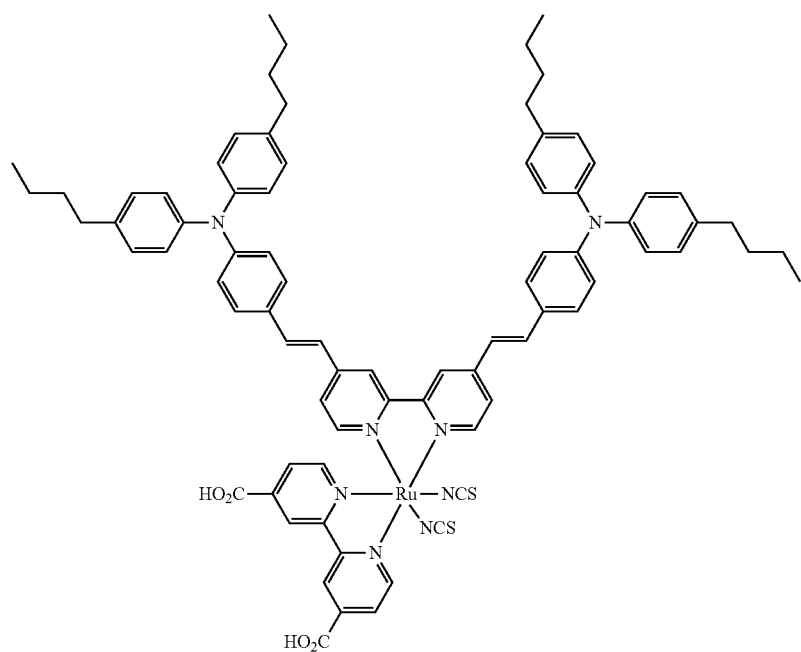

D-7

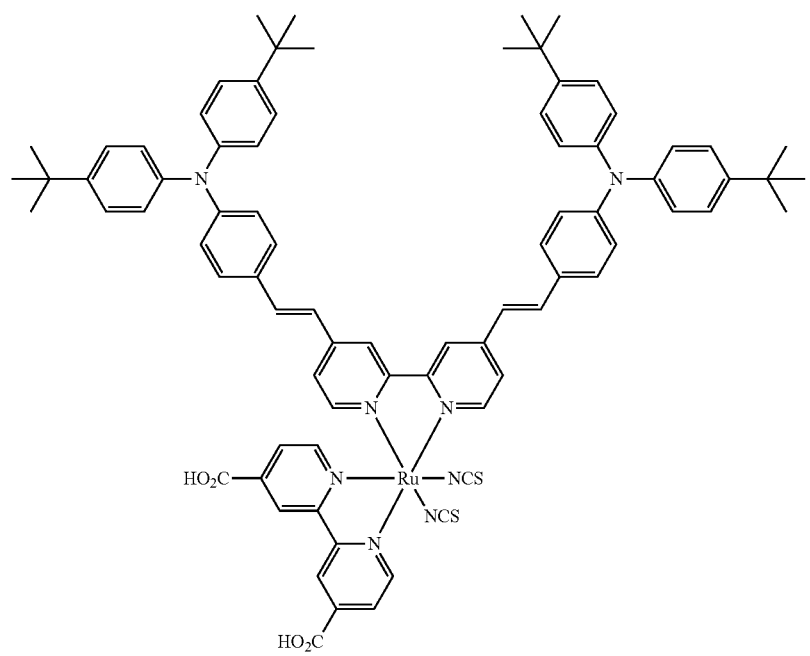

D-5

-continued
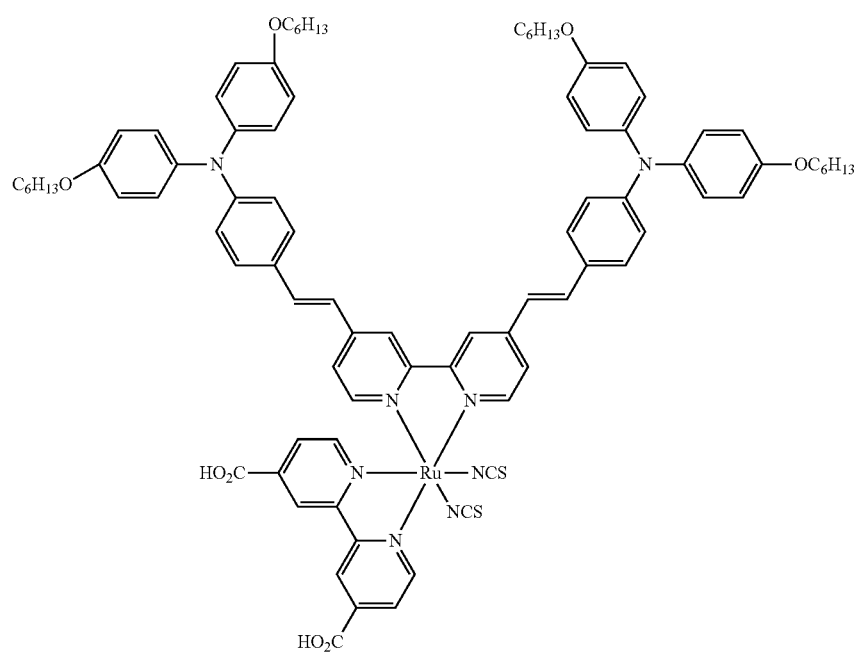
D-11
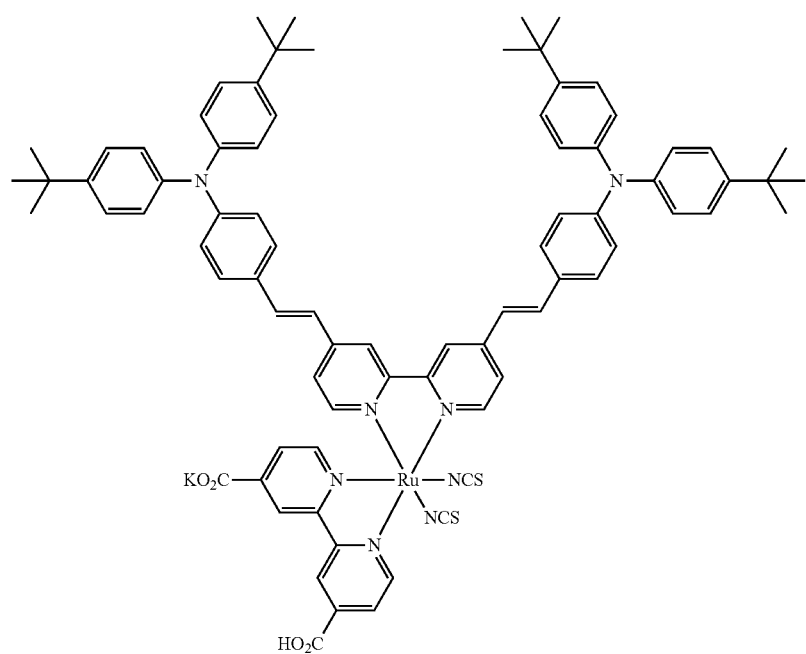
D-5K

-continued
D-5TBA
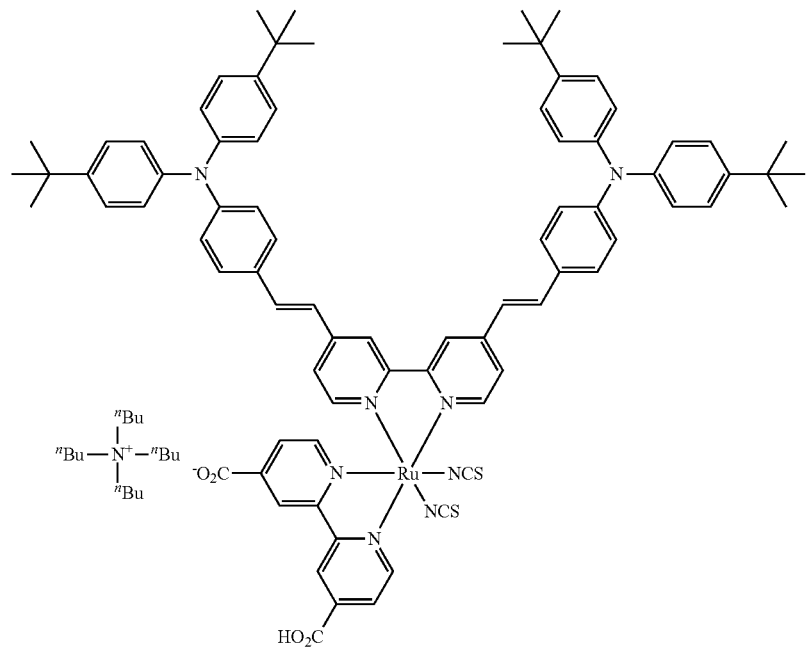
D-5Na
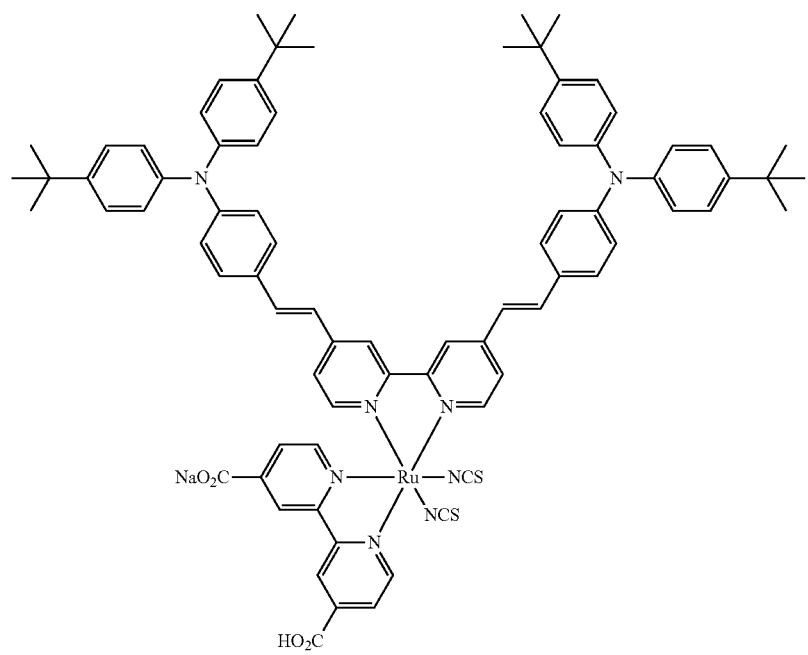

-continued
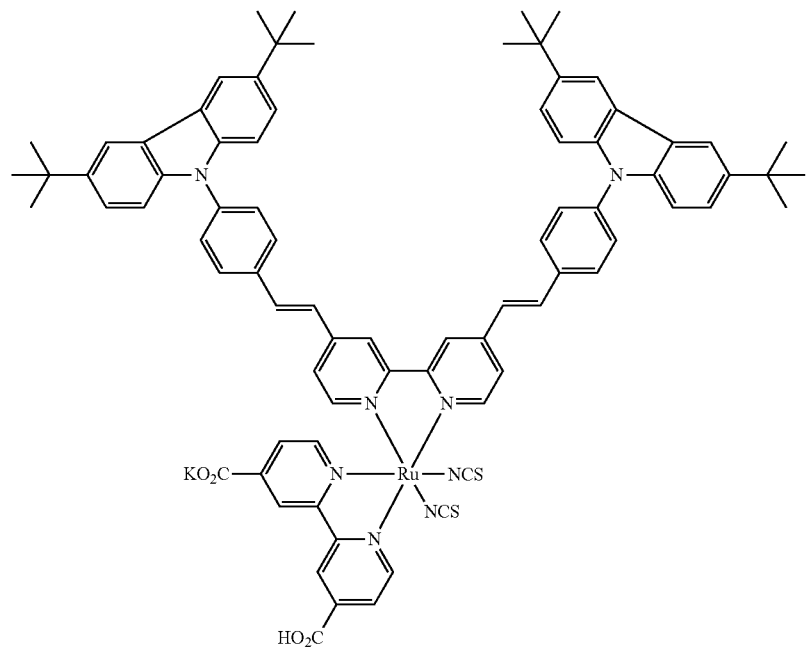
D-28K
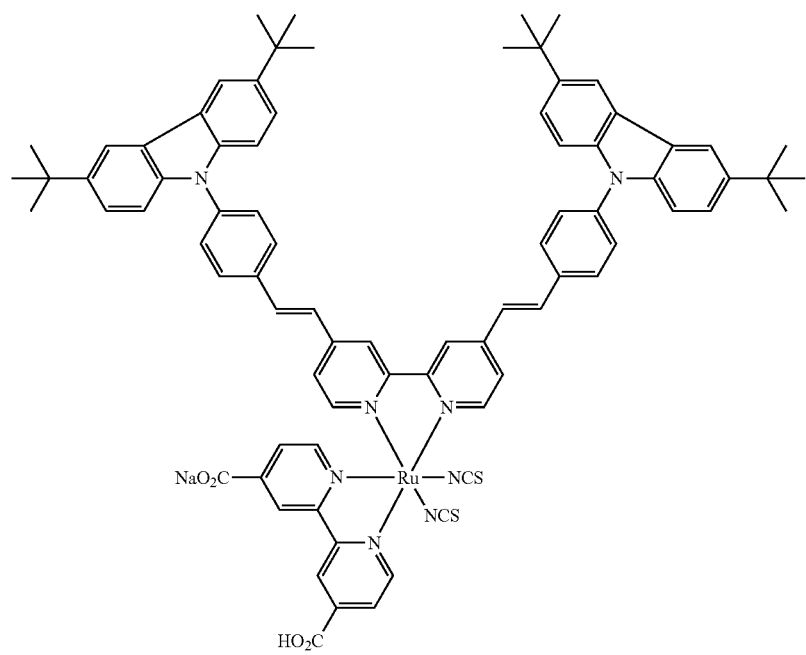
D-28Na

D-44
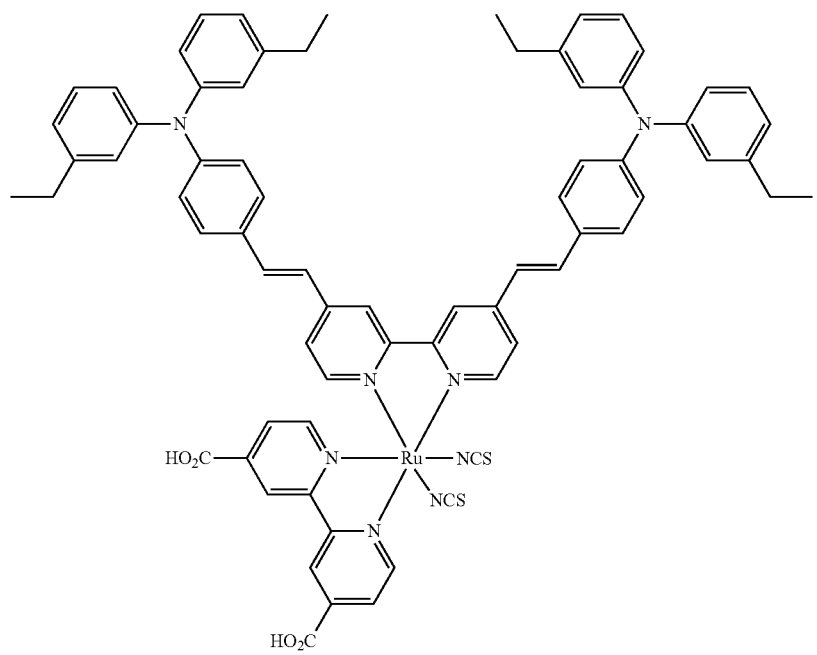
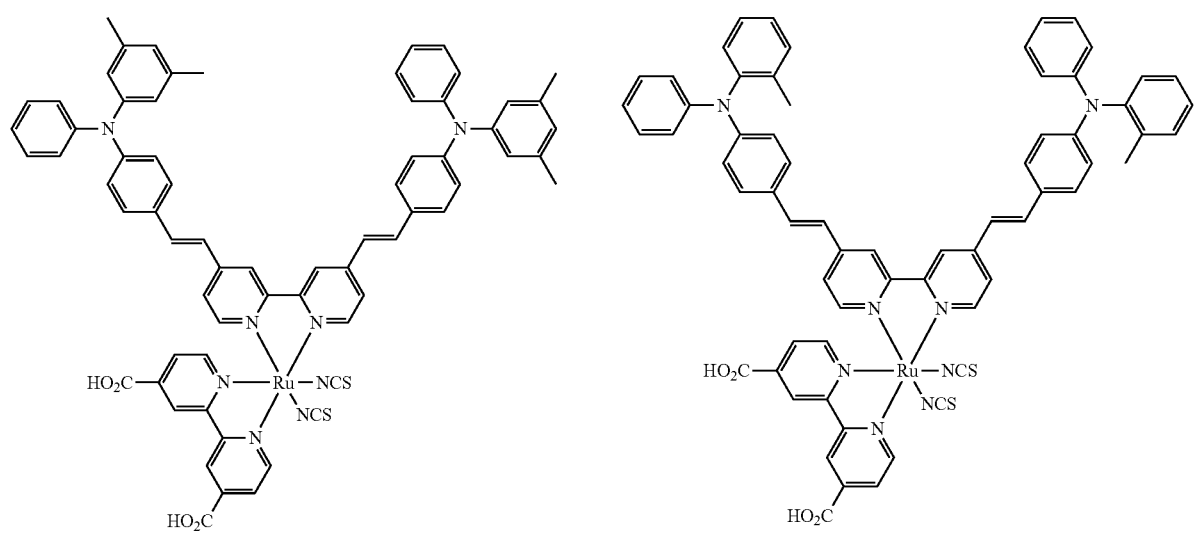

-continued

D-77

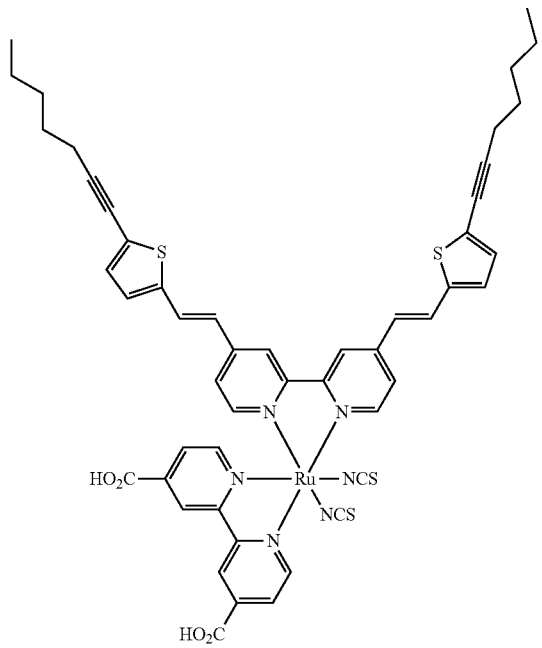

In the metal complex dyes, the metal complex dyes D-5, D-7, D-11, and D-28 correspond to the metal complex dyes (metal complex dyes represented by Formula (2A) in a case where they are trans forms) of suitable aspects in which $R^1$ and $R^2$ are each the group represented by Formula (4)).

<Synthesis of Metal Complex Dye D-5>

First, according to a method of the following scheme, compounds d-2-6 and d-2-9 were synthesized.

In the scheme, $^t$Bu represents tertiary butyl and Ac represents acetyl.

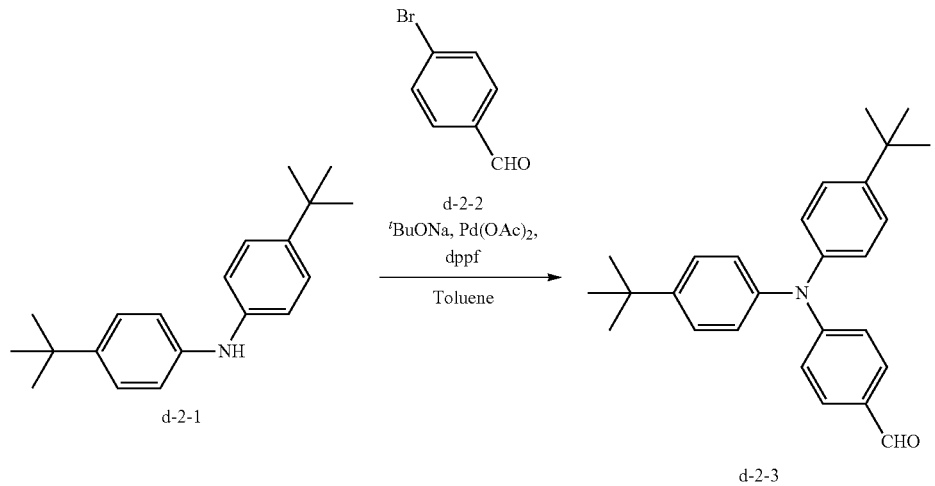

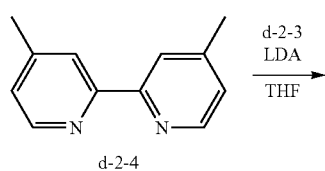

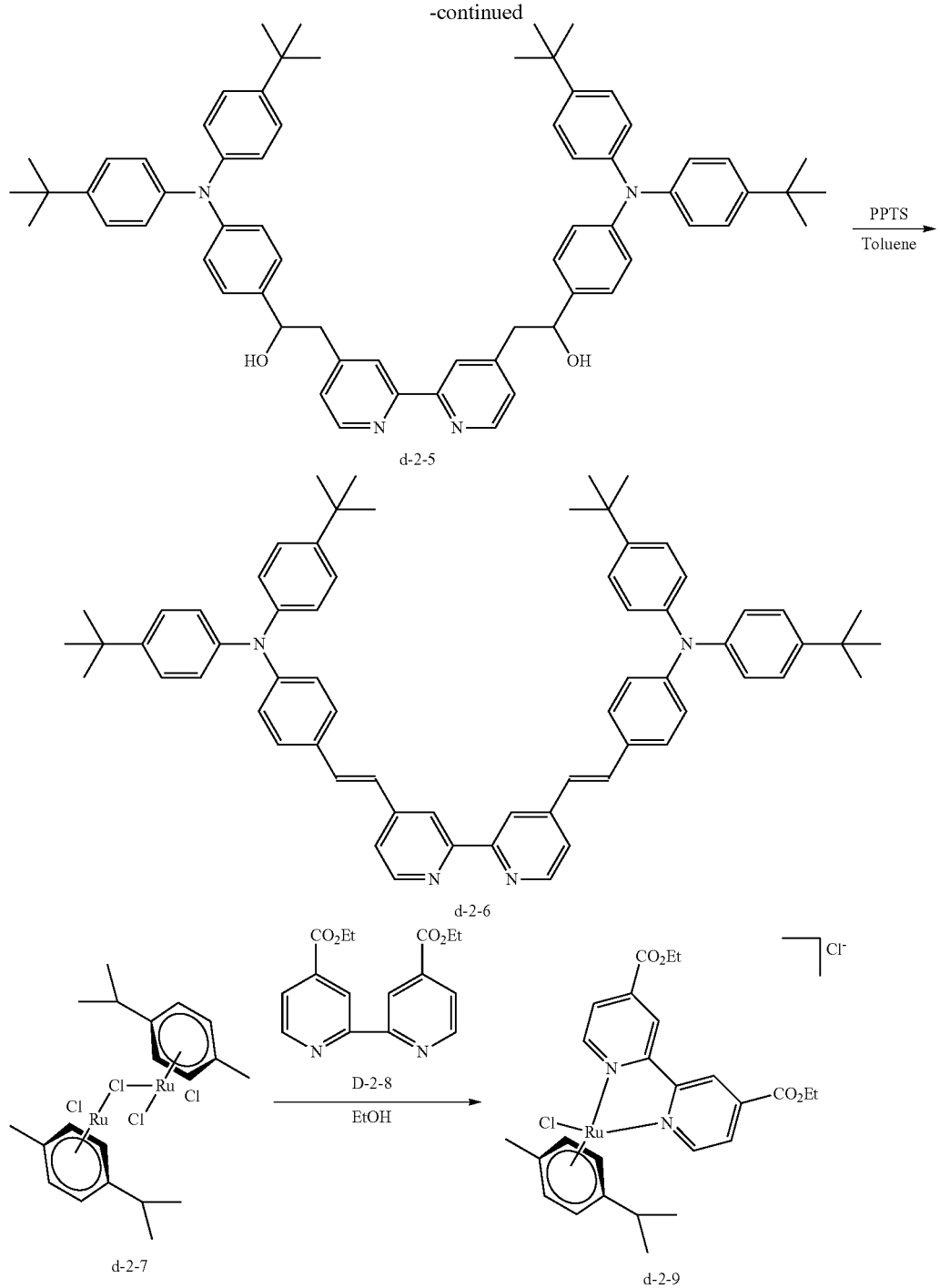

(ii) Synthesis of Compound d-2-6

4.5 g of a compound d-2-4 was dissolved in 135 mL of tetrahydrofuran (THF) at −10° C. in a nitrogen gas atmosphere, 25.7 mL of a 2 M (mol/L) lithium diisopropylamide (LDA) solution was added dropwise thereto, and the mixture was stirred for 10 minutes. Thereafter, to the obtained reaction solution was added dropwise a solution in which 19.8 g of the compound d-2-3 had been dissolved in 68 mL of THF, and the mixture was stirred at −5° C. for 10 minutes, and further stirred at room temperature for 40 minutes. To the obtained liquid was added 150 mL of a saturated aqueous ammonium chloride solution, the mixture was subjected to liquid separation, and the organic layer was concentrated and dried.

A crude product (including a compound d-2-5) thus obtained and 12.3 g of pyridinium paratoluenesulfonic acid (PPTS) were added to 300 mL of toluene, and the mixture was heated and refluxed for 1 hour in a nitrogen gas atmosphere. To the obtained reaction solution were added ethyl acetate, water, and saturated sodium bicarbonate, the mixture was subjected to liquid separation, and the organic layer was concentrated. The obtained crude product was purified by silica gel column chromatography to obtain 11 g of a compound d-2-6.

(iii) Synthesis of Compound d-2-9

30.6 g of a compound d-2-7 and 30.0 g of a compound d-2-8 were heated and stirred in ethanol (EtOH) for 2 hours, and then concentrated to obtain 60.6 g of a compound d-2-9.

Subsequently, according to a method in the following scheme, a metal complex dye D-5 was synthesized.

(iv) Synthesis of Ester Compounds D-5(1S) and D-5(2S), and Metal Complex Dye D-5(6)

1 g of the compound d-2-9 and 1.48 g of the compound d-2-6 were heated and stirred at a predetermined temperature for a predetermined time in 20 mL of N,N-dimethylformamide (DMF). The obtained reaction solution was concentrated, followed by addition of water, and filtered. Then, the collected precipitate was washed with diethyl ether. The obtained crude product was purified by silica gel column chromatography to obtain each of a predetermined amount of ester compounds D-5(1S) and D-5(2S), and a metal complex dye D-5(6). The production ratio of the ester

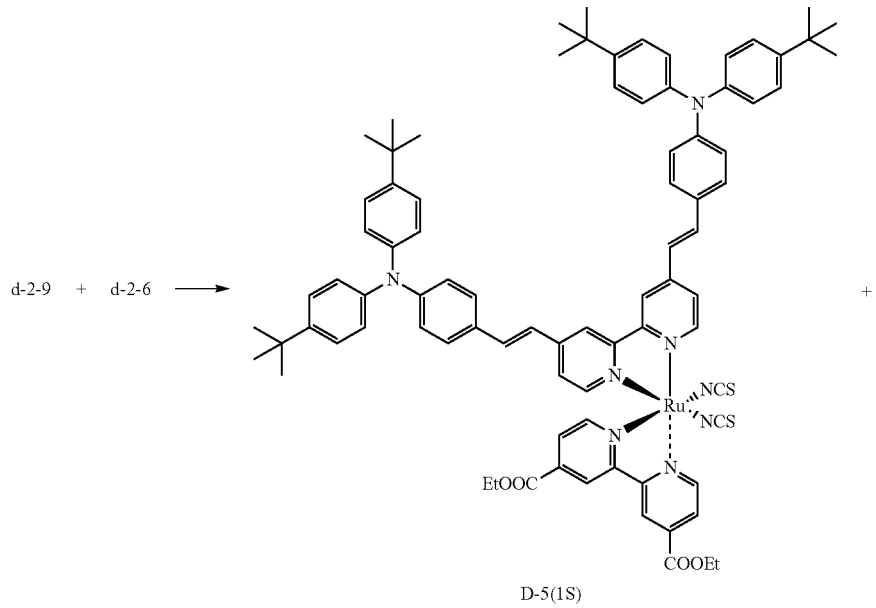

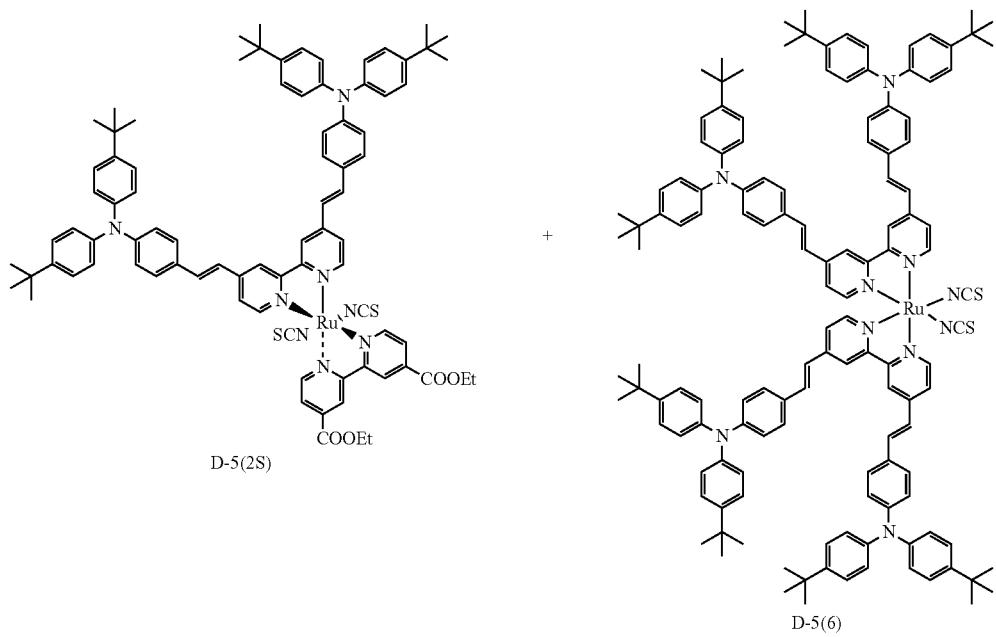

compounds D-5(1S) and D-5(2S) to the metal complex dye D-5(6) can be adjusted by controlling the reaction conditions.

(v) Synthesis of Metal Complex Dyes D-5(1) and D-5(2)

D-5(1S) ⟶

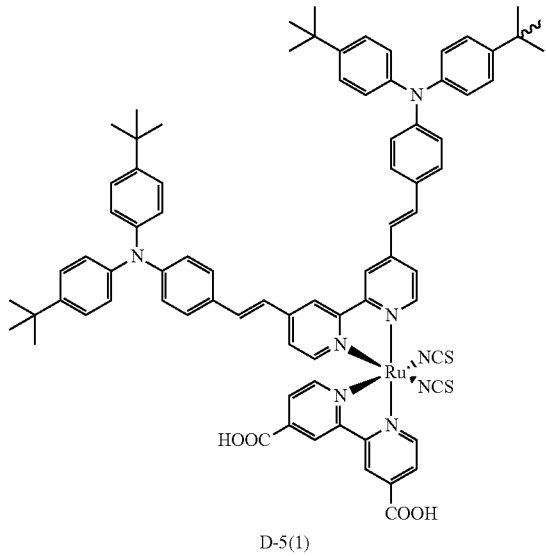

D-5(1)

D-5(2S) ⟶

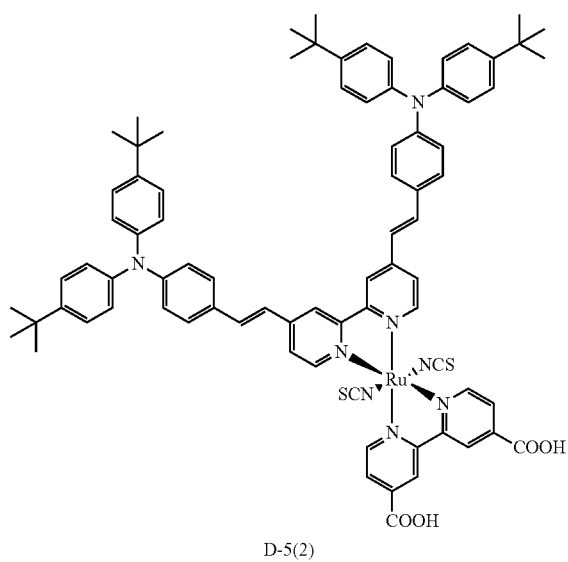

D-5(2)

To 1.3 g of the compound D-5(1S) was added 80 mL of DMF, 4 mL of water, and 1.6 mL of a 3 N-aqueous sodium hydroxide solution, and the mixture was stirred at 30° C. for 1 hour. The mixture was adjusted to pH 3.0 by the dropwise addition of a 1 N-aqueous trifluoromethanesulfonic acid solution. The mixture was filtered to obtain 1.1 g of a metal complex dye D-5(1) as a precipitate.

In the same manner as for the metal complex dye D-5(1), a metal complex dye D-5(2) was synthesized.

In this manner, a metal complex dye D-5 was synthesized.

<Identification of Metal Complex Dye D-5>

It was confirmed that the obtained metal complex dyes D-5(1) and D-5(2) had the same molecular weights by the measurement results of liquid chromatography mass spectrum (LC-MS) and matrix-assisted laser desorption/ionization mass spectrum (MALDI-MS). Further, according to the measurement results of a nuclear magnetic resonance (NMR) spectrum, the metal complex dyes D-5(1) and D-5(2) were identified to be geometric isomers to each other in terms of a six-coordination complex structure.

In addition, according to the MALDI-MS measurement results, the metal complex dye D-5(6) was confirmed and identified to have the structure.

Moreover, the synthesized metal complex dyes D-5(1), D-5(2), and D-5(6) were confirmed by HPLC measurement under the following measurement conditions.

The retention time of each of the metal complex dyes is shown below.

Metal complex dye D-5(1): 13.2 to 13.5 min
Metal complex dye D-5(2): 13.6 to 13.9 min
Metal complex dye D-5(6): 18.0 to 18.5 min
HPLC Measurement Condition:
Column: YMC-Triart C18 (150 mm×4.6 mm I.D., particle diameter of 5 μm, pore diameter of 12 nm)
Liquid A: 0.1% TFA, 40% THF/60% $H_2O$ (volume ratio)
Liquid B: 0.1% TFA, 100% THF (volume ratio)
Time program: (0 to 20 min) Bconc. 30% to 80% (gradient), (20 to 30 min) Bconc. 30%
Flow rate: 1.0 mL/min
Oven temperature: 40° C.
Detection wavelength: 254 nm
Sample injection amount: 5 μL Furthermore, according to the measurement of a solution absorption spectrum (solvent:tetrabutylammonium hydroxide (methanol solution)) of the obtained metal complex dyes D-5(2) and D-5(6), it was confirmed that a molar light absorption coefficient (ε) at 550 to 600 nm increased to about 1.1- to 2-times that of the metal complex dye (1).

<Synthesis of Metal Complex Dyes D-7, D-11, D-28, D-44, D-49, D-51, and D-77>

In the same manner as for the synthesis of the metal complex dye D-5, metal complex dyes D-7, D-11, D-28, D-44, D-49, D-51, and D-77 were synthesized.

<Synthesis of Metal Complex Dyes D-5K, D-5TBA, D-5Na, D-28K, and D-28Na>

(i) Synthesis of Metal Complex Dye D-5K

The metal complex dye D-5(1) synthesized as above was stirred at room temperature in 5 mL of methanol. An aqueous potassium hydroxide solution at the same molar equivalent to that of the metal complex dye D-5(1) was added thereto, and the mixture was stirred for 1 hour. The reaction solution was subjected to bubbling with nitrogen gas to distill off the solvent, and dried to obtain a metal complex dye D-5K(1).

In addition, in the same manner as the synthesis of the metal complex dye D-5K(1), a metal complex dye D-5K(2) was synthesized.

In this manner, a metal complex dye D-5K was synthesized.

In the metal complex dye D-5K, the presence ratio of the potassium ions was 1.0 mole with respect to the total molar amount of $M^1$ and $M^2$.

(ii) In the same manner as the synthesis of the metal complex dye D-5K, each of metal complex dyes D-5TBA, D-5Na, D-28K, and D-28Na was synthesized.

In each of the obtained metal complex dyes, the presence ratio of the salts was 1.0 mole with respect to the total molar amount of $M^1$ and $M^2$.

<Identification of Metal Complex Dye>

In the same manner as for the metal complex dye D-5, the metal complex dyes D-7, D-11, D-5K, D-5TBA, D-5Na, D-28K, D-28Na, D-44, D-49, D-51, and D-77 synthesized as above were confirmed and identified by mass spectrometry, an NMR spectrum, and HPLC measurement.

With regard to the respective metal complex dyes D-nX, in the same manner as for the metal complex dye D-5, it was confirmed that the retention time in HPLC of the metal complex dye D-nX(1) was the shortest, the retention time of the metal complex dye D-nX(2) was the second shortest, and the retention time of the metal complex dye D-nX(6) was the longest.

<Synthesis of Metal Complex Dyes D-C1 to D-C4>

In the same manner as the synthesis of the metal complex dye D-5, metal complex dyes D-C1 to D-C3 were synthesized. These metal complex dyes all correspond to the metal complex dye (1) and the metal complex dye (2), and trans forms thereof do not correspond to the metal complex dye (2A). In the present Example, these metal complex dyes were used for comparison to the second dye adsorption aspect, and thus, referred to as metal complex dyes D-C1 to D-C3. However, these metal complex dyes correspond to the metal complex dye (1) and the metal complex dye (2), as described above, and are not excluded from the present invention.

The metal complex dye D-C4 was synthesized in the same manner as the synthesis of the metal complex dye D-5 except that the compound d-2-9 was used instead of the compound d-2-6 in the synthesis of the metal complex dye D-5.

The synthesized metal complex dyes are shown below.

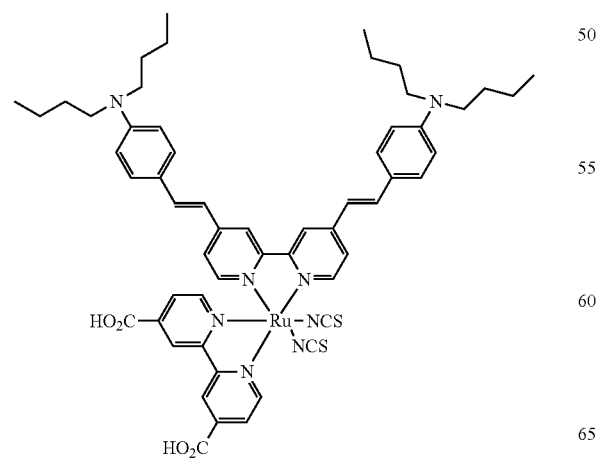

D-C1

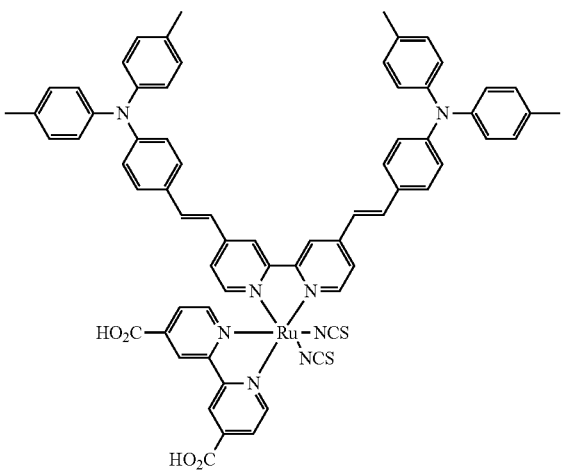

D-C2

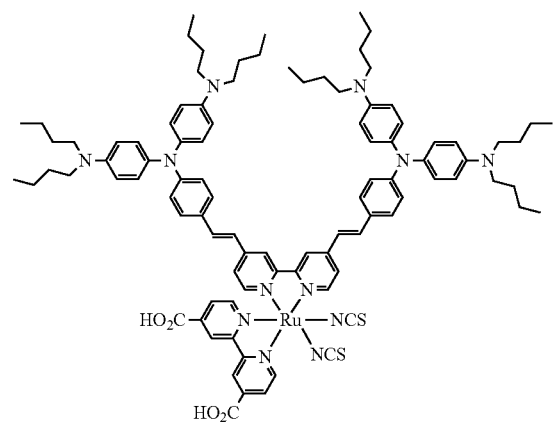

D-C3

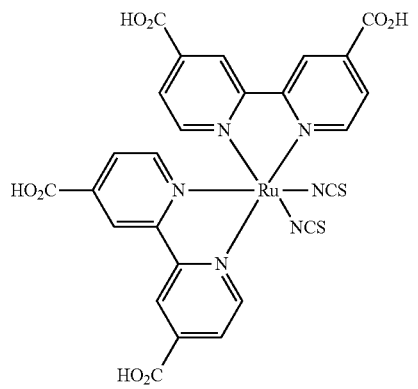

D-C4

Example 2 (Production of Dye-Sensitized Solar Cell)

A dye-sensitized solar cell 20 (in a scale of 5 mm×5 mm) shown in FIG. 2 was produced by a procedure shown below, using each of the metal complex dyes synthesized in Example 1, and the following performance was evaluated. The results are shown in Tables 1-1 to 1-5 (which are also referred to Table 1).

(Manufacture of Light-Receiving Electrode Precursor)

A conductive support 41 having a fluorine-doped $SnO_2$ conductive film (transparent conductive film 43, film thickness; 500 nm) formed on a glass substrate (substrate 44, thickness of 4 mm) was manufactured. Further, the glass substrate having the $SnO_2$ conductive film formed thereon was immersed in a 40 mM aqueous titanium trichloride solution for 30 minutes, washed with ultrapure water and ethanol, and then calcined at 450° C. to form a thin film layer of titanium oxide (metal oxide film, not shown in FIG. 2) on the $SnO_2$ conductive film. A titania paste "18NR-T" (manufactured by DyeSol) was screen-printed on the thin film layer, followed by drying at 120° C. Then, the titania paste "18NR-T" was screen-printed again, followed by drying at 120° C. for 1 hour. Thereafter, the dried titania paste was calcined at 500° C. to form a semiconductor layer 45 (film thickness: 10 µm). Further, a titania paste "18NR-AO" (manufactured by DyeSol) was screen-printed on this semiconductor layer 45, and then dried at 120° C. for 1 hour. Thereafter, the dried titania paste was calcined at 500° C. to form a light-scattering layer 46 (film thickness: 5 µm) on the semiconductor layer 45. Further, this glass substrate was immersed in a 20 mM aqueous titanium trichloride solution, and washed with ultrapure water and then with ethanol to form a titanium oxide layer (metal oxide film, not shown in FIG. 2) on the surface of a layer formed by calcination of the titania paste "18NR-AO". By this procedure, a photoconductor layer 42 (the area of the light-receiving surface; 5 mm×5 mm, film thickness; 15 µm) was formed on the $SnO_2$ conductive film, and thus, a light-receiving electrode precursor not carrying a metal complex dye was manufactured.

(Dye Absorbing Method)

Next, each of the metal complex dyes synthesized in Example 1 was carried onto the photoconductor layer 42 not carrying a metal complex dye in the following manner.

First, a dye composition containing no solvent was prepared. That is, the respective metal complex dyes shown in Table 1 were each mixed at the molar amount (% by mole) shown in Table 1 to prepare dye compositions, provided that in the metal complex dyes D-5K, D-5TBA, and D-5Na, the metal complex dye D-5(6) was used as the metal complex dye D-5X(6). In addition, in the metal complex dyes D-28K and D-28Na, the metal complex dye D-28(6) was used as the metal complex dye D-28X(6) in the same manner.

The dye compositions (for example, 13 types, that is, Sample Nos. 1 to 12, and c1) having different content ratios of the metal complex dyes, which have been prepared using the same metal complex dye D-n as described above, are referred to a dye composition group as one group in some cases.

Subsequently, dye solutions were prepared using the obtained dye compositions. That is, each of the obtained dye compositions was mixed in a mixed solvent of t-butanol to acetonitrile at 1:1 (volume ratio) such that the total concentration of the metal complex dyes became $2 \times 10^{-4}$ moles/L. In addition, chenodeoxycholic acid as a co-adsorbent in the amount of 10 moles with respect to 1 mole of the metal complex dye was added thereto to prepare each of dye solutions.

The light-receiving electrode precursor was immersed in each of the dye solutions prepared above at 25° C. for 5 hours, taken out from the dye solutions and then dried to manufacture each light-receiving electrode 40 having the metal complex dye (dye composition) carried on the light-receiving electrode precursor.

(Assembly of Dye-Sensitized Solar Cell)

A platinum electrode (thickness of a Pt thin film; 100 nm) having the same shape and size as those of the conductive support 41 was manufactured as the counter electrode 48. Further, 0.1 M (mol/L) of iodine, 0.1 M of lithium iodide, 0.005 M of 4-t-butylpyridine, and 0.6 M of 1,2-dimethyl-3-propylimidazolium iodide were dissolved in acetonitrile to prepare a liquid electrolyte as an electrolytic solution. In addition, Spacer-S (trade name: "SURLYN") manufactured by DuPont, which has a shape matching to the size of the photoconductor layer 42, was prepared.

Each of the light-receiving electrodes 40 manufactured as above and the counter electrode 48 was arranged to face each other through the Spacer S, and thermally compressed, and then the liquid electrolyte was filled from the inlet for the electrolytic solution between the photoconductor layer 42 and the counter electrode 48, thereby forming a charge transfer layer 47. The outer periphery and the inlet for the electrolytic solution of the cell thus manufactured were sealed and cured using RESIN XNR-5516 manufactured by Nagase ChemteX Corporation, thereby producing each of dye-sensitized solar cells (Sample Nos. 1 to 140 and c1 to c22).

With regard to the dye-sensitized solar cells, in the same manner as for the dye compositions, the dye-sensitized solar cells obtained using the same metal complex dye D-n are referred to as a dye-sensitized solar cell group as one group in some cases.

<Content Ratio of Metal Complex Dye in Dye-Sensitized Solar Cell>

In each of the produced dye-sensitized solar cells (Sample Nos. 1 to 140), the content ratios of the respective metal complex dyes adsorbed onto the semiconductor fine particles were measured. Specifically, the photoconductor layer of each of the dye-sensitized solar cells was immersed in a solution of tetrabutylammonium hydroxide in methanol to elute the metal complex dye. This eluted solution was measured by HPLC under the measurement condition to determine an adsorption amount of each of the metal complex dyes adsorbed onto the semiconductor fine particles of the dye-sensitized solar cells. The content ratio of the metal complex dyes was calculated, based on the adsorption amounts of the metal complex dye (1), the metal complex dye (2), and the metal complex dye (6). As a result, the content ratios of the metal complex dyes in each of the dye-sensitized solar cells approximately coincided with the content ratios of the metal complex dyes in the dye compositions used.

<Presence Ratio of Metal Cation and Non-Metal Cation in Dye-Sensitized Solar Cell>

With regard to each of the produced dye-sensitized solar cells D-5K, D-5TBA, D-5Na, D-28K, and D-28Na, the presence ratio of the metal cation and the non-metal cation was measured from the contents of the metal cation and the non-metal cation obtained as below were measured. As a result, they approximately coincided with the ratios upon the synthesis.

At the same content ratios of those of the above-mentioned metal complex dyes, 0.01 g of a dye sample obtained by elution from the dye-sensitized solar cell was weighed, and 5 mL of nitric acid and 1 mL of hydrochloric acid were added thereto. The mixture was put into a Teflon (registered trademark)-made vessel and subjected to an ashing treatment in a microwave. The residue was diluted to 40 mL by the addition of water, and the content of the metal cation was determined by means of inductively coupled plasma optical emission spectroscopy (ICP-OES).

In addition, the dye sample was dissolved in dimethyl sulfoxide-d6 (DMSO-d6) and its $^1$H-NMR spectrum was measured to determine the content of the non-metal cation.

<Evaluation of Photoelectric Conversion Efficiency~Evaluation Method [A] (High-Illumination: Solar Light)>

A cell characteristic test was performed using each of the produced dye-sensitized solar cells. The cell characteristic test was performed by irradiating each of the dye-sensitized solar cells with an artificial solar light at 1,000 W/m² (100,000 lux)) from a xenon lamp through an AM1.5G filter, using a solar simulator "PEC-L15" (manufactured by Peccell Technologies, Inc.). The photoelectric conversion efficiency was determined by measuring the current-voltage characteristics of each of the dye-sensitized solar cells irradiated with the artificial solar light using a source meter "Keithley 2401" (manufactured by Tektronix, Inc.). The obtained photoelectric conversion efficiency was defined as a conversion efficiency [A].

In each of the dye-sensitized solar cell groups, a relative value of each of the obtained conversion efficiencies [A] relative to the conversion efficiency [$A_{(1)}$] of the dye-sensitized solar cell having only the metal complex dye (1) adsorbed thereon was determined.

Determination on which of the following evaluation ranks was granted on the obtained relative values was performed.

With regard to the evaluation of the conversion efficiency [A] in the present test, an evaluation rank C or higher is practically required, with the ranks S, A, and B being preferable.

S: More than 1.3 times
A: More than 1.2 times and 1.3 times or less
B: More than 1.1 times and 1.2 times or less
C: More than 1.0 times and 1.1 times or less
D: More than 0.9 times and 1.0 times or less
CL: 1.0 time (standard)

The conversion efficiency [A] of each of the dye-sensitized solar cells of Sample Nos. 1 to 140 sufficiently functioned as a dye-sensitized solar cell.

<Evaluation of Photoelectric Conversion Efficiency~Evaluation Method [B] (Low-Illumination Environment: Indoor Light)>

A cell characteristic test was carried out using each of the produced dye-sensitized solar cells. The cell characteristic test was carried out using a white light emitting diode (LED) (Product No.: LDA8N-G-K/D/60 W) manufactured by Toshiba. Adjustment of luminance (300 µW/cm² (1,000 lux)) was carried out with ND filters (ND1 to ND80) commercially available from Shibuya Optical Co., Ltd. Measurement of the adjusted luminance was confirmed using a spectrophotometer USB4000 manufactured by Ocean Photonics, Inc.

The photoelectric conversion efficiency was determined by measuring the current-voltage characteristics of each of the dye-sensitized solar cells irradiated with light having a luminance adjusted using a source meter "Keithley 2401" (manufactured by Tektronix, Inc.). The obtained photoelectric conversion efficiency was defined as a conversion efficiency [B].

In each of the dye-sensitized solar cell groups, a relative value of each of the obtained conversion efficiencies [B] relative to the conversion efficiency [$B_{(1)}$] of the dye-sensitized solar cell having only the metal complex dye (1) adsorbed thereon was determined.

Determination on which of the following evaluation ranks were granted on the obtained relative values was performed.

With regard to the evaluation of the conversion efficiency [B] in the present test, an evaluation rank C or higher is practically required, with the ranks S, A, and B being preferable.

S: More than 1.3 times
A: More than 1.2 times and 1.3 times or less
B: More than 1.1 times and 1.2 times or less
C: More than 1.0 times and 1.1 times or less
D: More than 0.9 times and 1.0 times or less
E: More than 0.8 times and 0.9 times or less
CL: 1.0 time (standard)

The conversion efficiency [B] of each of the dye-sensitized solar cells of Sample Nos. 1 to 140 sufficiently functioned as a dye-sensitized solar cell.

<Measurement of Action Spectrum>

With regard to each of the produced dye-sensitized solar cells, an action spectrum (IPCE spectrum) was measured.

Action Spectrum (IPCE) Measuring Device: An action spectrum was obtained by irradiating each of the dye-sensitized solar cells with an artificial solar light at 100 mW/cm² from a xenon lamp at 150 W through an AM1.5G filter, using an action spectrum (IPCE) measuring device: PEC-S20 (trade name, manufactured by Peccell Technologies, Inc.). In the obtained action spectrum, IPCE (external quantum yield) [C] at a wavelength of 750 nm was determined.

In each of the dye-sensitized solar cell groups, a relative value of the each obtained IPCE [C] relative to the IPCE (external quantum yield) [$C_{(1)}$] at a wavelength of 750 nm of the dye-sensitized solar cell having only the metal complex dye (1) adsorbed thereon was determined.

Determination on which of the following evaluation ranks were granted on the obtained relative values was performed.

With regard to the evaluation of the IPCE (external quantum yield) [C] at a wavelength of 750 nm in the present test, an evaluation rank C or higher is practically required, with the ranks S, A, and B being preferable.

S: More than 3.0 times
A: More than 2.0 times and 3.0 times or less
B: More than 1.1 times and 2.0 times or less
C: More than 1.0 times and 1.1 times or less
D: More than 0.9 times and 1.0 times or less
E: More than 0.8 times and 0.9 times or less
CL: 1.0 time (standard)

The IPCE (external quantum yield) [C] at a wavelength of 750 nm of each of the dye-sensitized solar cells of Sample Nos. 1 to 140 sufficiently functioned as a dye-sensitized solar cell.

<Evaluation of Heat Resistance Durability>

With regard to each of the dye-sensitized solar cells, the above-mentioned conversion efficiency [A] was measured as described above, and then left to stand in a dark environment at a temperature of 85° C. for 1,000 hours. Thereafter, in the same manner as the conversion efficiency [A], the conversion efficiency [D] after 85° C. heat resistance aging was measured.

In each of the dye-sensitized solar cell groups, a relative value of each of the obtained conversion efficiencies [D] relative to the conversion efficiency [$D_{(1)}$] of the dye-sensitized solar cell having only the metal complex dye (1) adsorbed thereon was determined.

Determination on which of the following evaluation ranks were granted on the obtained relative values was performed.

With regard to the evaluation of the conversion efficiency [D] in the present test, an evaluation rank B or higher is practically required, with the ranks S and A being preferable.

S: 1.025 times or more
A: 1.020 times or more and less than 1.025
B: 1.015 times or more and less than 1.020
C: 1.010 times or more and less than 1.015
CL: 1.0 time (standard)

Each of the dye-sensitized solar cells of Sample Nos. 1 to 140 sufficiently functioned in terms of the conversion efficiency [D] as a dye-sensitized solar cell.

TABLE 1

| Sample No. | Metal complex dye | Content ratio (% by mole) Metal complex dye (1) | Content ratio (% by mole) Metal complex dye (2) | Content ratio (% by mole) Metal complex dye (6) | Conversion efficiency [A] | Conversion efficiency [B] | IPCE at 750 nm | Heat resistance durability | Note |
|---|---|---|---|---|---|---|---|---|---|
| 1 | D-7 | 99.8 | 0.2 | 0 | B | A | B | B | The present invention |
| 2 | | 99.5 | 0.5 | 0 | A | A | B | B | The present invention |
| 3 | | 99 | 1 | 0 | A | A | B | B | The present invention |
| 4 | | 90 | 10 | 0 | A | A | B | B | The present invention |
| 5 | | 80 | 20 | 0 | A | A | B | B | The present invention |
| 6 | | 75 | 25 | 0 | A | A | A | B | The present invention |
| 7 | | 70 | 30 | 0 | A | B | A | B | The present invention |
| 8 | | 50 | 50 | 0 | A | B | A | B | The present invention |
| 9 | | 25 | 75 | 0 | A | B | S | B | The present invention |
| 10 | | 0 | 100 | 0 | C | C | S | B | The present invention |
| 11 | | 97.8 | 0.2 | 2 | A | A | B | A | The present invention |
| 12 | | 78 | 20 | 2 | S | A | A | A | The present invention |
| c1 | | 100 | 0 | 0 | CL | CL | CL | CL | Comparative Example |
| 13 | D-5 | 99.8 | 0.2 | 0 | B | B | B | A | The present invention |
| 14 | | 99.5 | 0.5 | 0 | A | B | B | A | The present invention |
| 15 | | 99 | 1 | 0 | A | B | B | A | The present invention |
| 16 | | 90 | 10 | 0 | A | B | B | A | The present invention |
| 17 | | 80 | 20 | 0 | S | A | A | A | The present invention |
| 18 | | 75 | 25 | 0 | S | A | A | A | The present invention |
| 19 | | 70 | 30 | 0 | A | A | A | A | The present invention |
| 20 | | 50 | 50 | 0 | A | A | A | A | The present invention |
| 21 | | 25 | 75 | 0 | A | B | S | A | The present invention |
| 22 | | 0 | 100 | 0 | C | C | S | A | The present invention |
| 23 | | 97.8 | 0.2 | 2 | A | A | B | S | The present invention |
| 24 | | 78 | 20 | 2 | S | S | A | S | The present invention |
| c2 | | 100 | 0 | 0 | CL | CL | CL | CL | Comparative Example |
| 25 | D-11 | 99.8 | 0.2 | 0 | B | B | B | B | The present invention |
| 26 | | 99.5 | 0.5 | 0 | B | B | B | B | The present invention |
| 27 | | 99 | 1 | 0 | A | B | B | B | The present invention |
| 28 | | 90 | 10 | 0 | A | A | B | A | The present invention |
| 29 | | 80 | 20 | 0 | A | A | B | A | The present invention |
| 30 | | 75 | 25 | 0 | A | A | A | A | The present invention |
| 31 | | 70 | 30 | 0 | A | B | A | A | The present invention |
| 32 | | 50 | 50 | 0 | A | B | A | A | The present invention |
| 33 | | 25 | 75 | 0 | A | B | S | B | The present invention |
| 34 | | 0 | 100 | 0 | C | C | S | B | The present invention |
| 35 | | 97.8 | 0.2 | 2 | A | A | B | A | The present invention |
| 36 | | 78 | 20 | 2 | S | A | B | A | The present invention |
| c3 | | 100 | 0 | 0 | CL | CL | CL | CL | Comparative Example |
| 37 | D-5K | 99.8 | 0.2 | 0 | A | B | B | A | The present invention |
| 38 | | 99.5 | 0.5 | 0 | A | B | B | A | The present invention |
| 39 | | 99 | 1 | 0 | A | A | B | A | The present invention |
| 40 | | 90 | 10 | 0 | S | A | B | A | The present invention |
| 41 | | 80 | 20 | 0 | S | A | A | A | The present invention |
| 42 | | 75 | 25 | 0 | S | A | A | A | The present invention |
| 43 | | 70 | 30 | 0 | A | A | A | A | The present invention |
| 44 | | 50 | 50 | 0 | A | A | A | A | The present invention |
| 45 | | 25 | 75 | 0 | A | B | S | A | The present invention |
| 46 | | 0 | 100 | 0 | C | C | S | A | The present invention |
| 47 | | 97.8 | 0.2 | 2 | A | A | B | S | The present invention |
| 48 | | 78 | 20 | 2 | S | S | A | S | The present invention |
| c4 | | 100 | 0 | 0 | CL | CL | CL | CL | Comparative Example |
| 49 | D-5TBA | 99.8 | 0.2 | 0 | A | B | B | A | The present invention |
| 50 | | 99.5 | 0.5 | 0 | A | B | B | A | The present invention |
| 51 | | 99 | 1 | 0 | A | A | B | A | The present invention |
| 52 | | 90 | 10 | 0 | S | A | B | A | The present invention |
| 53 | | 80 | 20 | 0 | S | S | A | A | The present invention |
| 54 | | 75 | 25 | 0 | S | S | A | A | The present invention |
| 55 | | 70 | 30 | 0 | A | A | A | A | The present invention |
| 56 | | 50 | 50 | 0 | A | A | A | A | The present invention |
| 57 | | 25 | 75 | 0 | A | B | S | A | The present invention |
| 58 | | 0 | 100 | 0 | C | C | S | A | The present invention |
| 59 | | 97.8 | 0.2 | 2 | A | A | B | S | The present invention |
| 60 | | 78 | 20 | 2 | S | S | A | S | The present invention |
| c5 | | 100 | 0 | 0 | CL | CL | CL | CL | Comparative Example |
| 61 | D-5Na | 99.8 | 0.2 | 0 | B | B | B | A | The present invention |
| 62 | | 99.5 | 0.5 | 0 | A | B | B | A | The present invention |
| 63 | | 99 | 1 | 0 | A | A | B | A | The present invention |
| 64 | | 90 | 10 | 0 | S | A | B | A | The present invention |
| 65 | | 80 | 20 | 0 | S | A | A | A | The present invention |
| 66 | | 75 | 25 | 0 | S | A | A | A | The present invention |
| 67 | | 70 | 30 | 0 | A | A | A | A | The present invention |
| 68 | | 50 | 50 | 0 | A | B | A | A | The present invention |

TABLE 1-continued

| | | Content ratio (% by mole) | | | Conversion efficiency | | | | |
|---|---|---|---|---|---|---|---|---|---|
| Sample No. | Metal complex dye | Metal complex dye (1) | Metal complex dye (2) | Metal complex dye (6) | [A] | [B] | IPCE at 750 nm | Heat resistance durability | Note |
| 69 | | 25 | 75 | 0 | A | B | S | A | The present invention |
| 70 | | 0 | 100 | 0 | C | C | S | B | The present invention |
| 71 | | 97.8 | 0.2 | 2 | A | A | B | S | The present invention |
| 72 | | 78 | 20 | 2 | S | S | A | S | The present invention |
| c6 | | 100 | 0 | 0 | CL | CL | CL | CL | Comparative Example |
| 73 | D-28K | 99.8 | 0.2 | 0 | B | B | B | B | The present invention |
| 74 | | 99.5 | 0.5 | 0 | A | B | B | B | The present invention |
| 75 | | 99 | 1 | 0 | A | B | B | B | The present invention |
| 76 | | 90 | 10 | 0 | A | B | B | B | The present invention |
| 77 | | 80 | 20 | 0 | A | B | B | B | The present invention |
| 78 | | 75 | 25 | 0 | A | B | B | B | The present invention |
| 79 | | 70 | 30 | 0 | B | B | A | B | The present invention |
| 80 | | 50 | 50 | 0 | B | B | A | B | The present invention |
| 81 | | 25 | 75 | 0 | B | B | S | B | The present invention |
| 82 | | 0 | 100 | 0 | C | C | S | B | The present invention |
| 83 | | 97.8 | 0.2 | 2 | A | A | B | A | The present invention |
| 84 | | 78 | 20 | 2 | A | A | B | A | The present invention |
| c7 | | 100 | 0 | 0 | CL | CL | CL | CL | Comparative Example |
| 85 | D-28Na | 99.8 | 0.2 | 0 | B | B | B | B | The present invention |
| 86 | | 99.5 | 0.5 | 0 | A | B | B | B | The present invention |
| 87 | | 99 | 1 | 0 | A | B | B | B | The present invention |
| 88 | | 90 | 10 | 0 | A | B | B | B | The present invention |
| 89 | | 80 | 20 | 0 | A | B | B | B | The present invention |
| 90 | | 75 | 25 | 0 | A | B | B | B | The present invention |
| 91 | | 70 | 30 | 0 | B | B | A | B | The present invention |
| 92 | | 50 | 50 | 0 | B | B | A | B | The present invention |
| 93 | | 25 | 75 | 0 | B | B | S | B | The present invention |
| 94 | | 0 | 100 | 0 | C | C | S | B | The present invention |
| 95 | | 97.8 | 0.2 | 2 | A | A | B | A | The present invention |
| 96 | | 78 | 20 | 2 | A | A | B | A | The present invention |
| c8 | | 100 | 0 | 0 | CL | CL | CL | CL | Comparative Example |
| 97 | D-44 | 99.8 | 0.2 | 0 | B | A | B | B | The present invention |
| 98 | | 99.5 | 0.5 | 0 | A | A | B | B | The present invention |
| 99 | | 99 | 1 | 0 | A | A | B | B | The present invention |
| 100 | | 90 | 10 | 0 | A | A | B | B | The present invention |
| 101 | | 80 | 20 | 0 | A | A | B | B | The present invention |
| 102 | | 75 | 25 | 0 | A | A | B | B | The present invention |
| 103 | | 70 | 30 | 0 | A | B | A | B | The present invention |
| 104 | | 50 | 50 | 0 | A | B | A | B | The present invention |
| 105 | | 25 | 75 | 0 | A | B | S | B | The present invention |
| 106 | | 97.8 | 0.2 | 2 | A | A | B | A | The present invention |
| 107 | | 78 | 20 | 2 | S | A | B | A | The present invention |
| c9 | | 100 | 0 | 0 | CL | CL | CL | CL | Comparative Example |
| 108 | D-49 | 99.8 | 0.2 | 0 | B | A | B | B | The present invention |
| 109 | | 99.5 | 0.5 | 0 | B | A | B | B | The present invention |
| 110 | | 99 | 1 | 0 | A | A | B | B | The present invention |
| 111 | | 90 | 10 | 0 | A | A | B | B | The present invention |
| 112 | | 80 | 20 | 0 | A | A | B | B | The present invention |
| 113 | | 75 | 25 | 0 | A | A | B | B | The present invention |
| 114 | | 70 | 30 | 0 | A | B | A | B | The present invention |
| 115 | | 50 | 50 | 0 | A | B | A | B | The present invention |
| 116 | | 25 | 75 | 0 | A | B | S | B | The present invention |
| 117 | | 97.8 | 0.2 | 2 | A | A | B | A | The present invention |
| 118 | | 78 | 20 | 2 | S | A | B | A | The present invention |
| c10 | | 100 | 0 | 0 | CL | CL | CL | CL | Comparative Example |
| 119 | D-51 | 99.8 | 0.2 | 0 | B | A | B | B | The present invention |
| 120 | | 99.5 | 0.5 | 0 | B | A | B | B | The present invention |
| 121 | | 99 | 1 | 0 | A | A | B | B | The present invention |
| 122 | | 90 | 10 | 0 | A | A | B | B | The present invention |
| 123 | | 80 | 20 | 0 | A | A | B | B | The present invention |
| 124 | | 75 | 25 | 0 | A | A | A | B | The present invention |
| 125 | | 70 | 30 | 0 | A | B | A | B | The present invention |
| 126 | | 50 | 50 | 0 | A | B | A | B | The present invention |
| 127 | | 25 | 75 | 0 | A | B | S | B | The present invention |
| 128 | | 97.8 | 0.2 | 2 | A | A | B | A | The present invention |
| 129 | | 78 | 20 | 2 | S | A | A | A | The present invention |
| c11 | | 100 | 0 | 0 | CL | CL | CL | CL | Comparative Example |
| 130 | D-77 | 99.8 | 0.2 | 0 | C | C | B | B | The present invention |
| 131 | | 99.5 | 0.5 | 0 | C | C | B | B | The present invention |
| 132 | | 99 | 1 | 0 | C | B | B | B | The present invention |
| 133 | | 90 | 10 | 0 | C | B | B | B | The present invention |
| 134 | | 80 | 20 | 0 | B | B | B | B | The present invention |
| 135 | | 75 | 25 | 0 | B | B | B | B | The present invention |

TABLE 1-continued

| Sample No. | Metal complex dye | Content ratio (% by mole) | | | Conversion efficiency | | IPCE at 750 nm | Heat resistance durability | Note |
|---|---|---|---|---|---|---|---|---|---|
| | | Metal complex dye (1) | Metal complex dye (2) | Metal complex dye (6) | [A] | [B] | | | |
| 136 | | 70 | 30 | 0 | B | C | B | B | The present invention |
| 137 | | 50 | 50 | 0 | B | C | B | B | The present invention |
| 138 | | 25 | 75 | 0 | C | C | A | B | The present invention |
| 139 | | 97.8 | 0.2 | 2 | C | B | B | B | The present invention |
| 140 | | 78 | 20 | 2 | B | B | B | B | The present invention |
| c12 | | 100 | 0 | 0 | CL | CL | CL | CL | Comparative Example |
| c13 | D-C1 | 0 | 100 | 0 | E | E | B | C | Comparative Example |
| c14 | | 100 | 0 | 0 | CL | CL | CL | CL | Comparative Example |
| c15 | D-C2 | 0 | 100 | 0 | E | E | B | C | Comparative Example |
| c16 | | 100 | 0 | 0 | CL | CL | CL | CL | Comparative Example |
| c17 | D-C3 | 0 | 100 | 0 | E | E | B | C | Comparative Example |
| c18 | | 100 | 0 | 0 | CL | CL | CL | CL | Comparative Example |
| c19 | D-C4 | 0 | 100 | 0 | E | E | B | C | Comparative Example |
| c20 | | 50 | 50 | 0 | D | D | C | C | Comparative Example |
| c21 | | 80 | 20 | 0 | D | D | C | C | Comparative Example |
| c22 | | 100 | 0 | 0 | CL | CL | CL | CL | Comparative Example |

In Table 1, the dye-sensitized solar cells of Sample Nos. 10, 22, 34, 46, 58, 70, 82, and 94 carry the metal complex dye (2A) as a sensitizing dye, and thus, they correspond to Examples of the second dye adsorption aspect.

Furthermore, in Table 1, in Sample Nos. 1 to 140, the dye-sensitized solar cells other than the second dye adsorption aspect carry the metal complex dye (1) and metal complex dye (2) as a sensitizing dye, and thus, they correspond to Examples of the first dye adsorption aspect.

From the results of Table 1, the following findings could be obtained.

The dye-sensitized solar cells (Sample Nos. c19 to c21) carrying the metal complex dye D-C4 which does not correspond to any of the metal complex dyes (1), (2), and (6) are not sufficient in at least conversion efficiency and heat resistance durability.

In contrast, any of the dye-sensitized solar cells (Sample Nos. 1 to 140) of the embodiment of the present invention are excellent in photoelectric conversion efficiency, external quantum efficiency for long-wavelength light, and heat resistance durability, irrespective of the dye adsorption aspects.

In each of the dye-sensitized solar cell groups, the dye-sensitized solar cells carrying the metal complex dye in the first dye adsorption aspect had high conversion efficiency [A] and [B] as well as high external quantum efficiency for long-wavelength light, and excellent heat resistance durability, as compared with the dye-sensitized solar cells (Sample Nos. c1 to c11) carrying only the metal complex dye (1). In particular, it could be confirmed that in a case where three kinds of metal complex dyes, that is, the metal complex dye (1), the metal complex dye (2), and the metal complex dye (6) are used in combination, an effect of improving the conversion efficiency, the external quantum efficiency for long-wavelength light, and the heat resistance durability is further enhanced.

The dye-sensitized solar cells (Sample Nos. c13, c15 and c17) carrying the metal complex dyes D-C1 to D-C3 which are included in the metal complex dye (2), but not included in the metal complex dye (2A) are not sufficient in an effect of improving the conversion efficiency [A] and [B] and an effect of improving heat resistance durability, as compared with the dye-sensitized solar cells (Sample Nos. c14, c16, and c18) carrying only the metal complex dye (1).

In contrast, the dye-sensitized solar cells carrying the metal complex dye (2A) in the second dye adsorption aspect in each of the dye-sensitized solar cell groups exhibit an effect of improving the conversion efficiencies [A] and [B] and a sufficient effect of improving external quantum efficiency for long-wavelength light and heat resistance durability although the effects do not reach those of the first dye adsorption aspect.

EXPLANATION OF REFERENCES 1, 41 conductive support
2, 42 photoconductor layer (oxide semiconductor electrode)
21 dye
22 semiconductor fine particles
3, 47 charge transfer layer
4, 48 counter electrode
5, 40 light-receiving electrode
6 circuit
10 photoelectric conversion element
100 system in which photoelectric conversion element is applied to cell uses
M operating means (for example, electric motor)
20 dye-sensitized solar cell
43 transparent conductive film
44 substrate
45 semiconductor layer
46 light-scattering layer
S spacer

What is claimed is:

1. A photoelectric conversion element comprising:
a conductive support;
a photoconductor layer including an electrolyte;
a charge transfer layer including an electrolyte; and
a counter electrode,
wherein the photoconductor layer has semiconductor fine particles carrying a metal complex dye represented by Formula (1) and a metal complex dye represented by Formula (2), Formula (1)

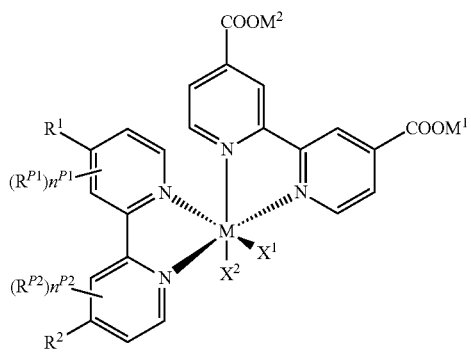

Formula (2)

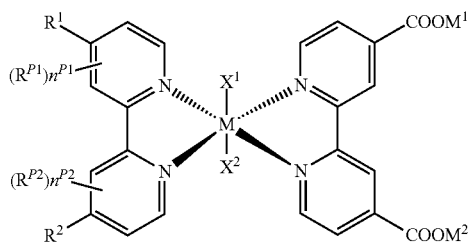

in Formula (1) and Formula (2),

M represents a metal ion, $R^1$ and $R^2$ each independently represent a group represented by Formula (4), $R^{P1}$ and $R^{P2}$ each independently represent an alkyl group, an alkoxy group, an alkylthio group, an aryl group, a heteroaryl group, an amino group, or a halogen atom, and $n^{P1}$ and $n^{P2}$ are each independently an integer of 0 to 3, $X^1$ and $X^2$ each independently represent a monodentate ligand, and $M^1$ and $M^2$ each independently represent any one of a proton, a metal cation, or a non-metal cation, Formula (4)

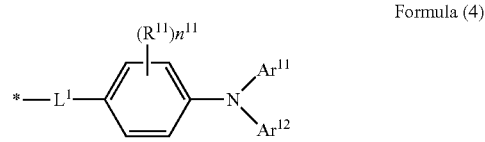

in Formula (4), $L^1$ represents a single bond or an ethenylene group, $Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, and $Ar^{11}$ and $Ar^{12}$ are not bonded to each other, $R^{11}$ represents an alkyl group, an alkoxy group, an alkylthio group, an aryl group, a heteroaryl group, an amino group, or a halogen atom, and $n^{11}$ is an integer of 0 to 4, and

* represents a bonding moiety to a pyridine ring in each of Formula (1) and Formula (2), <Substituent Group $S_{Ar}$> a branched alkyl group, an alkylthio group, an arylthio group, or a heteroaryl group.

2. The photoelectric conversion element according to claim 1, wherein $R^1$ and $R^2$ are each independently represented by any one of Formulae (3-1) to (3-4), Formula (3-1)

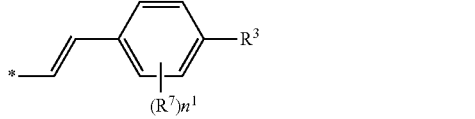

Formula (3-2)

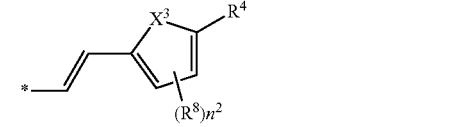

Formula (3-3)

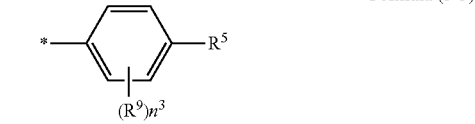

Formula (3-4)

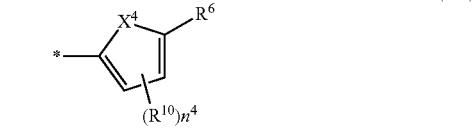

in the formulae, $R^3$ to $R^6$ each independently represent a hydrogen atom, an alkyl group, an alkenyl group, an alkynyl group, an alkoxy group, an alkylthio group, an aryl group, a heteroaryl group, an amino group, or a halogen atom, $R^7$ to $R^{10}$ each independently represent an alkyl group, an alkenyl group, an alkynyl group, an alkoxy group, an alkylthio group, an aryl group, a heteroaryl group, an amino group, or a halogen atom, $n^1$ and $n^3$ are each independently an integer of 0 to 4, and $n^2$ and $n^4$ are each independently an integer of 0 to 2, $X^3$ and $X^4$ each independently represent a sulfur atom or an oxygen atom, and

* represents a bonding moiety to a pyridine ring in each of Formula (1) and Formula (2).

3. The photoelectric conversion element according to claim 1, wherein $X^1$ and $X^2$ each independently represent an isothiocyanate group or a thiocyanate group.

4. The photoelectric conversion element according to claim 1, wherein $Ar^{11}$ and $Ar^{12}$ are each independently represented by any one of Formula (5-1) to Formula (5-5), Formula (5-1)

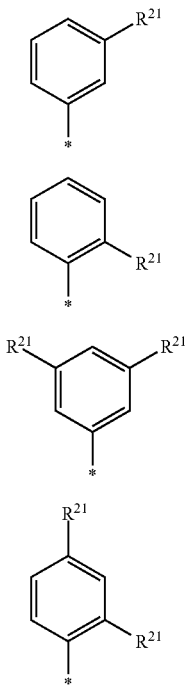

Formula (5-2)

Formula (5-3)

Formula (5-4)

Formula (5-5)

in Formula (5-1) to Formula (5-3), $R^{21}$ represents a branched alkyl group, or a heteroaryl group, in Formula (5-4) and Formula (5-5), $R^{21}$ represents a branched alkyl group, or a heteroaryl group, and * represents a bonding moiety to a nitrogen atom in Formula (4).

5. The photoelectric conversion element according to claim 1,
wherein the semiconductor fine particles further carry a metal complex dye represented by Formula (6),

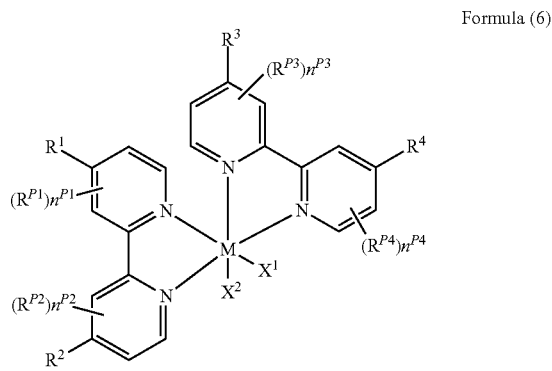

Formula (6)

in the Formula (6), M represents a metal ion,
$R^1$ to $R^4$ each independently represent an alkenyl group, an alkynyl group, an aryl group, or a heteroaryl group,
$R^{P1}$ to $R^{P4}$ each independently represent an alkyl group, an alkoxy group, an alkylthio group, an aryl group, a heteroaryl group, an amino group, or a halogen atom, and $n^{P1}$ to $n^{P4}$ are each independently an integer of 0 to 3, and
$X^1$ and $X^2$ each independently represent a monodentate ligand.

6. A photoelectric conversion element comprising:
a conductive support;
a photoconductor layer including an electrolyte;
a charge transfer layer including an electrolyte; and
a counter electrode,
wherein the photoconductor layer has semiconductor fine particles carrying a metal complex dye represented by Formula (2A),

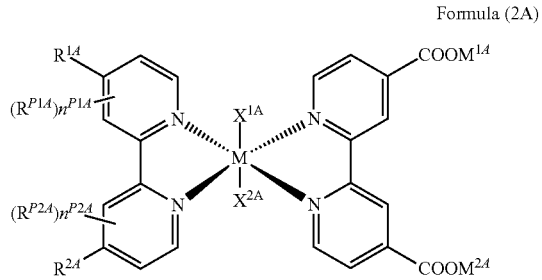

Formula (2A)

in Formula (2A), M represents a metal ion,
$R^{1A}$ and $R^{2A}$ each independently represent a group represented by Formula (4),
$R^{P1A}$ and $R^{P2A}$ each independently represent an alkyl group, an alkoxy group, an alkylthio group, an aryl group, a heteroaryl group, an amino group, or a halogen atom, and $n^{P1A}$ and $n^{P2A}$ are each independently an integer of 0 to 3,
$X^{1A}$ and $X^{1A}$ each independently represent a monodentate ligand, and
$M^{1A}$ and $M^{2A}$ each independently represent any one of a proton, a metal cation, or a non-metal cation,

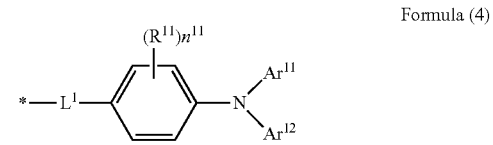

Formula (4)

in Formula (4), $L^1$ represents a single bond or an ethenylene group,
$Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, and $Ar^{11}$ and $Ar^{12}$ are not bonded to each other,
$R^{11}$ represents an alkyl group, an alkoxy group, an alkylthio group, an aryl group, a heteroaryl group, an amino group, or a halogen atom, and $n^{11}$ is an integer of 0 to 4, and
* represents a bonding moiety to a pyridine ring in Formula (2A),
<Substituent Group $S_{Ar}$>
a branched alkyl group, an alkylthio group, an arylthio group, or a heteroaryl group.

7. The photoelectric conversion element according to claim 1, further comprising a metal oxide film on a surface of at least one of the conductive support or the semiconductor fine particles.

8. A dye-sensitized solar cell comprising the photoelectric conversion element according to claim 1.

9. A dye composition comprising a metal complex dye represented by Formula (1) and a metal complex dye represented by Formula (2), Formula (1)

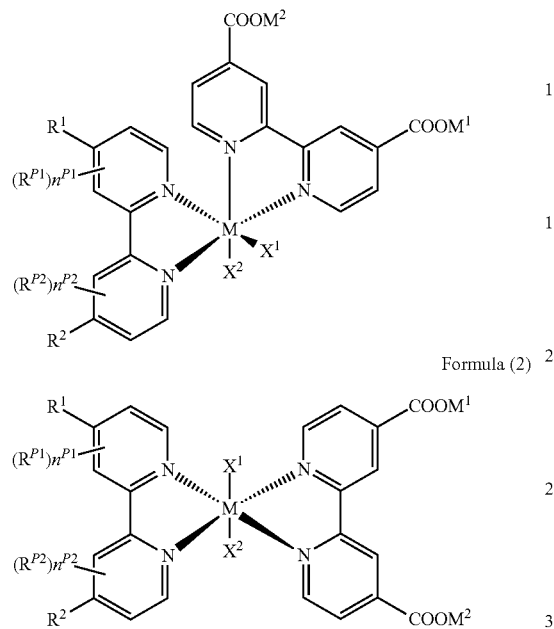

Formula (2)

in Formula (1) and Formula (2), M represents a metal ion,
$R^1$ and $R^2$ each independently represent a group represented by Formula (4),
$R^{P1}$ and $R^{P2}$ each independently represent an alkyl group, an alkoxy group, an alkylthio group, an aryl group, a heteroaryl group, an amino group, or a halogen atom, and $n^{P1}$ and $n^{P2}$ are each independently an integer of 0 to 3,
$X^1$ and $X^2$ each independently represent a monodentate ligand, and
$M^1$ and $M^2$ each independently represent any one of a proton, a metal cation, or a non-metal cation, Formula (4)

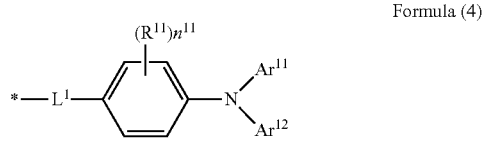

in Formula (4), $L^1$ represents a single bond or an ethenylene group,
$Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, and $Ar^{11}$ and $Ar^{12}$ are not bonded to each other,
$R^{11}$ represents an alkyl group, an alkoxy group, an alkylthio group, an aryl group, a heteroaryl group, an amino group, or a halogen atom, and $n^{11}$ is an integer of 0 to 4, and
* represents a bonding moiety to a pyridine ring in each of Formula (1) and Formula (2), <Substituent Group $S_{Ar}$>
a branched alkyl group, an alkylthio group, an arylthio group, or a heteroaryl group.

10. The dye composition according to claim 9, further comprising a metal complex dye represented by Formula (6), Formula (6)

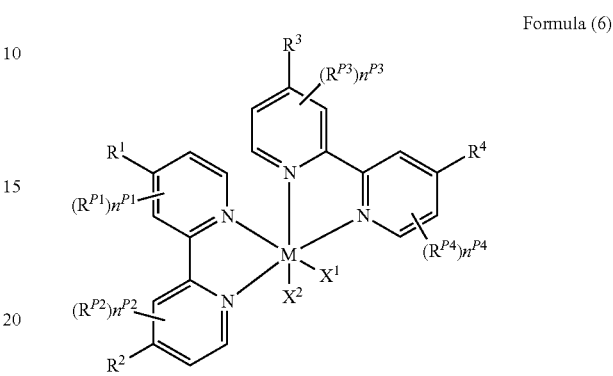

in Formula (6), M represents a metal ion,
$R^1$ to $R^4$ each independently represent an alkenyl group, an alkynyl group, an aryl group, or a heteroaryl group,
$R^{P1}$ to $R^{P4}$ each independently represent an alkyl group, an alkoxy group, an alkylthio group, an aryl group, a heteroaryl group, an amino group, or a halogen atom, and $n^{P1}$ to $n^{P4}$ are each independently an integer of 0 to 3, and
$X^1$ and $X^2$ each independently represent a monodentate ligand.

11. The dye composition according to claim 9, further comprising a total of 0.000001 to 1.5 moles of a metal cation and a non-metal cation in the total molar amount of $M^1$ and $M^2$ contained in the metal complex dye represented by Formula (1) and the metal complex dye represented by Formula (2).

12. The dye composition according to claim 10, further comprising a total of 0.000001 to 1.5 moles of a metal cation and a non-metal cation in the total molar amount of $M^1$ and $M^2$ contained in the metal complex dye represented by Formula (1) and the metal complex dye represented by Formula (2).

13. The dye composition according to claim 9, further comprising a solvent.

14. An oxide semiconductor electrode comprising the dye composition according to claim 10.

15. A metal complex dye represented by Formula (2A),

Formula (2A)

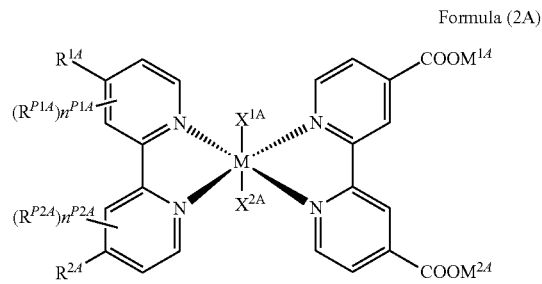

in Formula (2A), M represents a metal ion,
$R^{1A}$ and $R^{2A}$ each independently represent a group represented by Formula (4), $R^{P1A}$ and $R^{P2A}$ each independently represent an alkyl group, an alkoxy group, an alkylthio group, an aryl group, a heteroaryl group, an amino group, or a halogen atom, and $n^{P1A}$ and $n^{P2A}$ are each independently an integer of 0 to 3, $X^{1A}$ and $X^{2A}$ each independently represent a monodentate ligand, and $M^{1A}$ and $M^{2A}$ each independently represent any one of a proton, a metal cation, or a non-metal cation,

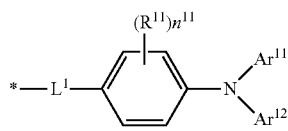

Formula (4)

in Formula (4), $L^1$ represents a single bond or an ethenylene group, $Ar^{11}$ and $Ar^{12}$ each independently represent an aryl group having at least one substituent selected from the following substituent group $S_{Ar}$, an unsubstituted heteroaryl group, or a heteroaryl group having at least one substituent selected from the following substituent group $S_{Ar}$, and $Ar^{11}$ and $Ar^{12}$ are not bonded to each other, $R^{11}$ represents an alkyl group, an alkoxy group, an alkylthio group, an aryl group, a heteroaryl group, an amino group, or a halogen atom, and $n^{11}$ is an integer of 0 to 4, and

* represents a bonding moiety to a pyridine ring in Formula (2A),

<Substituent Group $S_{Ar}$> a branched alkyl group, an alkylthio group, an arylthio group, or a heteroaryl group.

16. The photoelectric conversion element according to claim 5,
    wherein, in Formula (6), $R^1$ to $R^4$ each independently represent the group represented by Formula (4).

17. The photoelectric conversion element according to claim 9,
    wherein $Ar^{11}$ and $Ar^{12}$ are each independently represented by any one of Formula (5-1) to Formula (5-5),

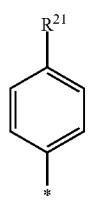

Formula (5-1)

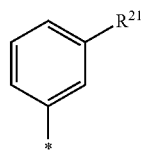

Formula (5-2)

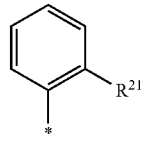

Formula (5-3)

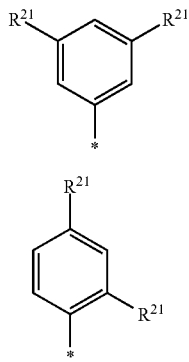

Formula (5-4)

Formula (5-5)

in Formula (5-1) to Formula (5-3), $R^{21}$ represents a branched alkyl group, or a heteroaryl group, in Formula (5-4) and Formula (5-5), $R^{21}$ represents a branched alkyl group, or a heteroaryl group, and * represents a bonding moiety to a nitrogen atom in Formula (4).

18. The photoelectric conversion element according to claim 10,
    wherein, in Formula (6), $R^1$ to $R^4$ each independently represent the group represented by Formula (4).

19. The photoelectric conversion element according to claim 1,
    wherein the content ratio of the metal complex dye represented by Formula (1) and the metal complex dye represented by Formula (2) is 99.8% to 25%:0.2% to 75% in terms of the molar amounts.

20. The dye composition according to claim 9,
    wherein the content ratio of the metal complex dye represented by Formula (1) and the metal complex dye represented by Formula (2) is 99.8% to 25%:0.2% to 75% in terms of the molar amounts.

* * * * *